(12) United States Patent
Yamazaki et al.

(10) Patent No.: US 7,395,129 B2
(45) Date of Patent: Jul. 1, 2008

(54) METHOD FOR OPTIMIZATION OF AN ORDER OF COMPONENT MOUNTING, APPARATUS USING THE SAME, AND MOUNTER

(75) Inventors: Takuya Yamazaki, Tosu (JP); Yasuhiro Maenishi, Kofu (JP); Ikuo Yoshida, Uji (JP); Akihito Yamasaki, Kurume (JP); Hiroyoshi Nishida, Minamiarupusu (JP); Chikashi Konishi, Kurume (JP); Masaya Matsumoto, Ogouri (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 448 days.

(21) Appl. No.: 10/540,251

(22) PCT Filed: Jan. 21, 2004

(86) PCT No.: PCT/JP2004/000499

§ 371 (c)(1),
(2), (4) Date: Jun. 22, 2005

(87) PCT Pub. No.: WO2004/066702

PCT Pub. Date: Aug. 5, 2004

(65) Prior Publication Data
US 2006/0052893 A1    Mar. 9, 2006

(30) Foreign Application Priority Data
Jan. 23, 2003   (JP) ............................. 2003-015278
Sep. 22, 2003   (JP) ............................. 2003-330523

(51) Int. Cl.
*H05K 13/00* (2006.01)

(52) U.S. Cl. .................. 700/104; 700/111; 700/121; 29/739; 29/740; 29/832

(58) Field of Classification Search ................. 700/121, 700/111, 104; 29/739, 740, 832
See application file for complete search history.

(56) References Cited

U.S. PATENT DOCUMENTS 5,784,778 A * 7/1998 Yoshida et al. ................. 29/834
6,044,169 A * 3/2000 Hirotani et al. ............. 382/145
6,195,878 B1 * 3/2001 Hata et al. ..................... 29/832

(Continued)

FOREIGN PATENT DOCUMENTS

JP    2002-050900    2/2002

(Continued)

*Primary Examiner*—Michael D Masinick
(74) *Attorney, Agent, or Firm*—Wenderoth, Lind & Ponack, L.L.P.

(57) ABSTRACT

An optimizing apparatus for optimizing a mounter equipped with a line gang pickup head which picks up a plurality of components and mounts them on a board. The apparatus includes a nozzle set determination unit for determining a nozzle set which reduces a mounting time in view of a number of times interchanging pickup nozzles and a total task number necessary for mounting the plural components, a nozzle pattern determination unit for determining an optimal nozzle pattern as well as an arrangement of pickup nozzles (nozzle arrangement) at a nozzle station, based on the nozzle set determined by the nozzle set determination unit, and Z-axis arrangement/mounting order optimization unit for determining an array order of component feeders and a mounting order of components while maintaining the determined nozzle set and nozzle pattern.

29 Claims, 48 Drawing Sheets

Nozzle pattern 2 (Number of nozzles to be interchanged: 6)

| Nozzle set | Task No. | H1 | H2 | H3 | H4 |
|---|---|---|---|---|---|
| 1 | 1~6 | Ⓢ | Ⓢ | Ⓢ | Ⓢ |
| 3 | 7 | Ⓜ | Ⓜ | Ⓜ | Ⓛ |
| 2 | 8 | Ⓜ | Ⓜ | Ⓢ | Ⓢ |

U.S. PATENT DOCUMENTS

| | | | |
|---|---|---|---|
| 6,507,997 B2 * | 1/2003 | Kawai et al. | 29/833 |
| 6,860,002 B2 * | 3/2005 | Oyama | 29/740 |
| 6,862,803 B2 * | 3/2005 | Kawase et al. | 29/832 |
| 6,895,662 B2 * | 5/2005 | Okuda et al. | 29/740 |
| 2004/0073322 A1 | 4/2004 | Maenishi et al. | |

FOREIGN PATENT DOCUMENTS

| | | |
|---|---|---|
| JP | 2002-171097 | 6/2002 |
| WO | 02/13590 | 2/2002 |

* cited by examiner

FIG. 4
| Type of nozzle | S | M | L |
|---|---|---|---|
| Form of nozzle unit | 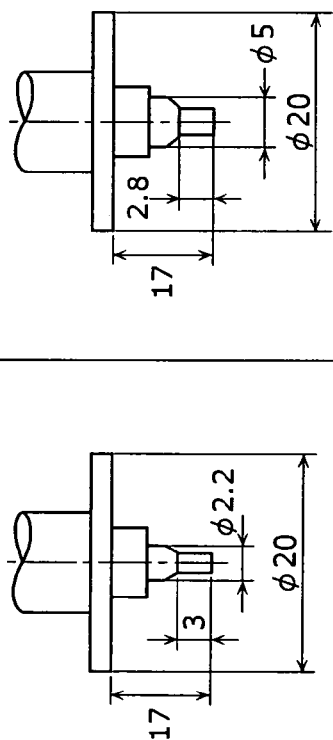 | 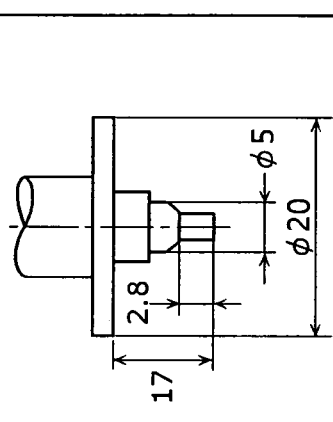 | 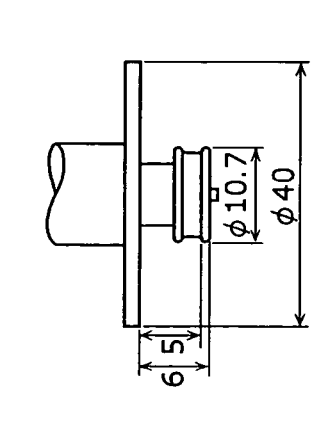 |
| Maximum weight of component | 0.18g | 1.1g | 19g |
| Maximum height of component | 1mm | 13mm | 25mm |

Mounting point pi=(component type ci, X-axis xi, Y-axis yi, control data $\phi i$) ,307a NC data is a list of mounting points pi $$\text{NC data} = \begin{pmatrix} p1 \\ p2 \\ p3 \\ \cdot \\ \cdot \\ \cdot \\ pN \end{pmatrix} = \begin{pmatrix} c1, x1, y1, \phi 1 \\ c2, x2, y2, \phi 2 \\ c3, x3, y3, \phi 3 \\ \cdot \\ \cdot \\ \cdot \\ cN, xN, yN, \phi N \end{pmatrix}$$

FIG. 8

| Name of component | (Appearance) | Size(mm) | | | Two-dimensional recognition method | Pickup nozzle | Tact (second) | Speed XY |
|---|---|---|---|---|---|---|---|---|
| | | X | Y | L | | | | |
| 0603CR | | 0.6 | 0.3 | 0.25 | | SX | 0.086 | 1 |
| 1005CR | | 1.0 | 0.5 | 0.3-0.5 | | SA | | |
| 1608CR | | 1.6 | 0.8 | 0.4-0.8 | | S | 0.094 | |
| 2012CR | | 2.0 | 1.25 | 0.4-0.8 | | | | |
| 3216CR | | 3.2 | 1.6 | 0.4-0.8 | | | | |
| 4TR | | 2.8 | 2.8 | 1.1 | | | 0.11 | |
| 6TR | | 4.3 | 4.5 | 1.5 | | Cylindrical chip | | |
| 1TIP | | 2.0 | φ1.0 | - | | | | |
| 2TIP | | 3.6 | φ1.4 | - | | | | |
| 1CAP | | 3.8 | 1.9 | 1.6 | Reflection | S | | |
| 2CAP | | 4.7 | 2.6 | 2.1 | | | | |
| 3CAP | | 6.0 | 3.2 | 2.5 | | M | | |
| 4CAP | | 7.3 | 4.3 | 2.8 | | | | |
| SCAP | | 4.3 | 4.3 | 6.0 | | | | |
| LCAP | | 6.6 | 6.6 | 6.0 | | | | |
| LLCAP | | 10.3 | 10.3 | 10.5 | | ML | | |
| 1VOL | | 4.5 | 3.8 | 1.6-2.4 | | M | 0.13 | 2 |
| 2VOL | | 3.7 | 3.0 | 1.6 | | | | |
| 3VOL | | 4.8 | 4.0 | 3.0 | | | | |

| Unit ID | Head information | Nozzle information | Cassette information | Tray information |
|---|---|---|---|---|
| 110 | 10 nozzle heads | SX,SA,⋯ | 96 | 8 levels |
| 120 | 10 nozzle heads | None | 96 | None |
| 210 | 4 nozzle heads | S,M,⋯ | 48 | None |

307c

| Nozzle interchange time N (nozzle set number n=N+1) | Task number $X_N$ | Evaluated value S |
|---|---|---|
| N=0 | $X_0$ | $S_0$ |
| N=1 | $X_1$ | $S_1$ |
| N=2 | $X_2$ | $S_2$ |
| ⋮ | ⋮ | ⋮ |

Evaluation function:
$S = X_N + h \cdot N$ (h: a coefficient for converting a time taken by interchanging nozzles per time into a task number)

FIG. 16
Prerequisites
Number of components: 217 (S: 50, M: 167)
Number of heads: 5
Nozzle interchange time N: 1
Minimum task number Xmin=44
Initial task number
| Nozzle set | 1 | 2 |
|---|---|---|
| Initial task number | 43 | 1 |
$$\begin{pmatrix} \text{Initial task number of "j"th} \\ \text{number of nozzle set} \\ X_{Nj} = \begin{cases} X_{min} - N & (j=1) \\ 1 & (j \geq 2) \end{cases} \\ X_{min} = \sum_j X_{Nj} \end{pmatrix}$$

| Nozzle set | 1 | 2 | 3 | 4 | 5 |
|---|---|---|---|---|---|
| 1 | S(50) | M(167) | | | |
| 2 | | | | | |

⇩ Divide components using
$\begin{cases} X_{11}=43 \\ X_{12}=1 \end{cases}$ (b)

| Nozzle set | 1 | 2 | 3 | 4 | 5 |
|---|---|---|---|---|---|
| 1 | S(43) | M(43) | M(43) | M(43) | M(38) |
| 2 | S(1) | S(1) | S(1) | S(1) | S(1) |
| 3 | S(2) | | | | |

⇩ Task number (43, 1) is NG
Update (increment) nozzle set with less "empty head"
Divide components using
$\begin{cases} X_{11}=43 \\ X_{12}=X_{12}+1=2 \end{cases}$ (c)

| Nozzle set | 1 | 2 | 3 | 4 | 5 |
|---|---|---|---|---|---|
| 1 | S(43) | M(43) | M(43) | M(43) | M(38) |
| 2 | S(2) | S(2) | S(2) | S(1) | |

⇩ Task number (43, 2) is feasible solution
Update (decrement) nozzle set with more "empty head"
Divide components using
$\begin{cases} X_{11}=X_{11}-1=42 \\ X_{12}=2 \end{cases}$ (d)

| Nozzle set | 1 | 2 | 3 | 4 | 5 |
|---|---|---|---|---|---|
| 1 | S(42) | M(42) | M(42) | M(42) | M(41) |
| 2 | S(2) | S(2) | S(2) | S(2) | |

⇩ Task number (42, 2) is feasible solution
$X_{min} = \sum_j N_j$ is established
End

FIG. 18

Number of components: S(50), M(167)/number of heads:5

| Nozzle interchange time N (Nozzle set number n=N+1) | Task number $X_N$ | Evaluated value S |
|---|---|---|
| N = 0 | 50 | 50 |
| N = 1 | 44 | 46 |

Evaluation function:
$S = X_N + h \cdot N$
(h=2)

FIG. 19
―Prerequisites――――――――――――――――――――――
Component data:
| Nozzle type | Number of components | Nozzle resource |
|---|---|---|
| S | 100 | 2 |
| M | 120 | 2 |
Number of heads: 5
Nozzle interchange time N: 1
Minimum task number Xmin=44
Initial task number
| Nozzle set | 1 | 2 |
|---|---|---|
| Initial task number | 43 | 1 |

| Nozzle set | 1 | 2 | 3 | 4 | 5 |
|---|---|---|---|---|---|
| 1 | S(100,1) | M(120,1) | | | |
| 2 | | | | | |

⬇ Divide components using $X_{11}=43$ (b)

| Nozzle set | 1 | 2 | 3 | 4 | 5 |
|---|---|---|---|---|---|
| 1 | S(43,1) | S(43,1) | S(14,0) | M(43,1) | M(43,1) |
| 2 | M(34,0) | | | | |

⬇ Rearrange components under nozzle resource conditions (c)

| Nozzle set | 1 | 2 | 3 | 4 | 5 |
|---|---|---|---|---|---|
| 1 | S(43,1) | S(43,1) | M(43,1) | M(43,1) | ✕ |
| 2 | M(34,0) | S(14,0) | | | |

⬇ Divide components using $X_{12}=1$
Rearrange components under nozzle resource conditions (d)

| Nozzle set | 1 | 2 | 3 | 4 | 5 |
|---|---|---|---|---|---|
| 1 | S(43,1) | S(43,1) | M(43,1) | M(43,1) | ✕ |
| 2 | M(1,1) | M(1,1) | S(1,1) | S(1,1) | ✕ |
| 3 | M(32,0) | S(12,0) | | | |

Task number (43, 1) is NG
Update (increment) nozzle set with less "empty head"
Divide components using
$\begin{cases} X_{11}=X_{11}+1=44 \\ X_{12}=1 \end{cases}$

⋮

⬇ Divide components using $X_{11}=59$ (e)

| Nozzle set | 1 | 2 | 3 | 4 | 5 |
|---|---|---|---|---|---|
| 1 | S(59,1) | S(41,1) | M(59,1) | M(59,1) | M(2,0) |
| 2 | | | | | |

⬇ Rearrange components under nozzle resource conditions (f)

| Nozzle set | 1 | 2 | 3 | 4 | 5 |
|---|---|---|---|---|---|
| 1 | S(59,1) | S(41,1) | M(59,1) | M(59,1) | ✕ |
| 2 | M(2,0) | | | | |

⬇ Divide components using $X_{12}=1$ (g)

| Nozzle set | 1 | 2 | 3 | 4 | 5 |
|---|---|---|---|---|---|
| 1 | S(59,1) | S(41,1) | M(59,1) | M(59,1) | ✕ |
| 2 | M(1,1) | M(1,1) | | | |

Task number (59, 1) is feasible solution

FIG. 21A Number of components: 1(224), 2(2)

| Nozzle set | 1 | 2 | 3 | 4 | 5 | 6 | 7 | 8 | 9 | 10 | |
|---|---|---|---|---|---|---|---|---|---|---|---|
| 1 | 1(22) | 1(22) | 1(22) | 1(22) | 1(22) | 1(22) | 1(21) | 1(21) | 1(21) | 1(21) | Strict solution (Task number:23) |
| 2 | 1(1) | 1(1) | 1(1) | 1(1) | 1(1) | 1(1) | 1(1) | 1(1) | 1(1) | 1(1) | |
| 1 | 1(22) | 1(22) | 1(22) | 1(22) | 1(22) | 1(22) | 1(22) | 1(22) | 1(22) | 1(22) | Embodiment (Task number:23) |
| 2 | 1(1) | 1(1) | 1(1) | 1(1) | 2(1) | 2(1) | | | | | |

FIG. 21B Number of components: 1(101), 2(32), 3(4), 4(18), 5(2)

| Nozzle set | 1 | 2 | 3 | 4 | 5 | 6 | 7 | 8 | 9 | 10 | |
|---|---|---|---|---|---|---|---|---|---|---|---|
| 1 | 1(14) | 2(14) | 1(14) | 1(14) | 2(14) | 1(14) | 1(14) | 4(14) | 1(14) | 1(11) | Strict solution (Task number:16) |
| 2 | 5(2) | 2(2) | 2(2) | 4(2) | 4(2) | 3(2) | 1(1) | 1(1) | 1(1) | 3(2) | |
| 1 | 1(14) | 1(14) | 1(14) | 1(14) | 1(14) | 1(14) | 1(14) | 4(14) | 2(14) | 2(14) | Embodiment (Task number:16) |
| 2 | 1(2) | 5(2) | 2(2) | 2(2) | 3(2) | 3(2) | 4(2) | 4(2) | 1(1) | | |

FIG. 21C Number of components: 1(50), 2(167)

| Nozzle set | 1 | 2 | 3 | 4 | 5 | 6 | 7 | 8 | 9 | 10 | |
|---|---|---|---|---|---|---|---|---|---|---|---|
| 1 | 1(21) | 1(21) | 2(1) | 2(21) | 2(21) | 2(21) | 2(21) | 2(21) | 1(21) | 2(18) | Strict solution (Task number:22) |
| 2 | 1(1) | 1(1) | 2(1) | 1(1) | 1(1) | 1(1) | 1(1) | 1(1) | 2(1) | 1(1) | |
| 1 | 1(21) | 1(21) | 2(21) | 2(21) | 2(21) | 2(21) | 2(21) | 2(21) | 2(21) | 2(20) | Embodiment (Task number:22) |
| 2 | 1(1) | 1(1) | 1(1) | 1(1) | 1(1) | 1(1) | 1(1) | | | | |

FIG. 21D Number of components: 1(5), 2(34), 3(2), 4(2)

| Nozzle set | 1 | 2 | 3 | 4 | 5 | 6 | 7 | 8 | 9 | 10 | |
|---|---|---|---|---|---|---|---|---|---|---|---|
| 1 | 2(5) | 2(5) | 1(5) | 2(5) | 2(5) | 2(5) | 2(5) | 2(4) | 4(2) | 3(2) | Strict solution (Task number:5) |
| 1 | 1(5) | 2(5) | 2(5) | 2(5) | 2(5) | 2(5) | 2(5) | 2(4) | 3(2) | 4(2) | Embodiment (Task number:5) |

FIG. 22A  Number of components: 1(50), 2(10), 3(650), 4(50), 5(50), 6(200), 7(20), 8(215), 9(15)

| Nozzle set | 1 | 2 | 3 | 4 | 5 | 6 | 7 | 8 | 9 | 10 | |
|---|---|---|---|---|---|---|---|---|---|---|---|
| 1 | 3(325) | 3(325) | 8(215) | 6(200) | 1(50) | 5(50) | 4(50) | 7(20) | 9(15) | 2(10) | Embodiment (Task number: 325) |
| 1 | 3(325) | 3(325) | 8(215) | 6(200) | 1(50) | 5(50) | 4(50) | 7(20) | 9(15) | 2(10) | Strict solution (Task number: 325) |

FIG. 22B

| Nozzle set | 1 | 2 | 3 | 4 | 5 | 6 | 7 | 8 | 9 | 10 | |
|---|---|---|---|---|---|---|---|---|---|---|---|
| 1 | 8(111) | 3(111) | 3(111) | 3(111) | 3(111) | 3(111) | 6(111) | 8(104) | 3(95) | 6(89) | Embodiment (Task number: 136) |
| 2 | 1(25) | 1(25) | 5(25) | 4(25) | 4(25) | 5(25) | 7(20) | 9(15) | 2(10) | | |
| 1 | 8(108) | 3(108) | 3(108) | 3(108) | 3(108) | 3(108) | 3(108) | 6(108) | 8(107) | 6(92) | Strict solution (Task number: 133) |
| 2 | 1(25) | 1(25) | 5(25) | 4(25) | 4(25) | 5(25) | 7(20) | 9(15) | 2(10) | 3(2) | |

FIG. 22C

| Nozzle set | 1 | 2 | 3 | 4 | 5 | 6 | 7 | 8 | 9 | 10 | |
|---|---|---|---|---|---|---|---|---|---|---|---|
| 1 | 8(106) | 3(106) | 3(106) | 3(106) | 3(106) | 3(106) | 3(106) | 1(21) | 1(21) | 1(21) | Embodiment (Task number: 129) |
| 2 | 1(18) | 1(18) | 7(18) | 4(18) | 4(18) | 5(18) | 5(18) | 9(15) | 1(14) | 3(14) | |
| 3 | 2(5) | 2(5) | 4(5) | 4(5) | 5(5) | 5(5) | 4(4) | 5(4) | 8(3) | 7(2) | |
| 1 | 8(67) | 3(67) | 3(67) | 3(67) | 3(67) | 3(67) | 3(67) | 3(67) | 3(67) | 3(67) | Strict solution (Task number: 127) |
| 2 | 1(50) | 8(50) | 4(50) | 5(50) | 5(50) | 6(50) | 6(50) | 6(50) | 8(50) | 8(48) | |
| 3 | 2(10) | 3(10) | 3(10) | 3(10) | 3(10) | 9(10) | 7(10) | 7(10) | 3(7) | 9(5) | |

FIG. 22D

| Nozzle set | 1 | 2 | 3 | 4 | 5 | 6 | 7 | 8 | 9 | 10 | |
|---|---|---|---|---|---|---|---|---|---|---|---|
| 1 | 8(101) | 3(101) | 3(101) | 3(101) | 3(101) | 3(101) | 3(101) | 6(101) | 8(101) | 6(99) | Embodiment (Task number: 127) |
| 2 | 1(17) | 1(17) | 7(17) | 3(17) | 3(17) | 4(17) | 4(17) | 5(17) | 5(17) | 1(16) | |
| 3 | 2(7) | 9(7) | 3(7) | 4(7) | 4(7) | 5(7) | 5(7) | 8(7) | 9(7) | 8(6) | |
| 4 | 2(2) | 7(2) | 3(2) | 4(2) | 5(2) | 2(1) | 3(1) | 7(1) | 9(1) | | |
| 1 | 8(95) | 3(95) | 3(95) | 3(95) | 3(95) | 3(95) | 3(95) | 8(95) | 6(95) | 6(95) | Strict solution (Task number: 126) |
| 2 | 1(25) | 1(25) | 8(25) | 3(25) | 3(25) | 3(25) | 4(25) | 4(25) | 5(25) | 5(25) | |
| 3 | 2(5) | 2(5) | 3(5) | 6(5) | 6(5) | 7(5) | 7(5) | 7(5) | 7(5) | 9(5) | |
| 4 | 9(1) | 9(1) | 9(1) | 9(1) | 9(1) | 9(1) | 9(1) | 9(1) | 9(1) | 9(1) | |

FIG. 25A

Nozzle set

| Nozzle set | 1 | 2 | 3 | 4 |
|---|---|---|---|---|
| 1 | S(6) | S(6) | S(6) | S(6) |
| 2 | S(1) | S(1) | M(1) | M(1) |
| 3 | M(1) | M(1) | M(1) | L(1) |

FIG. 25B
Nozzle pattern 1 (Number of nozzles to be interchanged: 4)

| Nozzle set | Task No. | H1 | H2 | H3 | H4 |
|---|---|---|---|---|---|
| 1 | 1~6 | S | S | S | S |
| 2 | 7 | S | S | M | M |
| 3 | 8 | M | L | M | M |

FIG. 25C
Nozzle pattern 2 (Number of nozzles to be interchanged: 6)

| Nozzle set | Task No. | H1 | H2 | H3 | H4 |
|---|---|---|---|---|---|
| 1 | 1~6 | S | S | S | S |
| 3 | 7 | M | M | M | L |
| 2 | 8 | M | M | S | S |

FIG. 25D
Nozzle pattern 3 (Number of nozzles to be interchanged: 6)

| Nozzle set | Task No. | H1 | H2 | H3 | H4 |
|---|---|---|---|---|---|
| 2 | 1 | S | S | M | M |
| 1 | 2~7 | S | S | S | S |
| 3 | 8 | M | M | M | L |

FIG. 26A
Nozzle pattern
| Nozzle set | Task No. | H1 | H2 | H3 | H4 |
|---|---|---|---|---|---|
| 1 | 1~6 | Ⓢ | Ⓢ | Ⓢ | Ⓢ |
| 2 | 7 | Ⓢ | Ⓢ | Ⓜ | Ⓜ |
| 3 | 8 | Ⓜ | Ⓛ | Ⓜ | Ⓜ |
Nozzle arrangement 1 at nozzle station

Nozzle arrangement 2 at nozzle station

Nozzle arrangement 3 at nozzle station

FIG. 38

| Component group | Component thickness(Tmm) | Nozzle type | Supply method |
|---|---|---|---|
| PG1 | $0 < T \leq 0.25$ | SX | cassette |
| PG2 | $0.25 < T \leq 0.3$ | SA | cassette |
| PG3 | $0.3 < T \leq 0.35$ | S,M | cassette |
| PG4 | $0.35 < T \leq 0.4$ | S,M | cassette |
| PG5 | $0.5 < T \leq 4$ | M | cassette |
| PG6 | $0 < T \leq 4$ | L | — |
| PG7 | $0 < T \leq 4$ | L | — |
| PG8 | $4 < T \leq 25$ | — | — |
| PG9 | $4 < T \leq 25$ | — | — |

FIG. 40

| Component type | 0603 | 1005 |
|---|---|---|
| Number of components | 19 | 45 |
| Nozzle type | SX | SA |
| PG | 1 | 2 |

FIG. 41

- 1. Calculate initial nozzle set $$SX = \frac{19 \times 10}{64} \cong 3 \qquad SA = 10 - SX = 7$$

⇩

- 2. Calculate initial task number $$Task(SX) = \frac{19}{3} \cong 7 \qquad Task(SA) = \frac{45}{7} \cong 7$$

⇩

- 3. Calculate task number & number of nozzles

```
     9              ⑧                  7              9
     ↑   Nozzle-1   ↑                  ↑   Nozzle-1   ↑
T(SX):7+T(SA):7=14     →     T(SX):5+T(SA):8=13
     ↓   Nozzle+1   ↓                  ↓   Nozzle+1   ↓
     ⑤              6                  4              7
   (SX:3, SA:7)                       (SX:4, SA:6)
```

⇩

- 4. Determination

Nozzle set = (SX:4, SA:6)
    Task number = 13

FIG. 42

| Component type | 1CAP | 3CAP |
|---|---|---|
| Number of components | 43 | 19 |
| Nozzle type | S | M |
| PG | 3 ||

FIG. 43

1. Calculate initial nozzle set

$$M = \frac{19 \times 10}{62} \cong 4 \qquad S = 10 - M = 6$$

2. Calculate initial task number

$$Task(S) = \frac{43}{6} \cong 8 \qquad Task(M) = \frac{19}{4} \cong 5$$

3. Calculate task number & number of nozzles

```
      9      ⑦                    8      10
     ↑Nozzle-1↑                   ↑Nozzle-1↑
Max[T(S):8, T(M):5]=8  →  Max[T(S):7, T(M):7]=7
     Nozzle+1                    ↓Nozzle+1↓
      ⑦      4                    6       5
    (S:6, M:4)                  (S:7, M:3)
```

4. Determination

Nozzle set = (S:7, M:3)
Task number = 7

| Component type | 0603 | | 1005 | | Others | |
|---|---|---|---|---|---|---|
| | R | C | R | C | | |
| Number of components | 10 | 12 | 20 | 11 | 32 | 18 |
| Nozzle type | SX | SX | SA | SA | S | M |
| Nozzle source | 5 | | 5 | | 3 | 2 |
| PG | 1 | 2 | 3 | 4 | 5 | |
| Stage | R | | | L | | |

(b)

| 1005C SA | |
|---|---|
| | Others S&M | stage L

| 0603R SX |
|---|
| 0603C SX |
| 1005R SA | stage R

FIG. 50

1. Allocate nozzles
Determine number of nozzles for each stage based on ratio of number of components $SA_L = \frac{11*5}{31} \cong 2$   $SA_R = 5 - SA_L = 3$

⇒

2. Calculate task number and number of nozzles for each stage

· stage R
2.1. Calculate initial nozzle set
$SA = \frac{20*10}{42} \cong 5$   $SX = 10 - SA = 5$
2.2. Restrict the number based on nozzle resource
$SA = 3$   $SX = 5$
2.3 Calculate initial task number
$Task(SX) = \frac{22}{5} \cong 5$   $Task(SA) = \frac{20}{3} \cong 7$ · stage L
2.1. Calculate initial nozzle set
$SA = \frac{11*10}{61} \cong 2$   $M = \frac{18*10}{61} \cong 2$   $S = 10-(SA+M) = 5$
2.2. Restrict the number based on nozzle resource
$SA = 2$   $S = 3$   $M = 2$
2.3. Calculate initial task number
$Task(SA) = \frac{11}{2} \cong 6$   $Task(S) = \frac{32}{3} \cong 11$   $Task(M) = \frac{18}{2} \cong 9$

⇒

3. Adjust task number and number of nozzles
Adjust number of nozzles between stages · stage R
8   ⑩
← Nozzle-1
$T(SX):5 + T(SA):7 = 12$ ← Move nozzles so that
→ Nozzle+1             difference in task number
5                      between stages is reduced
(SX:5 + SA:3 = 8)

· stage L
8   16   18
← Nozzle-1
$T(SA):6 + Max[T(S):11, T(M):9] = 17$
→ Nozzle+1
④
(SA:2 + S:3 + M:2 = 7)

6   ⑩
← Nozzle-1
$T(SX):5 + T(SA):10 = 15$
→ Nozzle+1
5
(SX:5 + SA:2 = 7)

6   16   18
← Nozzle-1
$T(SA):4 + Max[T(S):11, T(M):9] = 15$
→ Nozzle+1
③
(SA:3 + S:3 + M:2 = 8)

METHOD FOR OPTIMIZATION OF AN ORDER OF COMPONENT MOUNTING, APPARATUS USING THE SAME, AND MOUNTER

BACKGROUND OF THE INVENTION

1. Field of the Invention

The present invention relates to a method for determining the optimal order in which a mounter is to mount electronic components onto a board, such as a printed circuit board. In particular, the invention relates to the optimization of the order of component mounting for a mounter equipped with a line gang pickup head that picks up a plurality of components and mounts them onto the board.

2. Background of the Related Art

The order in which a mounter mounts electronic components on a board such as a printed circuit board is conventionally optimized to minimize a tact time (i.e., the time taken by mounting). Recently, with diversification of the types of electronic devices, there has been an increase in demand for a multi-functional mounter equipped with a line gang pickup head based on a method referred to as "gang pickup" of picking up a plurality of components and mounting them on a board. Thus, various types of methods for optimization of the order of component mounting for such a mounter are presented (for instance, in Japanese Laid-Open Patent Applications No. 2002-50900 and No. 2002-171097).

The reference mentioned above discloses the method for optimizing an order of component mounting in favor of the mounting of the components performed by a line gang pickup head, namely, prioritizing the maximization of the number of components to be simultaneously picked up by a line gang pickup head per task. Here, one iteration of repeated series of processes where a line gang pickup head picks up, transfers and mounts components, and the group of components handled in such an iteration are both referred to as a "task". The number of tasks required for mounting all the components is minimized owing to such optimization, and therefore, the mounting of the components can be completed with a shorter tact time.

However, the above conventional optimization method takes a lot of processing time to simultaneously determine various conditions for optimization, such as: a Z-axis arrangement which is an array of component feeders to be set on a mounter; an arrangement of nozzles at a nozzle station; a nozzle pattern; and a mounting order (i.e., an order of mounting components in consideration of mounting points on a board). To be more specific, it is a method for searching the conditions optimal on the whole by checking the tact as well as various constraints each time the above conditions for optimization are changed. Therefore, it is necessary to calculate a tact each time the nozzle pattern is changed and thereby it takes time for optimization. Here, a nozzle pattern is a pickup nozzle string in which a type of nozzle for picking up components is determined for each line gang pickup head in each task that is arranged according to the mounting order.

It is also a problem that an optimal solution cannot always be found since a head position and a task and others of the line gang pickup head to be interchanged are determined using random numbers in order to change the conditions for optimization.

BRIEF SUMMARY OF THE INVENTION

The present invention pertains to an optimizing method for an order of mounting components for a mounter equipped with a mounting head for picking up a plurality of components and mounting the components on a board, and aims to provide an optimizing method for a component mounting order based on which a more optimal mounting order can be searched within a shorter time.

In order to achieve the above object, the inventors analyzed proportion of the operation of the mounter within the total tact time and found out that most of the time spent is used for interchanging nozzles and executing tasks. Therefore, they consider not only a reduction of the number of tasks but also a decrease in the number of times for interchanging nozzles to develop an algorithm for determining an order of mounting components.

Namely, the optimizing method for an order of mounting components, according to a first embodiment, is an optimizing method that optimizes, using a computer, a component mounting order in which a mounter equipped with a mounting head picks up, at maximum, L components, L being no less than 2, from an array of component feeders that hold components, and mounts the components on a board, wherein the mounting head has, at maximum, L pickup nozzles for picking up the components, L being no less than 2, and a plurality of components to be optimized include plural types of components which are picked up using no less than 2 pickup nozzles of different types. The optimizing method comprises: a nozzle set determination step of determining a nozzle set for mounting all the plurality of components with a smallest task number, where a nozzle set is a combination of pickup nozzles to be attached to the mounting head and a task is a group of components to be mounted by one iteration of the repeated series of processes where the line gang pickup head picks up, transports, and mounts components; and a mounting order determination step of determining the array order of component feeders and the component mounting order, while maintaining the determined nozzle set.

Here, in the nozzle set determination step, i) at least one kind of nozzle set is specified, a nozzle set corresponding to the number of times interchanging the pickup nozzles, ii) the task number for mounting the plurality of components is calculated using the specified nozzle set, iii) a combination of the number of times of interchanging the pickup nozzles and the calculated task number is estimated, and iv) the nozzle set is determined as a result of the estimation. For example, in the nozzle set determination step, a nozzle set which calculates the smallest evaluated value S is determined as the nozzle set that reduces a mounting time, the smallest evaluated value S is calculated using $S = X + h \cdot N$, where N indicates the number of times interchanging the pickup nozzles, X indicates the total task number and h indicates a coefficient for converting the time taken by interchanging the pickup nozzles per time into a task number.

The optimization is thus operated in consideration not only of the task number, as has been the conventional case, but also of the nozzle interchange time. The time required for interchanging the nozzles and executing the tasks, which takes a large proportion of the whole tact, is reduced and thereby the mounting time is shortened on the whole. Also, two parameters, the task number and the nozzle interchange time, are determined at the initial stage of the optimization so that the time required for searching an optimal mounting order is shortened.

The nozzle set determination step may include: a task number calculation step of repeating the processing of calculating the task number for mounting the plurality of components using "n" kinds of nozzle sets, "n" being no less than 1, while incrementing the "n" by 1; and a nozzle set number specification step of calculating an evaluated value S corresponding to the mounting time according to a predetermined evaluation function, specifying "n" kind of nozzle set corresponding to a combination in which the evaluated value S is the smallest, and determining the specified "n" kind of nozzle set as the nozzle set. In more detail, the task number calculation step includes the following steps: calculating a task number for a case in which the plurality of components are mounted on a board, using the mounting head on which as many L components as possible are picked up, as a minimal task number; and judging for each task number whether or not it is possible to mount all of the plurality of components by incrementing the calculated minimum task number by 1, and obtaining a minimum task number that is judged as possible as the task number for mounting all the plurality of components.

Thus, a feasible solution is searched in ascending order of the task number so that the time necessary for optimization can be reduced.

In the task number calculation step, a task number of a nozzle set is incremented, the task number of the nozzle set, out of a plurality of nozzle sets determined immediately before, having fewer "empty head" which is a state in which a mounting head is empty when performing a task for components fewer than the number L. Meanwhile, the task number calculation step further includes calculating the task number by decrementing the calculated minimum task number by 1, and the task number is decremented, the task number of the nozzle set, out of plural nozzle sets determined immediately before, having more "empty head" which is a state in which a mounting head is empty when performing a task for components fewer than the number L.

Thus, the combination of the task numbers having high possibility to be a feasible solution is firstly searched and the search is also made for the decrease in the task number so that the more optimal solution (mounting order) can be found within a shorter time.

The number of usable pickup nozzles is restricted depending on the type of pickup nozzles, and in the nozzle set determination step, when the "n" kinds of nozzle sets are respectively determined, a combination of a pickup nozzle and the number of components to be mounted using said pickup nozzle is specified for the number L or fewer within the restricted range. Thus optimization can be achieved in view of the task number and the nozzle interchange time, even when there is a restriction on the nozzle resource.

In the task number calculation step, the possible combinations for the task numbers calculated using the respective "n" kinds of nozzle sets are extracted. Whether or not it is possible to mount all the plurality of components is sequentially judged for all the extracted combinations, and a minimum task number that is judged as possible is obtained as the task number for mounting the plurality of components using "n" kinds of nozzle sets. Here, in the task number calculation step, the combinations are extracted from a restricted range specified by minimum and maximum task numbers. The minimum task number is a task number for mounting the plurality of components on a board, using a mounting head by which as many of the L components as possible are picked up, and the maximum task number is the number of components having the largest number out of the components classified based on the type of pickup nozzles.

Thus, whether it is a feasible solution or not is examined repeatedly for the possible combinations of task numbers based on a round-robin search method. Therefore, a feasible solution can be found surely without missing the more optimal solution in spite that a longer search time is more or less required.

The round-robin search method as described above and the search method based on the minimum task number can be certainly combined for use. For instance, the task number calculation step may include: a first calculation step of: calculating a task number for a case in which the plurality of components are mounted on a board, using a mounting head by which as many of the L components as possible are picked up, as a minimal task number; judging whether or not it is possible to mount all the plurality of components for each task number by incrementing the calculated minimum task number by 1; and obtaining a minimum task number judged as possible as the task number for mounting the plurality of components using "n" kind of nozzle set; a second calculation step of: extracting the possible combinations for the task number calculated using the respective "n" kind of nozzle set; judging sequentially whether or not it is possible to mount all the plurality of components for all the extracted combinations; and obtaining a minimum task number judged as possible as the task number calculated using the "n" kind of nozzle set; and a selection step of selectively executing either the first calculation step or the second calculation step.

Thus, either the time or the degree of accuracy can be selected to be prioritized in optimization.

In order to achieve the above object, the inventors further focused on the nozzle interchange which makes up a large part of the whole tact. This has led to an invention of the algorithm for mounting all of the components without interchanging nozzles. In other words, an algorithm for determining one kind of nozzle set which enables the mounter to mount all the components with fewer task numbers is developed. As a result, in spite that the task number is incremented more or less by not performing nozzle interchange, it is conceivable that the mounting time on the whole does not increase greatly since the time previously taken by interchanging nozzles is completely omitted. After determining one kind of optimal nozzle set for optimization of the component mounting order, there is no longer any need to take nozzle interchange into account so that one optimization parameter is taken away and the time necessary for optimization processing on the whole is reduced. Moreover, a component or a control unit for nozzle interchange does not need to be incorporated in the mounter, that is to say, a component and lines on the mounting head are simplified and the period of time taken by producing the mounter is greatly reduced. The mounter with an extremely high value-performance ratio is thus realized.

Namely, the optimizing method for an order of mounting components according to the second invention is An optimizing method that optimizes, using a computer, a component mounting order in which a mounter equipped with a mounting head picks up, at maximum, L components, L being no less than 2, from an array of component feeders that hold components, and mounts the components on a board, wherein the mounting head has, at maximum, L pickup nozzles for picking up the components, L being no less than 2, and a plurality of components to be optimized include a plurality of types of components which are picked up using no less than 2 pickup nozzles of different types. The optimizing method comprising a nozzle set determination step of determining a nozzle set for mounting all the plurality of components with a smallest task number, where a nozzle set is a combination of pickup nozzles to be attached to the mounting head and a task is a group of components to be mounted by one iteration of the repeated series of processes where the mounting head picks up, transports, and mounts components, and the nozzle set and the task number are determined, said nozzle set for mounting all the plurality of components with the smallest task number, without interchanging the pickup nozzles attached to the mounting head.

Here, the nozzle set determination step may include: an initial nozzle set calculation step of calculating the number of pickup nozzles for each type as an initial nozzle set based on the number of components to be picked up, respectively, by different types of pickup nozzles; an initial task number calculation step of calculating a total task number for mounting all of the plurality of components based on the number of components corresponding to the calculated initial nozzle set; a task number calculation step of calculating a total task number when the number of pickup nozzles is incremented or decremented by 1 for each type of the initial nozzle set; and a judgment step of judging whether or not the total task number calculated in the task number calculation step is smaller than the total task number calculated in the initial task number calculation step, and when the former is smaller than the latter, the judgment on whether or not the decremented or incremented total task number becomes smaller after the incremented or decremented nozzle set has been updated as a latest nozzle set, and when the former is not smaller than the latter, the previous nozzle set and the total task number for said nozzle set are determined as the initial nozzle set and task number. Thus, an optimal nozzle set is searched out since the task number is estimated by incrementing or decrementing the number of pickup nozzles by one for each type.

The respective plurality of components belong to one of a plurality of component groups classified based on heights of components, and the task number calculation step may include: a component group task number calculation step of calculating a task number for mounting all the components belonging to each of the component groups; and a total task number calculation step of calculating a total task number by totaling each of the task numbers calculated in units of component groups. Thus, the nozzle set with which all the components can be mounted is determined even when the components need to be mounted sequentially in units of component groups.

In the component group task number calculation step, when a component group includes plural types of components to be picked up using a plurality of pickup nozzles, a maximum task number, out of task numbers corresponding, respectively, to the plurality of pickup nozzles, is obtained as a task number of the component group. Thus, an effective nozzle set corresponding to the case in which the pickup nozzles of different types are placed on the mounting head so as to mount the components is determined.

The present invention can be realized not only as the component mounting order optimization method as described above, but also as a component mounting apparatus including the characteristic steps included in the method, a mounter for mounting components according to the order thus optimized, as a program causing a personal computer to execute these steps, and even as a storage medium such as a CD-ROM on which the program is recorded.

For further information about technical background to this application, Japanese Patent Applications No. 2003-015278 filed on Jan. 23, 2003 and No. 2003-330523 filed on Sep. 22, 2003, are incorporated herein by reference.

BRIEF DESCRIPTION OF DRAWINGS

FIG. 4 shows various types of pickup nozzles.

FIG. 7 shows an example of the mounting point data shown in FIG. 6.

FIG. 8 shows an example of the component library shown in FIG. 6.

FIG. 9 shows an example of the mounter information shown in FIG. 6.

FIG. 16 is a diagram showing prerequisites for the example of specifying the task number $X_N$ when the nozzle interchange time N is 1.

FIGS. 17A to 17D are diagrams showing examples of specifying the task number $X_N$ when the nozzle interchange time N is 1.

FIG. 18 is a diagram for explaining the process of selecting the optimal combination from among the combinations of the searched-out nozzle interchange time N and the task number $X_N$ shown in FIG. 17.

FIG. 19 is a diagram showing a prerequisite set for the example of taking a restriction on a nozzle resource into consideration.

FIGS. 20A to 20G show examples when the restriction on the nozzle resource is taken into consideration.

FIGS. 21A to 21D show examples of a comparison between the nozzle set table obtained using an IP solver (sections where "strict solution" is indicated on the right) and the nozzle set table obtained using the algorithm of the present embodiment (section where "embodiment" is indicated on the right).

FIGS. 22A to 22D show other examples of a comparison between the nozzle set table obtained by using an IP solver (sections where "strict solution" is indicated on the right) and the nozzle set table obtained by using the algorithm of the present embodiment (section where "embodiment" is indicated on the right).

FIGS. 25A to 25D show examples of the procedure for determining the nozzle pattern performed by the nozzle pattern determination unit shown in FIG. 6.

FIGS. 26A to 26D show examples of the procedure of determining an arrangement of nozzles at a nozzle station performed by the nozzle pattern determination unit shown in FIG. 6.

FIG. 38 is a table showing the example of classifying component groups.

FIG. 40 is a component structure table used for explaining each step shown in FIG. 39.

FIG. 41 is a diagram showing an example of each step shown in FIG. 39.

FIG. 42 is another example of the component structure table used for explaining each step shown in FIG. 39.

FIG. 43 is a diagram showing another example of each step shown in FIG. 39.

FIGS. 49A and 49B are component structure tables or the like for explaining each step shown in FIG. 48.

FIG. 50 is a diagram showing the example of each step shown in FIG. 48.

DETAILED DESCRIPTION OF THE INVENTION

The following describes in detail the embodiments of the present invention with reference to the drawings.

Figure 1:
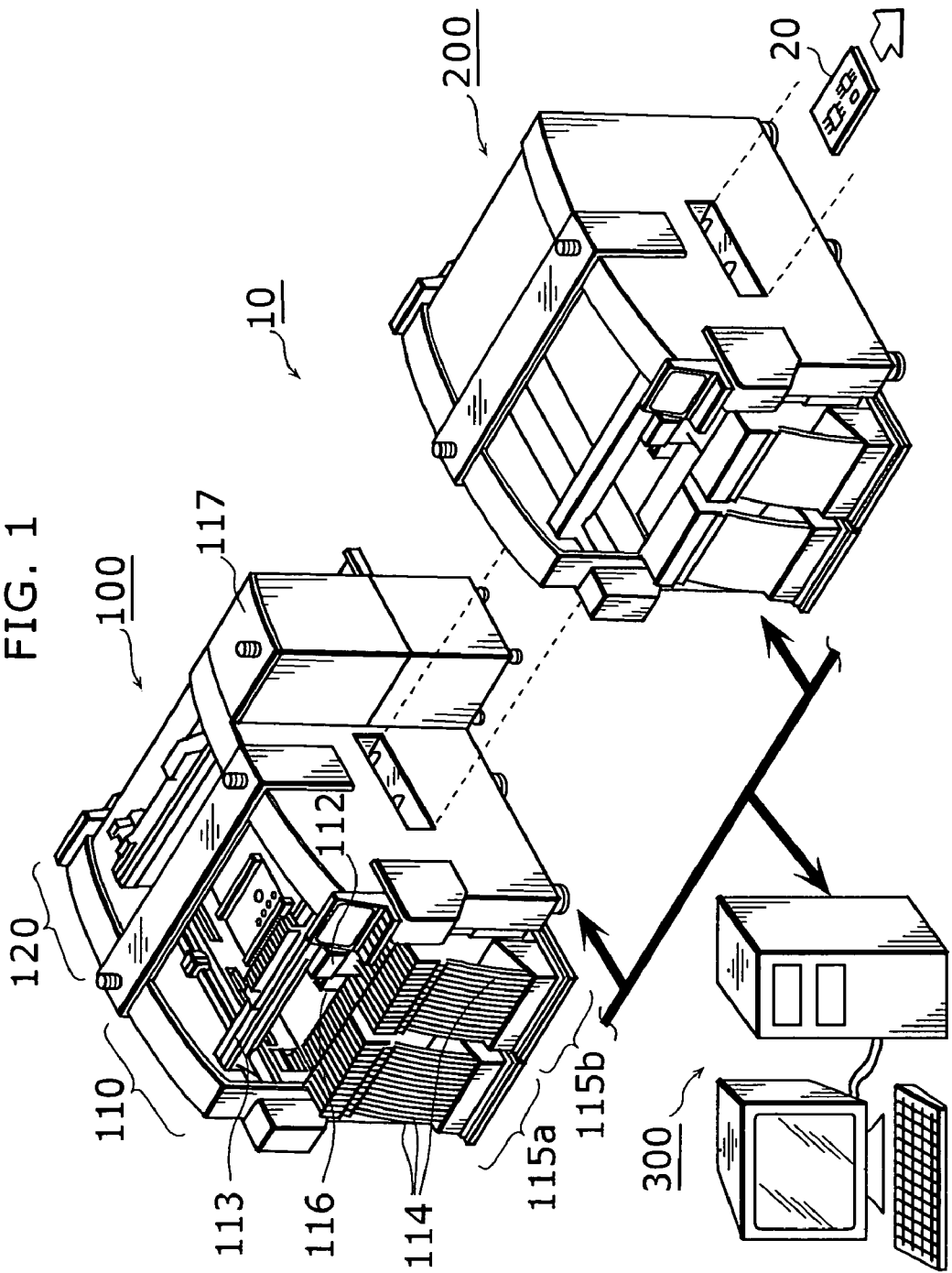
FIG. 1 shows the entire construction of a component mounting system according to the present invention.

FIG. 1 shows the entire construction of a component mounting system 10 according to the present invention. As shown in the drawing, the mounting system 10 is composed of a plurality (here, two) of mounters 100 and 200 and an optimization apparatus 300. The mounters 100 and 200 form a production line where electronic components are mounted onto a circuit board 20 that is transported downstream. The optimization apparatus 300 optimizes the mounting order of the required electronic components at the start of production, for example, based on information in a variety of databases, and sets and controls the mounters 100 and 200 having provided them with the NC data produced by the optimization.

The mounter 100 is equipped with two stages (a front stage 110 and a rear stage 120) that operate simultaneously and independently of one another, or in concert, or even alternately. Each of these stages 110 and 120 is a perpendicular robotic mounting stage and includes two component supplying units 115$a$ and 115$b$, a line gang pickup head 112, an XY robot 113, a component recognizing camera 116, and a tray supplying unit 117. The component supplying units 115$a$ and 115$b$ are each made up of an array of up to 48 component feeders 114 that store component tapes. The line gang pickup head 112 has 10 pickup nozzles (hereafter simply "nozzles") that can pick up a maximum of 10 components from the component feeders 114 and mount them onto the circuit board 20. The XY robot 113 moves the line gang pickup head 112. The component recognizing camera 116 investigates the picked-up state of the components that have been picked up by the line gang pickup head 112 in two or three dimensions. The tray supplying unit 117 supplies tray components.

In this specification, the expression "component tape" refers to a tape (a carrier tape) in which a number of the same type of components have been arranged, with such tape being supplied from a reel (a supply reel) or the like, around which the tape has been wound. Component tapes are usually used to supply relatively small components called "chip components" to a mounter. However, during the optimization process, a "component tape" refers to data that specifies a group of components of the same type (that are assumed to have been arranged on a virtual tape). In the process called "component division", a group of components of the same type (that would potentially be arranged on a single component tape) are divided into a plurality of component tapes. It should be noted here that components supplied by a component tape are sometimes called "taped components".

In short, the mounter 100 is designed so as to be able to mount almost all types of electronic components from 0.6 mm by 0.3 mm chip resistors to 200 mm connectors, with a production line being formed by arranging the required number of mounters 100 in a line.

Figure 2:
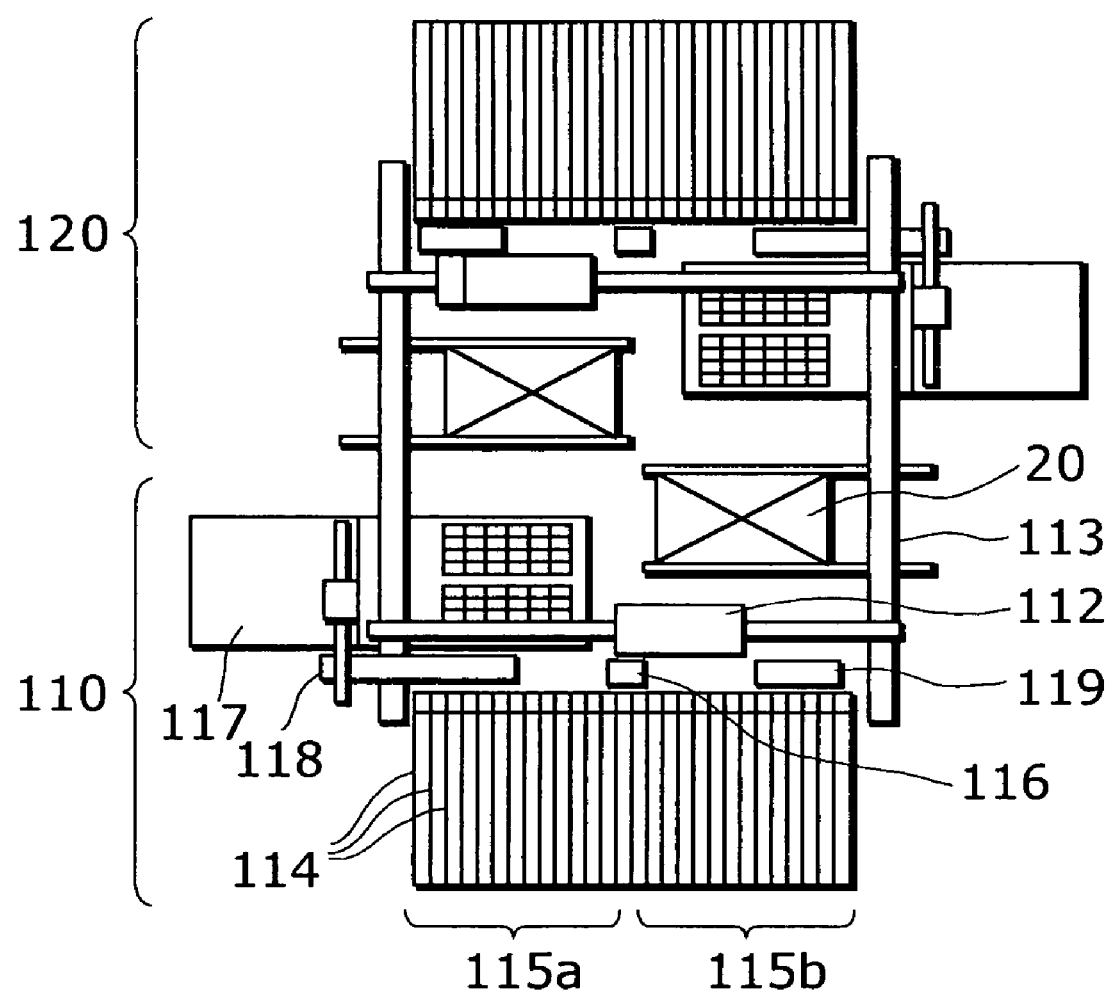
FIG. 2 is an overhead view showing the overall construction of a mounter used in the present component mounting system

FIG. 2 is an overhead view showing the overall construction of the mounter 100 shown in FIG. 1. A shuttle conveyor 118 is a moving table (a collection conveyor) on which a component taken from the tray supplying unit 117 is placed and which is moved to a predetermined position where the line gang pickup head 112 can pick up components from the shuttle conveyor 118. A nozzle station 119 is a table on which interchangeable nozzles corresponding to various sizes of components are positioned.

The component supplying units 115$a$ and 115$b$ included in each stage 110 and 120 are provided on the left and right sides of the component recognizing camera 116. The line gang pickup head 112 picks up components from the component supplying unit 115a or 115b, passes by the component recognizing camera 116, and then repeats an operation whereby the line gang pickup head 112 moves to a mounting point on the circuit board 20 and mounts all of the picked-up components.

The component supplying unit 115a, which is located on the left side facing each sub stage, is called "left block" while the component supplying unit 115b, which is located on the right side, is called "right block". In this specification, one iteration of the repeated series of processes where the line gang pickup head 112 picks up, transports, and mounts components and the group of components handled in such an iteration are both referred to as a "task". As one example, when the line gang pickup head 112 has ten nozzles, the maximum number of components that can be mounted by a single task is ten. It should also be noted that a "pickup operation" refers to all of the operations performed from when the head starts to pick up components to when the line gang pickup head 112 transports the components. In this specification, a pickup operation refers not only to when ten components are picked up by to the line gang pickup head 112 with a single nozzle stroke (a raising and lowering of the line gang pickup head 112), but also when ten components are picked using several nozzle strokes.

Figure 3A:
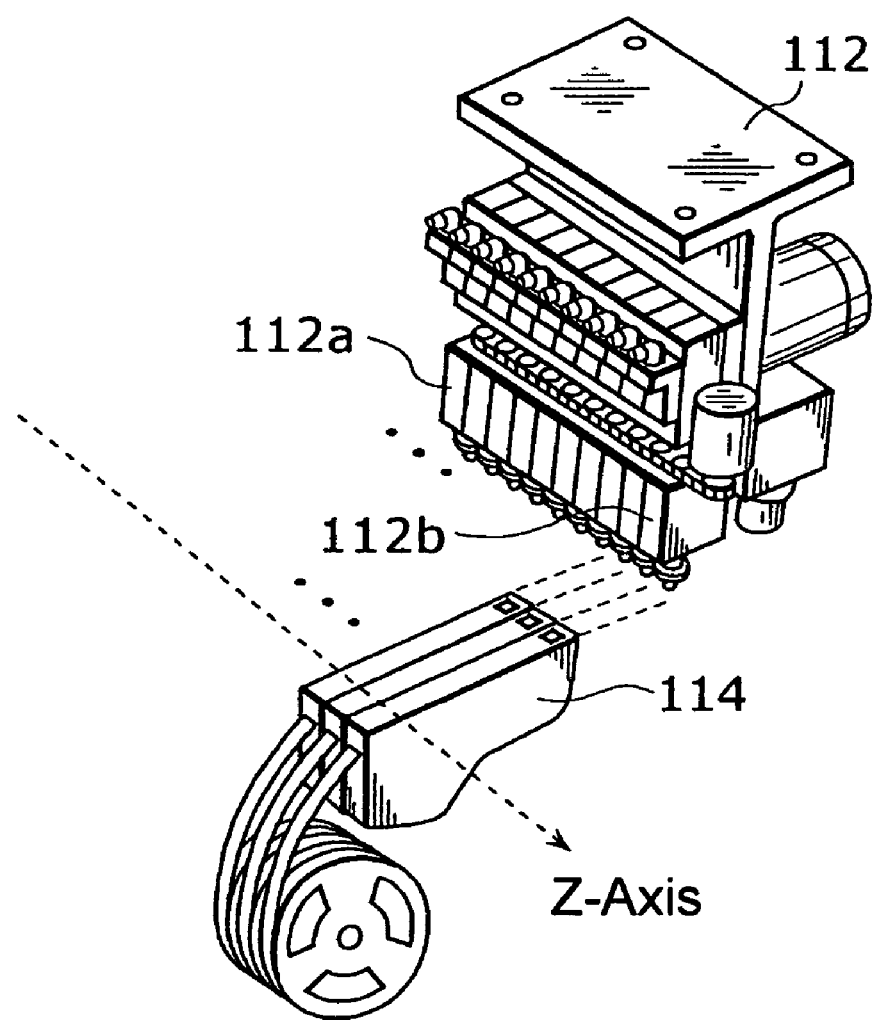
FIG. 3A is a depiction of a positional relationship between a line gang pickup head of the mounter and component feeders according to the present invention.

FIG. 3A is a depiction of the positional relationship between the line gang pickup head 112 and the component feeders 114. The line gang pickup head 112 uses a method referred to as "gang pickup" and can be equipped with a maximum of ten pickup nozzles 112a-112b. When thus equipped, a maximum of ten components can be simultaneously picked up from the component feeders 114 in a single nozzle stroke (one raising and lowering of the line gang pickup head 112). Namely, the line gang pickup head 112 moves to the component supplying units 115a and 115b and picks up the components. Here, when the line gang pickup head 112 cannot pick up ten components simultaneously in a single stroke, ten components can be picked up at maximum by repeating nozzle strokes a plurality of times while shifting the position to pick them up.

Figure 3B:
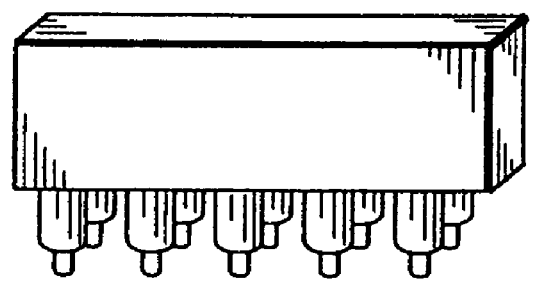
FIG. 3B shows an example of a pickup nozzle on the line gang pickup head.

Positions (head position) of the ten nozzles 112a to 112b to be mounted on the line gang pickup head 112 are respectively called a head number 1 (H1), a head number 2 (H2), . . . , a head number 10 (H10) from the left of the line gang pickup head 112, when looked from the component supplying units 115a and 115b. The method of optimizing a mounting order according to the present invention is not limited to a single-lined line gang pickup head where the nozzles are arranged in a single line as shown in FIG. 3A and can be applied to a double-lined line gang pickup head where the nozzles are arranged in two lines as shown in FIG. 3B.

It should be noted that only one component tape is loaded into a "single cassette" component feeder 114, while two component tapes with the same feed pitch (2 mm or 4 mm) are loaded into a "double cassette" component feeder 114. The position of each component feeder 114 (or component tape) in a component supplying unit 115a or 115b is indicated using a value in the Z-axis or a position on the Z-axis, with consecutive values being assigned to positions starting with the leftmost position in the component supplying unit 115a as position "1". As a result, the determination of mounting order for taped components amounts to the determination of the ordering (i.e., positioning on the Z-axis) of components (or component tapes, or component feeders 114 in which the component tapes have been stored).

FIG. 4 shows the examples of the nozzles 112a-112b to be mounted on the line gang pickup head 112. As shown in the diagram, plural types (S, M, L and others) are provided according to size and weight of the component to be mounted. When lacking the nozzle necessary for picking up components, the line gang pickup head 112 moves to the nozzle station 119 where the nozzle is placed, performs nozzle interchange then, returns back to the component cassette 114 and then picks up the components.

Figure 5A:
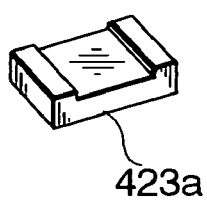
FIGS. 5A to 5D show various chip-shaped electronic components to be mounted.
Figure 5B:
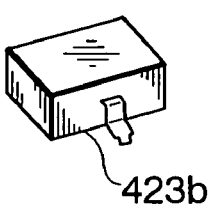
Figure 5C:
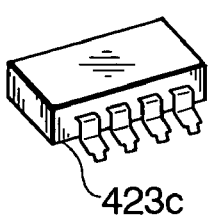
Figure 5D:
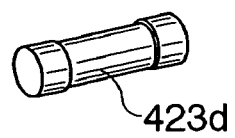
Figure 5E:
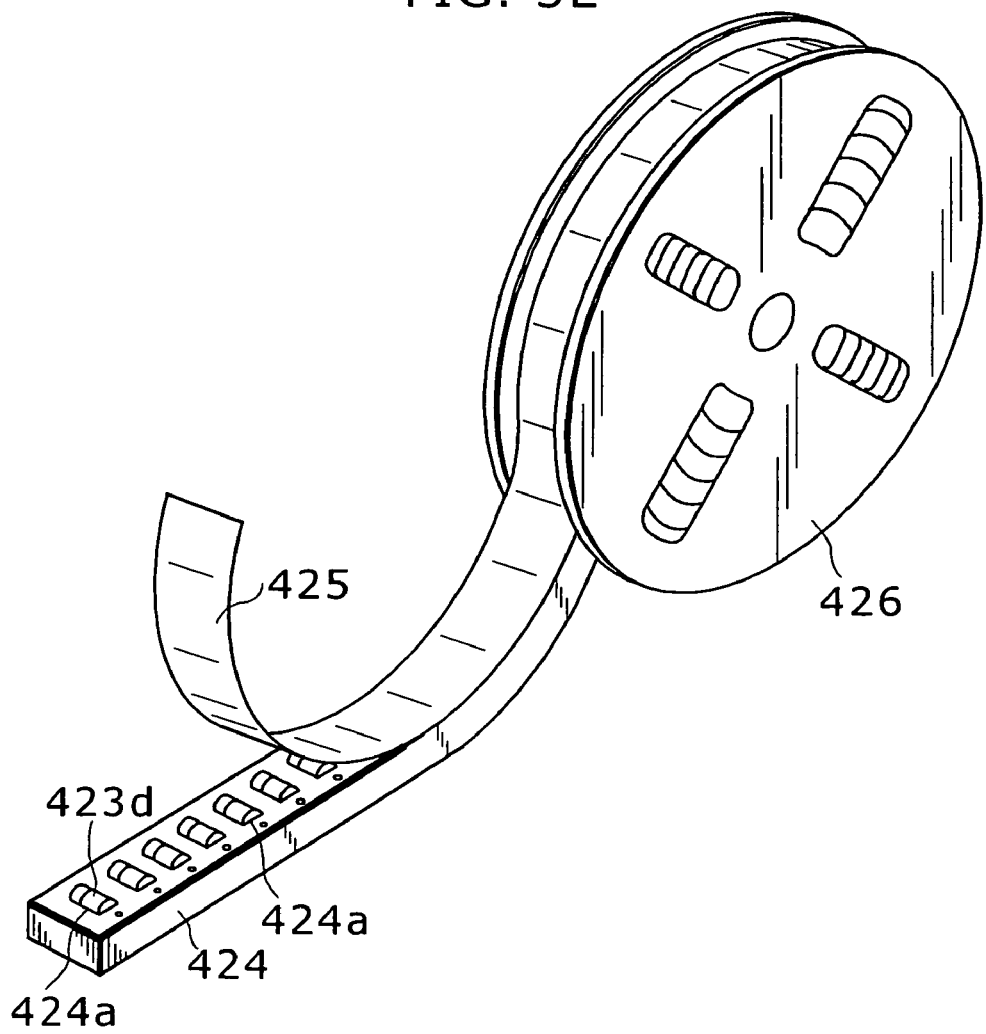
FIG. 5E shows examples of a carrier tape on which components are loaded and a supply reel.

FIGS. 5A to 5D show various taped components 423a to 423d. The various chip-shaped electronic components 423a-423d shown in the diagram are placed into storage spaces 424a that are successively formed in a carrier tape 424 shown in FIG. 5E and are encapsulated by applying a cover tape 425 over the carrier tape 424. A predetermined length of this carrier tape 424 is wound around the supply reel 426, and the result is supplied to users as a component tape.

FIRST EMBODIMENT

Figure 6:
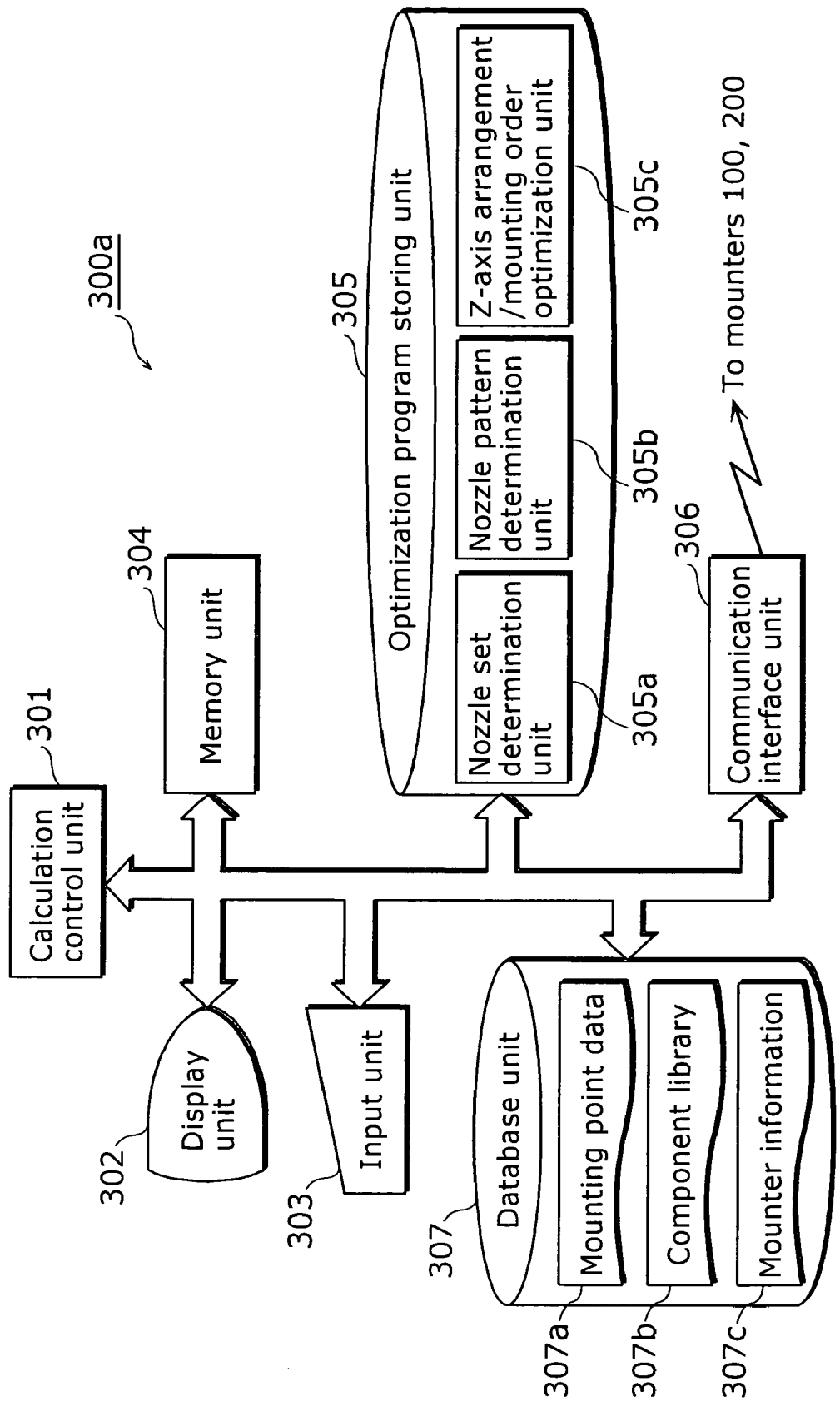
FIG. 6 is a block diagram showing the hardware construction of an optimization apparatus.

FIG. 6 is a block diagram showing the hardware construction of the optimization apparatus 300a that was shown in FIG. 1. In order to minimize the line tact time (the highest tact time out of the individual tact times of the stages forming the production line) for the mounting of components on a board, the optimization apparatus 300a determines which components should be mounted by each stage and the mounting order of components for each stage, based on information for all of the components that is provided by a component mounting CAD (Computer-Aided Design) apparatus or the like. By doing so, the optimization apparatus 300a produces optimal NC data. The optimization apparatus 300a includes a calculation control unit 301, a display unit 302, an input unit 303, a memory unit 304, an optimization program storing unit 305, a communication interface unit 306, and a database unit 307.

The optimization apparatus 300a is realized by having a standard computer system such as a personal computer execute an optimization program embodying the present invention. When not connected to an actual mounter 100, the optimization apparatus 300a can also function as a stand-alone simulator (an optimization tool for the order of component mounting).

The calculation control unit 301 is a CPU (Central Processing Unit), a numeric processor, or the like. In accordance with instructions from the user, the calculation control unit 301 loads the required programs from the optimization program storing unit 305 into the memory unit 304 and executes them. In accordance with the execution result, the calculation control unit 301 controls the components numbered 302 to 307.

The display unit 302 is a CRT (Cathode Ray Tube), a LCD (Liquid Crystal Display), or the like, while the input unit 303 is an input device such as a keyboard or a mouse. These components are controlled by the calculation control unit 301 and are used to allow user interaction with the optimization apparatus 300.

The communication interface unit 306 is a LAN (Local Area Network) adapter or the like, and is used to allow the optimization apparatus 300 to communicate with the mounters 100 and 200. The memory unit 304 is a RAM (Random Access Memory) or the like that provides a work area for the calculation control unit 301.

The database unit 307 is a hard disk drive or the like storing input data (mounting point data 307a, a component library 307b, and mounter information 307c) that is used in the optimization process performed by the optimization apparatus 300a and mounting point data and other data generated by the optimization process.

FIGS. 7 to 9 show examples of the mounting point data 307a, the component library 307b, and the mounter information 307c, respectively.

The mounting point data 307a is a collection of information showing the mounting points of all of the components to be mounted. As shown in FIG. 7, one mounting point pi is made up of a component type ci, an X coordinate xi, a Y coordinate yi, and control data φi. In the present case, the expression "component type" refers to the name of component in the component library 307b shown in FIG. 8, the "X coordinate" and "Y coordinate" are the coordinates of the mounting point (coordinates that indicate a specific position on a board), and "control data" is control information (such as the type of pickup nozzle that can be used and the maximum speed at which the line gang pickup head 112 should move) relating to the mounting of the component. It should be noted that the "NC data" that is to be finally produced is an ordered list of mounting points that results in the shortest line tact time.

The component library 307b is a library in which specific information, for the various component types that can be handled by the mounters 100 and 200, is gathered together. As shown in FIG. 8, each entry in the component library 307b includes the component size, tact time (tact time for each component type subject to certain conditions), and other restriction information (such as the type of pickup nozzle that can be used, the recognition method to be used by the component recognizing camera 116, and the maximum speed at which the line gang pickup head 112 should move). It should be noted that in FIG. 8, the external appearance of components of various types have also been shown for reference purposes.

The mounter information 307c is information showing the constructions of each of the stages forming the production line and the restrictions to which these stages are subject. As shown in FIG. 9, the mounter information 307c is made up of information such as head information relating to the type of line gang pickup head, nozzle information relating to the types of nozzles that can be attached to the line gang pickup head, feeder information relating to the maximum number of component feeders 114, and tray information relating to the number of levels on which trays are stored in the tray supplying unit 117. The information described above is categorized as follows. The categories used are equipment option data (for each stage), resource data (the number of feeders that can be fitted in each stage and the number of nozzles in each stage), nozzle station arrangement data (for each station equipped with a nozzle station), initial nozzle pattern data (for each stage), and Z-axis arrangement data (for each stage).

The optimization program storing unit 305 is a hard disk drive or the like for storing various optimization programs for realizing the functions of the present optimization apparatus 300a. An optimization program is a program for optimizing a mounting order of components and is composed functionally (as a processing unit that functions when the program is executed by the calculation control unit 301) of a nozzle set determination unit 305a, a nozzle pattern determination unit 305b and a Z-axis arrangement/mounting order optimization unit 305c.

The nozzle set determination unit 305a is a processing unit for determining more than one optimal nozzle set to be used for mounting all the components. Here, a nozzle set is a combination of the pickup nozzles to be mounted on the line gang pickup head 112 for mounting components. The combination is determined based on types and numbers of ten or less pickup nozzles in the case of ten pickup nozzles. For example, a combination can be made of two S-typed pickup nozzles and eight M-typed pickup nozzles. Here, a head position of the line gang pickup head 112 on which each of the pickup nozzles is mounted is not limited. The nozzle set determination unit 305a specifies a nozzle set which can complete mounting of all the components within a shorter time regarding the number of times of interchanging pickup nozzles (nozzle interchange time) operated by the line gang pickup head 112 and the number of tasks (task number) necessary for mounting all the components.

The nozzle pattern determination unit 305b determines the optimal nozzle pattern and arrangement of the pickup nozzles (nozzle arrangement) at the nozzle station 119 based on the nozzle set determined by the nozzle set determination unit 305a. The nozzle pattern determination unit 305b determines a nozzle pattern by determining the positions (head position of the line gang pickup head 112) of each of the pickup nozzles composing each nozzle set determined by the nozzle set determination unit 305a (correlates the types of pickup nozzles and the head position of the line gang pickup head 112) and determining the arrangement for each nozzle set. The nozzle arrangement at the nozzle station 119 is determined according to the determined nozzle pattern.

The Z-axis arrangement/mounting order optimization unit 305c optimizes a Z-axis arrangement and a mounting order based on the nozzle pattern determined by the nozzle pattern determination unit 305b and the nozzle arrangement at the nozzle station 119 (while maintaining the nozzle pattern and the nozzle arrangement) and generates NC data as a final result. The optimization of the mounting order here is to give an optimal order for each of the mounting points on the board with the fixed nozzle pattern, nozzle arrangement and Z-axis arrangement.

Thus, in the optimization program, after the nozzle set determination unit 305a and the nozzle pattern determination unit 305b determine the nozzle pattern as well as the nozzle arrangement, the Z-axis arrangement/mounting order optimization unit 305c optimizes the Z-axis arrangement and the mounting order, which are left in the process. Accordingly, it is after the effective optimization in which nozzle interchange that makes up the great portion of the whole time for mounting components is prioritized that the remaining Z-axis arrangement and mounting order are optimized so that more optimal mounting order can be searched within a shorter processing time.

Next, the operation of the optimization apparatus 300a thus constructed is explained.

Figure 10:
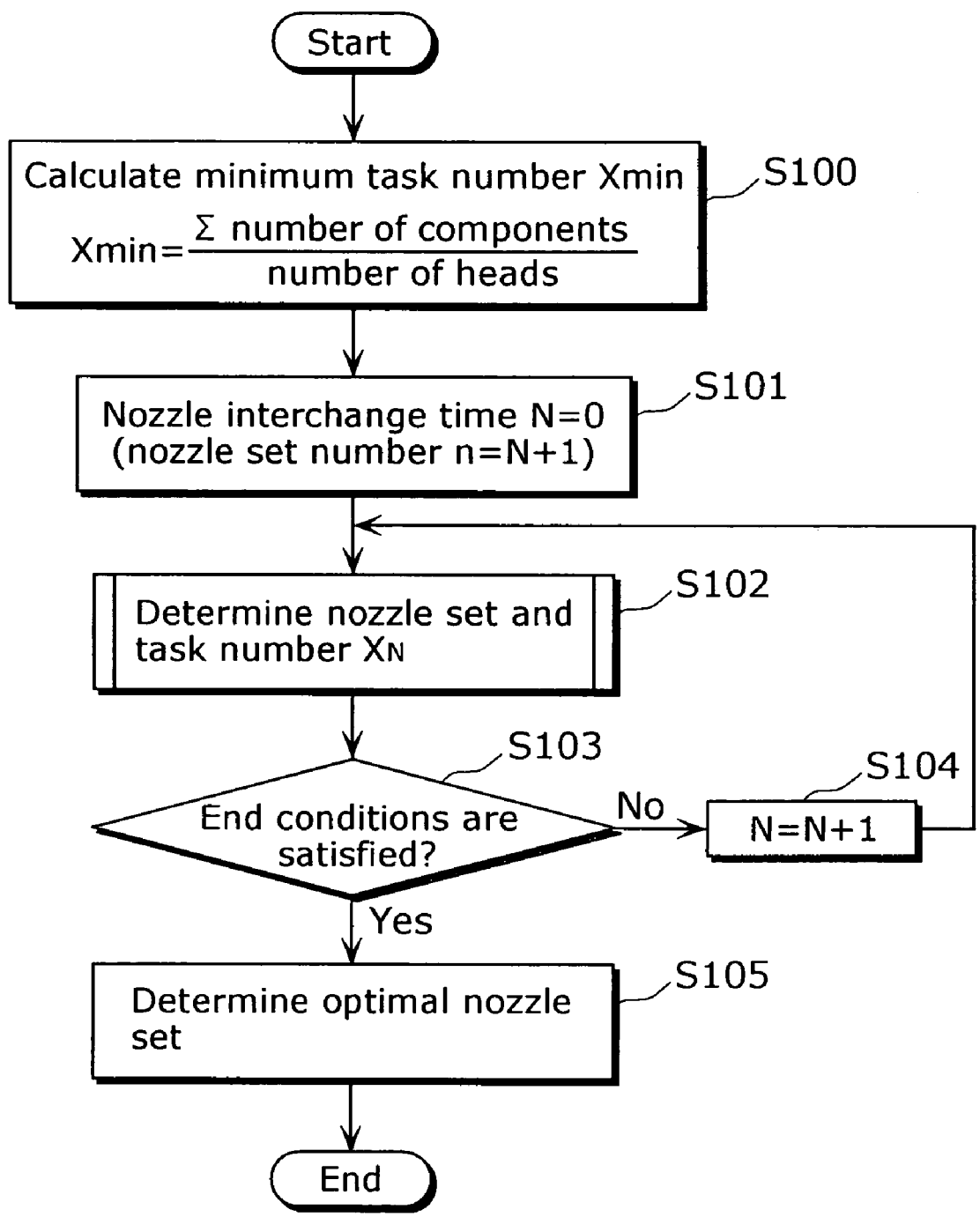
FIG. 10 is a flowchart showing the procedure of determining a nozzle set performed by the nozzle set determination unit shown in FIG. 6.

FIG. 10 is a flowchart showing the process of determining the nozzle set performed by the nozzle set determination unit 305a. The nozzle set determination unit 305a firstly calculates an ideal minimum task number $X_{min}$ based on a total number of the components to be mounted and the number of heads on the line gang pickup head 112 (the number of the pickup nozzles mounted on the line gang pickup head 112, namely, 10 in the case of using the line gang pickup head shown in FIG. 3) (S100). For example, assuming that the number of components to be mounted is 217 including 50 components to be mounted using an S-typed pickup nozzle (referred to as "S-typed components") and 167 components to be mounted using an M-typed pickup nozzle (referred to as "M-typed components" and the number of heads on the line gang pickup head is 5, $X_{min}=44$ can be obtained from the following calculation (50+167)/5=43.4, when fractions below decimal point are rounded up. This means that at least 44 tasks are required to mount all the components even when the components are mounted using the line gang pickup head 112 on which the components are fully loaded.

The nozzle set determination unit 305a then determines the nozzle set and the task number $X_N$ necessary for mounting all the components at each nozzle interchange time N by incrementing the nozzle interchange time N that initially indicates "0" by 1 (S101-S104).

To be more specific, firstly the nozzle interchange time N is determined as 0 (the number of nozzle sets is 1) (S101) and determines the nozzle set and the task number $X_N$ for this case (S102). It should be noted that the relation between the nozzle interchange time N and the number of nozzle sets (types of nozzle sets) n can be presented as n=N+1. For example, when the number of nozzle sets is 1, the nozzle interchange time N is 0 since all the components are mounted using the nozzle set firstly mounted on the line gang pickup head 112. When the number of nozzle sets is 2, the nozzle set has to be changed to the second nozzle set during the mounting process. Therefore, the nozzle interchange time N is 1.

As for the determination of the nozzle set and the task number $X_N$ (S102), as is mentioned later, examination of whether mounting of all the components is possible or not (i.e., examination of a feasible solution) by sequentially incrementing the minimum task number $X_{min}$ by 1 so that the nozzle set and the task number, with which all the components can be mounted in fewer task numbers, are determined first.

Then, whether or not predetermined end conditions, which are to be mentioned later, are satisfied is judged (S103). When they are not satisfied (No in S103), the nozzle interchange time N is incremented by 1 (S104), and this time, the nozzle set and the task number $X_N$ necessary for mounting all the components are determined for the case in which the nozzle interchange time N is 1 (the number of nozzle sets is 2) (S102).

Thus, the processing of determining the task number $X_N$ by incrementing the nozzle interchange time N by 1 (N=0, 1, . . . ) is repeated (S102-S104). When the end conditions are satisfied (Yes in S103), such search is terminated and a combination with which mounting of components is completed in the shortest time is eventually determined from among the combinations of the nozzle interchange time N and the task number $X_N$ which have already been specified in the search using a predetermined evaluation function and determines the nozzle set of the determined combination as an optimal nozzle set (S105).

It is to be noted that the end conditions in Step S103 is a case in which the task number $X_N$ does not decrease even when the nozzle interchange time N is increased, when the determined task number $X_N$ corresponds to the minimum task number $X_{min}$. That is to say, the possibility that an evaluated value, which is to be mentioned later on, becomes smaller is zero in spite of the fact that the nozzle interchange time N is incremented.

Figure 11:
FIG. 11 is a diagram for explaining the procedure used in Step S105 (specifying an optimal nozzle set) shown in FIG. 10.

FIG. 11 is a diagram showing the procedure used in Step S105 (determine an optimal nozzle set) in FIG. 10. Here, a case of obtaining three sets for a combination of the nozzle interchange time N and the task number $X_N$ (N=0, 1, 2) is shown. The nozzle set determination unit 305a calculates evaluated values S0, S1 and S2 by substituting nozzle interchange time N and task number $X_N$ in the evaluation function shown in the diagram, specifies the smallest evaluated value from among the values S0, S1 and S2, and determines the nozzle set corresponding to the nozzle interchange time N as an optimal nozzle set.

It should be noted that the evaluation function shown in the diagram is a function for calculating a total value of the time necessary for nozzle interchange and the time necessary for executing tasks. "h" in the evaluation function is a coefficient for converting the time necessary for a stroke of nozzle interchange into a task number and is invariable, e.g., 2.

In this way, the nozzle set, such that the total of the time required for nozzle interchange and the time required for the execution of the task is the smallest, can be determined.

Figure 12:
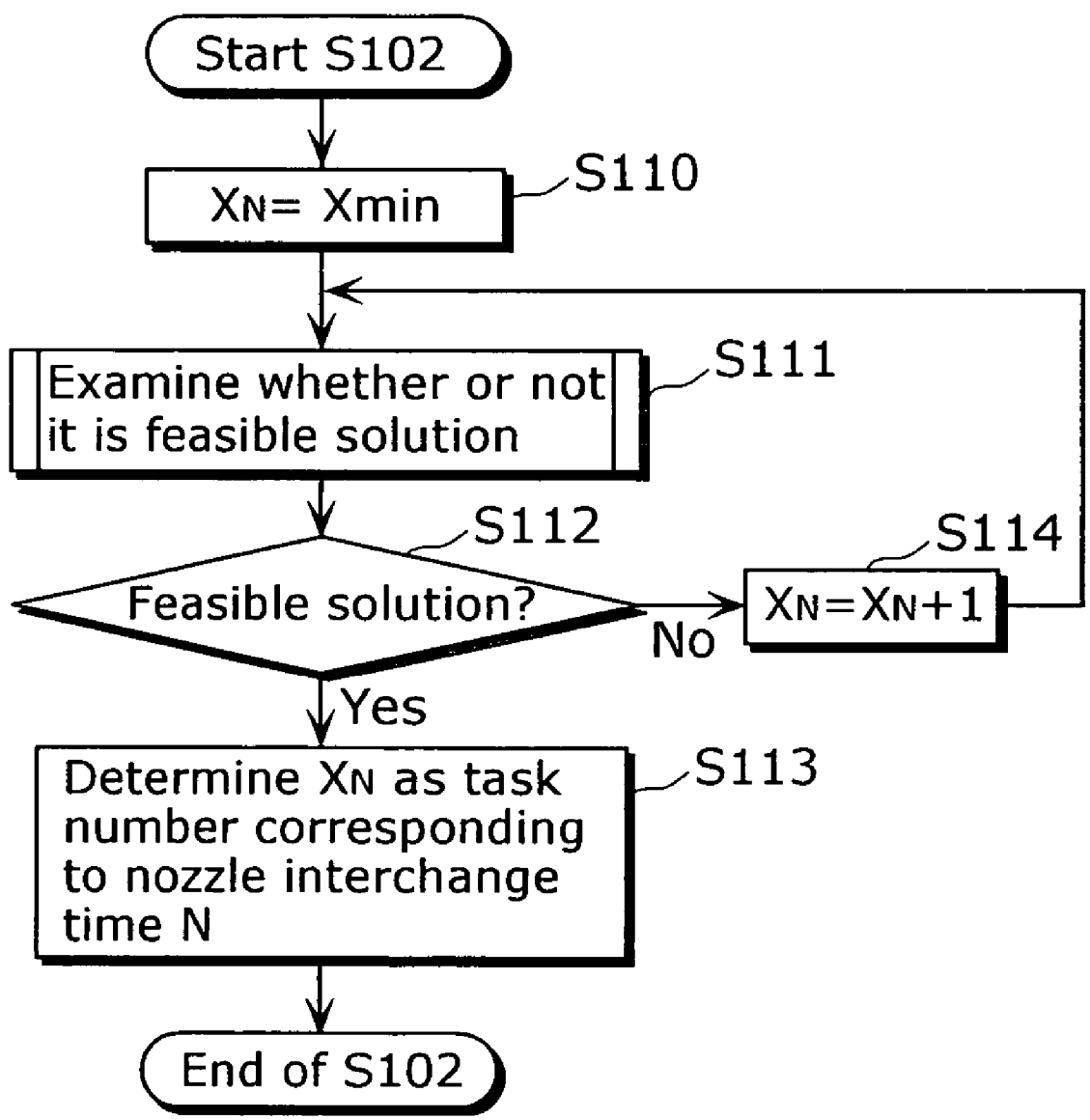
FIG. 12 is a flowchart showing the detailed procedure used in Step S102 (specifying a nozzle set and a task number $X_N$) shown in FIG. 10.

FIG. 12 is a flowchart showing the detailed procedure used in Step S102 (determine a nozzle set and a task number $X_N$) of FIG. 10, that is, a procedure used for determining the task number $X_N$ necessary for mounting all the components. The nozzle set determination unit 305a firstly presupposes that the task number $X_N$ equals to the minimum task number $X_{min}$ as initial settings (S110) and examines whether the task number is a feasible solution or not (S111). Namely, the nozzle set determination unit 305a examines whether or not all the components can be mounted by $X_{min}$ number of tasks, subjected to a given nozzle interchange time N.

Consequently, when the task number $X_N$ is not a feasible solution (No in S111), the task number $X_N$ is incremented by 1 (S114) and the examination of whether feasible solution or not is repeated again (S111). On the other hand, when it is a feasible solution, the task number $X_N$ at that time is determined as the task number $X_N$ corresponding to the given nozzle interchange time N (S113) and the processing is terminated.

Thus, the nozzle set determination unit 305a determines the task number $X_N$ required to mount all the components by incrementing the minimum task number $X_{min}$ by 1, subjected to the given nozzle interchange time N.

Figure 13:
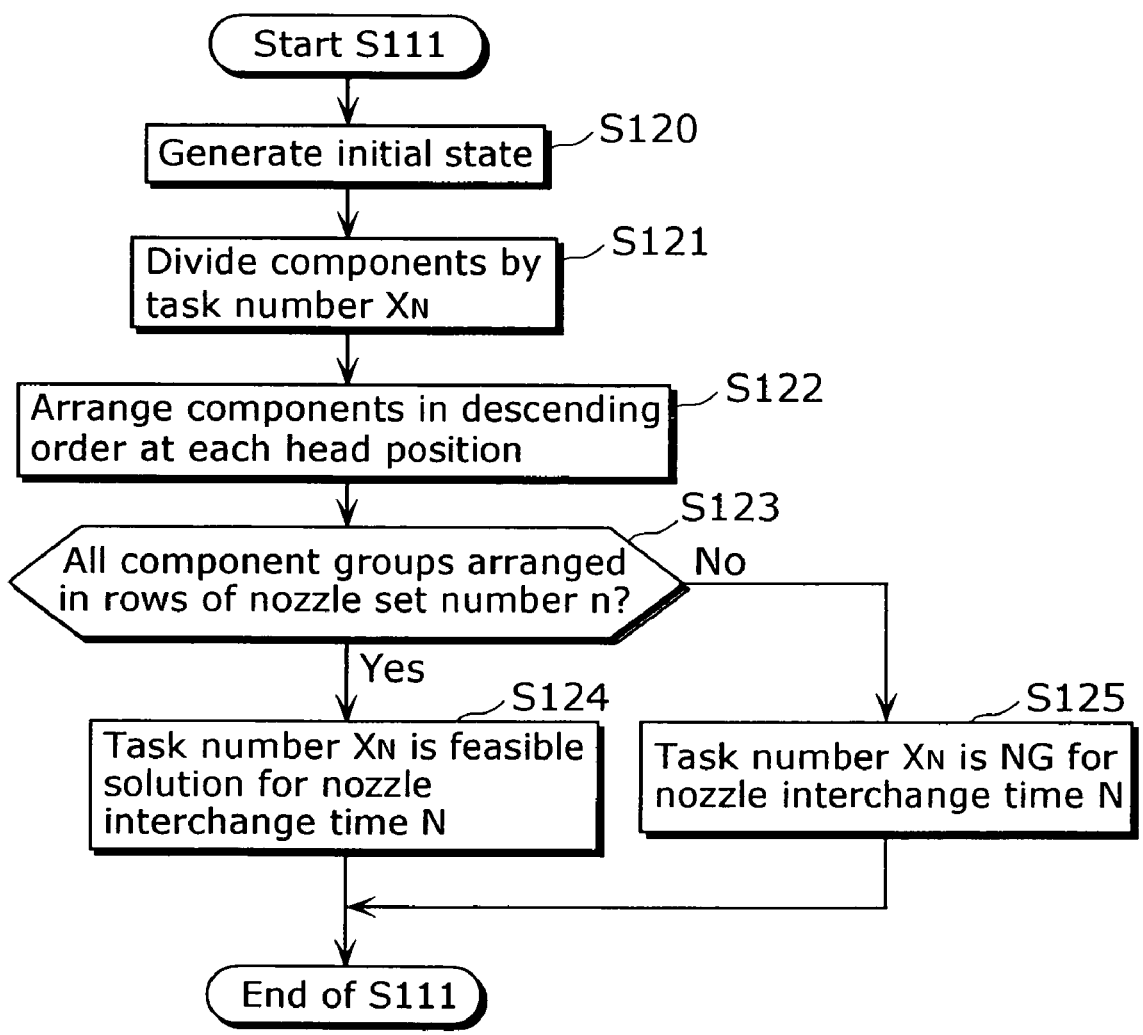
FIG. 13 is a flowchart showing the detailed procedure used in Step S111 (examining whether it is a feasible solution or not) shown in FIG. 12.

FIG. 13 is a flowchart showing the detailed procedure used in Step S111 (examination of whether feasible solution or not) in FIG. 12. Namely, when nozzle interchange time N and task number $X_N$ are given, it is a procedure for judging whether or not it is possible to mount with such conditions satisfied. The nozzle set determination 305a firstly divides all the components to be mounted into groups depending on the type of pickup nozzles (for instance, when mounting 50 S-typed components and 167 M-typed components, two groups: one for the 50 S-typed components and the other for the M-typed components), and generates a nozzle set table in which each of the groups are arranged as an initial state (S120). Here, a nozzle set table, as is mentioned later, is a table on the memory where head position (head number) is shown in a column while the number of nozzle sets (nozzle set number) is shown in a row Then, each of the groups is divided by a given task number $X_N$ (S121) while the component groups calculated by the division are arranged in the nozzle set table sequentially from the upper left in descending order of the number of components (S122).

As a result, whether or not all the component groups are arranged within the rows of the given nozzle set number n is judged (S123). When all the component groups are arranged on the nozzle set table (Yes in S123), it is judged that the task number $X_N$ is a feasible solution for the given nozzle interchange time N (S124), otherwise (No in S123), it is judged that the task number $X_N$ is not a feasible solution for the given nozzle interchange time N (S125).

Figure 14:
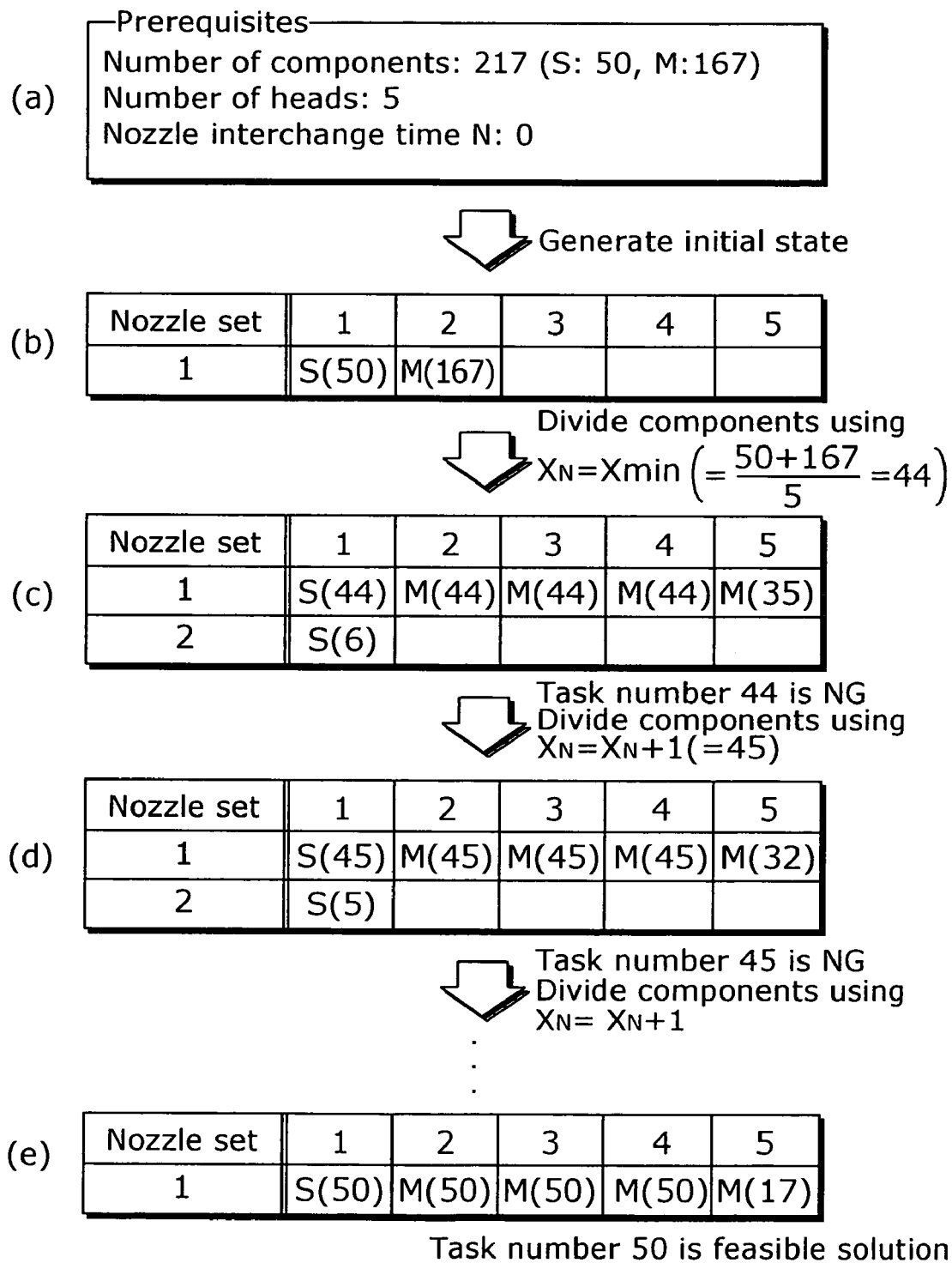
FIGS. 14A to 14E are diagrams showing concrete examples of specifying the task number $X_N$ when a nozzle interchange time N is 0.

FIG. 14 is a diagram showing a concrete example of determining a task number $X_N$, when the nozzle interchange time N is "0". As shown in FIG. 14, supposing that a total number of the components to be mounted is 217 (including 50 S-typed components and 167 M-typed components) and the head number on the line gang pickup head is 5. Under this condition, the determination of the task number $X_N$ (Step S102 in FIG. 10) where nozzle interchange time N=0 (Step S101 in FIG. 10) is operated as follows.

As shown in FIG. 14B, the nozzle set determination unit 305a firstly generates an initial state of the nozzle set table (Step S120 in FIG. 13). It should be noted that the left column indicates the number of nozzle sets while five columns ("1"-"5") correspond to the head number. "S (50)" and "M(167)" in the table respectively signifies 50 S-typed components and 167 M-typed components. Accordingly, the nozzle set table shown in FIG. 14B means that 50 S-typed components and 167 M-typed components are mounted on the positions indicated by the head numbers 1 and 2 using the line gang pickup head on which pickup nozzles of S type and M type are loaded. By the way, it is presupposed here that as many of the components as possible are mounted by simultaneously picking them up. Therefore, mounting of all the components is completed by 167 tasks according to this nozzle set table.

The nozzle set determination unit 305a then divides the group S (50) and M (167) generated in an initial state by minimum task number $X_{min}$ "44" (Step S121 in FIG. 13) and arranges the component groups in descending order of the number of component (putting priority on S( ) to M( ) when the numbers are the same) downward and rightward, as shown in FIG. 14C (Step S122 in FIG. 13).

The nozzle set determination unit 305a then judges whether or not all the component groups are arranged within the columns equivalent to the given nozzle set number n (here, 1) (Step S123 in FIG. 13). In the FIG. 14C, it is judged that the mounting by the task number "44" for the nozzle set number "1" is impossible (Step S125 in FIG. 13 and Step S112 in FIG. 12). Then, the task number is incremented by 1 (Step S114 in FIG. 12) so as to make the task number "45" and performs the same examination (Step S111 in FIG. 12, Steps S120-S125 in FIG. 13). Namely, the component groups are rearranged as shown in the nozzle set table shown in FIG. 14D. In this case, component S (5) which cannot be arranged in a single row is generated so that it is judged that the mounting with the task number "45" is not possible.

The task number is incremented by 1 and the arrangement of components in the nozzle set table is thus repeated in the same manner. Finally when the components are arranged with the task number "50", as shown in FIG. 14E, all the components are arranged in the first row of the nozzle set table. Therefore, the task number "50" is judged to be the minimum feasible solution (S124 in FIG. 13) and thereby the task number for the nozzle interchange time 0 is determined as "50" (S113 in FIG. 12).

The nozzle set determination unit 305a increments the nozzle interchange time by 1 (S104 in FIG. 10) and determines the task number X2 for the nozzle interchanging time N "1" (Step S102 in FIG. 10).

Figure 15:
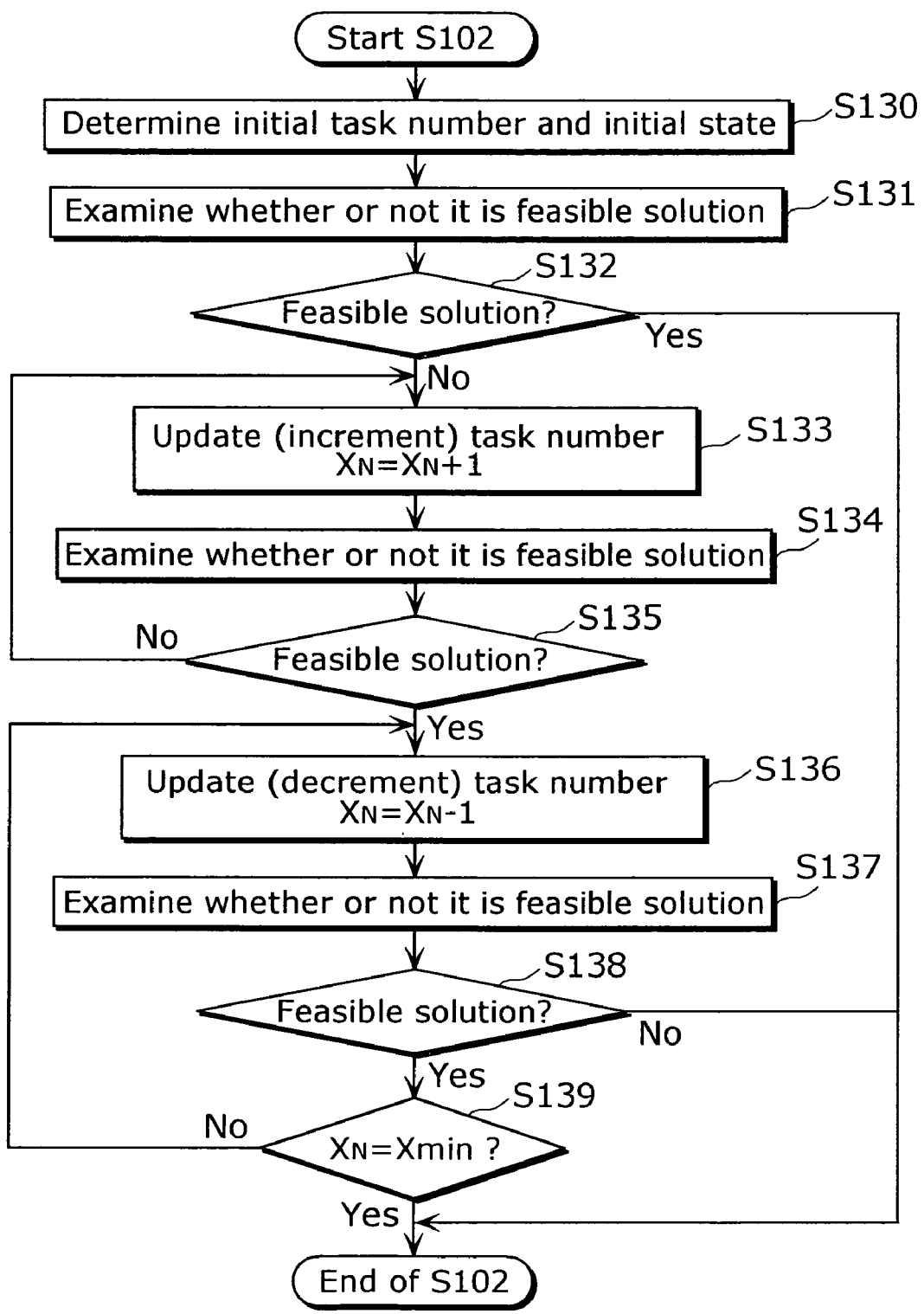
FIG. 15 is a flowchart showing the detailed procedure used in specifying the task number $X_N$ when the nozzle interchange time N is 1.

FIG. 15 is a flowchart showing the detailed procedure used in determining the task number $X_N$ where the nozzle interchanging time N is 1 or more (S102 in FIG. 10). The basic flow is as same as the procedure used in the case where the nozzle interchange time N is 0 shown in FIGS. 12 and 13. The difference, however, is that the procedure to search for a feasible solution with the smaller task number, not only by incrementing but also by decrementing the task number, is added.

The nozzle set determination unit 305a firstly determines an initial task number and an initial state (S130). Here, the initial task number can be calculated by dividing the minimum task number $X_{min}$ into given respective plural nozzle sets. ($X_{min}$-N) number of tasks are assigned to the first nozzle set while a single task is assigned to the remaining nozzle sets including the second nozzle set.

The nozzle set determination unit 305a then examines whether the initial task number is a feasible solution or not (S131). That is to say, the nozzle set determination unit 305a examines, under the given nozzle interchange time N, whether or not all the components can be mounted with the initial task number by specifying the nozzle set corresponding to each given nozzle interchange time N.

When it is a feasible solution (Yes in S132), the nozzle set determination unit 305a determines specified two or more nozzle sets as well as an initial task number as a solution for the nozzle interchange time N, and terminates the processing.

When the initial task number is not a feasible solution (No in S132), the total task number $X_N$ is incremented by 1 (S133) and examines again whether it is a feasible solution or not (S134). Such processing is repeated until a feasible solution is obtained (S135). Here, when the total task number is incremented by 1, the task of the nozzle set having the fewer "empty head" (a head with a pickup nozzle on which a component is not mounted while the task is executed), out of the two or more nozzle sets, is incremented by 1 and then the nozzle set is updated. This is because the possibility to mount components as many as possible is higher, that is to say, it is highly possible to assign all the component groups which were not able to be assigned within the given nozzle set number, when the task number of the nozzle set with fewer "empty head" is incremented.

After a feasible solution is thus found by the increase in the task number, the nozzle set determination unit 305a decrements, contrary to the previous operation, the total task number $X_N$ by 1 (S136) and examines again whether it is a feasible solution or not (S137). Here, the nozzle set determination unit 305a prioritizes the task number of the nozzle set with many "empty head", out of the two or more nozzle sets, in decrementing the total task number by 1 and then updates the nozzle set. This is because the possibility to average the number of components per head within the same nozzle set is higher, namely, it is highly possible that the task number without incrementing the nozzle set number is decremented, when the task number of the nozzle set having many "empty" is decremented.

When it is not a feasible solution (No in S138), the nozzle set determination unit 305a judges that it is difficult to decrease further the task number and determines plural nozzle sets in the state before decreasing task and the total task number $X_N$ calculated based on such nozzle sets as a solution for the nozzle set number n and terminates the processing.

When it is a feasible solution (Yes in S138), the nozzle set determination unit 305a judges whether or not the total task number is the minimum task number $X_{min}$ (S139). When it is the case (Yes in S139), the nozzle set determination unit 305a determines plural nozzle sets at this state and the total task number $X_N$, calculated based on such nozzle sets as a solution for the nozzle interchange time N and terminates the processing.

When the total task number is not the minimum task number $X_{min}$ (No in S139), the nozzle set determination unit 305a, repeats the following processing: decrementing again the total task number by 1 (S136); and examining whether it is a feasible solution or not (S137).

Thus, when the nozzle interchange time N is 1 or more, a feasible solution is searched by incrementing the total task number by 1. When a feasible solution is obtained, a feasible solution is searched by decrementing the total task number by 1 so as to eventually determine the minimum task number $X_{min}$ for the given nozzle interchange time N.

FIGS. 16 and 17 are diagrams showing examples of determining the task number $X_N$ when the nozzle interchanging time N is 1. Now, supposing that the total number of the components to be mounted is 217 (including 50 S-typed components and 167 M-typed components) and the head number of the line gang pickup head is 5, as shown in FIG. 16.

Since the minimum task number $X_{min}$ is "44", The nozzle set determination unit 305a assigns "43" and "1" respectively to two nozzle sets (the first and second nozzle sets) as an initial task number (Step S130 in FIG. 15). Namely, assume that the task number to be assigned to the j th nozzle set for the nozzle interchange time N is $X_{Nj}$, the initial task number $X_{11}$ to be assigned to the first nozzle set for the nozzle interchange time N "1" is "43" as calculated from the following:

$$= X_{min} - N \ (j = 1)$$
$$= 44 - 1$$
$$= 43$$

The initial task number $X_{12}$ to be assigned to the second nozzle set is "1" as calculated from the following:

$$X_{12} = 1 (j \geq 2)$$

Then, the nozzle set determination unit 305a firstly generates the nozzle set table in which the two component groups S (50) and M (167) shown in FIG. 17A are arranged as an initial state, (Step S130 in FIG. 15).

The nozzle set determination unit 305a then rearranges these two component groups by the initial task numbers $X_{11}$ and $X_{12}$ as shown in the nozzle set table in FIG. 17B (Step S131 in FIG. 15). In more detail, the two component groups are firstly divided by the initial task number for the first nozzle set $X_{11}$ ("43") and arranges in descending order of the number of component groups (here, in order of S (43), M (43), M (43), M(43), M(38)) in the first row of the nozzle set table, and then, divides the remaining components S (7) by the initial task number for the second nozzle set $X_{12}$ ("1") in descending order of the number of component groups (here, in order of S (1), S (1), S (1), S (1), S (1)) in the second row of the nozzle set table, and finally, arranges the remaining components S (2) in the third row of the nozzle set table.

The nozzle set determination unit 305a judges that the task number ($X_{11}$=43, $X_{11}$=1) is not a feasible solution from the fact that all the component groups cannot be arranged in two rows of the nozzle set table (No in Step S132 in FIG. 15), increments the task number (Step S133 in FIG. 15) and examines the feasibility (Step S134 in FIG. 15). Namely, the nozzle set determination unit 305a increments the task number of the nozzle set having fewer "empty" $X_{12}$ by 1 so as to make "2" and rearranges them in the second row of the nozzle set table. In more detail, as shown in FIG. 17C, the components S(7) which are left after the arrangement in the first row of the nozzle set table are divided by the task number "2" and arranged in descending order of the number of component groups (here, in order of S(2), S(2), S(2), S(1)) in the second row of the nozzle set table.

The nozzle set determination unit 305a judges that the task number ($X_{11}$=43, $X_{12}$=2) is a feasible solution since all the components are arranged in the two rows of the nozzle set table (Yes in Step S135 in FIG. 15), decrements the task (Step S136 in FIG. 15) and examines the feasibility (Step S137 in FIG. 15). Namely, the task number of the nozzle set having more "empty head" is incremented by 1 to make "42" and rearranges them in the first and second rows of the nozzle set table. To be more precise, the two component groups at the initial state are divided by the new task number $X_{11}$ ("42") as shown in FIG. 17D and arranges them in descending order of the number of components (here, in order of S(42), M(42), M(42), M(42), M(41)) in the first row of the nozzle set table, divides the remaining components S(8) by the task number $X_{12}$ ("2") and arranges them in the second row of the nozzle set table.

The nozzle set determination unit 305a judges that the task number is a feasible solution since all the components are arranged in two rows of the nozzle set table (Yes at Step S138 in FIG. 15) and then judges whether or not the total task number $X_N$ (=$X_{11}$+$X_{12}$=42+2=44) equals to the minimum task number $X_{min}$ (44) (Step S139 in FIG. 15). Since the total task number $X_N$ equals the minimum task number $X_{min}$, the processing of searching the task number is terminated. That is to say, the task set (total task number×2=44) shown in FIG. 17D is determined as a solution for the nozzle set number "2".

It should be noted that in the above example, that is, the case of mounting components S(50) and M(167), the searched out task number $X_N$ equals to the minimum task number $X_{min}$ "44" when the nozzle interchange time N is 1. Therefore, the ending condition for searching nozzle set is satisfied (Step S103 in FIG. 10). The nozzle set determination unit 305a then selects the optimal combination from among the combinations that are searched so far, respectively, composed of the nozzle interchange time N and the task number $X_N$ (Step S105 in FIG. 10). To be more specific, two combinations are searched out as shown in FIG. 18, that is, (N=0, $X_N$=50) and (N=1, $X_N$=44). The nozzle set determination unit 305a therefore calculates the evaluated values S ("50" and "46') by substituting these values N and $X_N$ in the evaluation function (here, h=2) and determines the smallest value as the optimal nozzle set in the case in which nozzle interchange time N is 1. Accordingly, the nozzle set determination unit 305a determines that it is optimal to mount the components S (50) and M (167) using the two types of nozzle sets shown in FIG. 17D.

It should be noted that, in the procedure of determining a nozzle set as described above, the search is conducted with an assumption that there are no restrictions on the number of various pickup nozzles (nozzle resource). However, there is actually a case in which a nozzle resource is subjected to such restriction). In this case, a case in which the nozzle set judged as a feasible solution in the procedure turns out to be no longer a feasible solution can be generated. For example, the nozzle sets S, M, M, M, M shown in FIG. 14E are presented as nozzle resource presupposing that a single S-typed pickup nozzle and four M-typed pickup nozzles can be used at the same time. If the nozzle resource is restricted to a single S-typed pickup nozzle and three M-typed pickup nozzles, the nozzle set in this case is not a feasible solution any more. Accordingly, the procedure described above cannot be applied to the case in which the nozzle resource is restricted.

When there is a restriction on nozzle resource, the following procedure can be added to the procedure used in the case without any restrictions on nozzle resource as described above.

(1) The expression used for the component group calculated by dividing the components by the task number is A (B, C) instead of A (B).

"A" here is a type of pickup nozzle, for instance, "S", "M" or other characters while "B" is the number of components and "C" is a flag indicating whether or not the nozzle resource conditions are satisfied (1: OK, 0: NG).

It should be noted that "C" assigns "1" to the component groups which are within the range of nozzle resource and "0" to the rest of the component groups downward and rightward in the table, starting from the component group at the head. The flag attachment is for enabling the detection of whether the restrictions on nozzle resource are respected or not.

(2) When the component group A (B, 0) in which a value of "C" is "0" is found in the row in the nozzle set table as a result of the procedure (1), the component group is shifted to the one below. Namely, the component groups which do not comply with the restriction are to be examined for the next nozzle set with the view to respect the restrictions on nozzle resource.

The following describes the procedure of determining a nozzle set in which the restriction on nozzle resource is taken into consideration with reference to FIGS. 19 and 20. FIGS. 19 and 20 are examples for showing the procedure used for searching the task number $X_N$ when the nozzle interchange time N is 1.

Supposing that the components to be mounted are made up of 100 S-typed components and 120 M-typed components, whereas nozzle resource is defined as 2 S-typed pickup nozzles and 2 M-typed pickup nozzles and the head number of the line gang pickup head is 5. Based on these presumptions, the minimum task number $X_{min}$ can be calculated as follows:

$$X_{min} = (100 + 120)/5$$
$$= 44$$

The nozzle set determination unit 305a therefore assigns, respectively, $X_{11}$ (=43) and $X_{12}$ (=1) as initial task numbers for two nozzle sets (the first and the second nozzle sets), as in the case shown in FIG. 16.

The nozzle set determination unit 305a firstly generates a nozzle set table in which the two component groups S (100, 1) and M(20, 1) shown in FIG. 20A arranged as an initial state.

The nozzle set determination unit 305a then rearranges these two component groups by dividing them by the initial task number $X_{11}$ mentioned above as shown in the nozzle set table in FIG. 20B. To be more precise, the two component groups are divided by the initial task number for the first nozzle set $X_{11}$ (=43) and rearranged in descending order of the number of component groups for each nozzle type (here, in order of S(43, 1), S(43, 1), S(14, 0), M(43, 1), M(43, 1), M(34, 0)) in the first and second rows in the nozzle set table. It should be noted here that a flag C, indicating nozzle resource condition, under which the numbers of S-typed pickup nozzles and M-typed pickup nozzles are limited to 2 is respectively defined as follows: the flag C for the first two component groups S (43, C) and S (43, C) as well as M (43, C) and M (43, C) is "1" while the flag C for the remaining component groups such as S (14, C) and M (34, C) is "0".

As shown in FIG. 20C, the component groups which do not comply with the restriction on nozzle resource, namely, the component group M(34, 0) and S(14, 0) having a flag C as "0" in the first row to which the attention is given are shifted to the second row and rearranged without making any spaces.

The nozzle set determination unit 305a then divides the two component groups M(34, 0) and S(14, 0) arranged in the second row by the initial task number $X_{12}$, attaches a flag C according to the restriction on nozzle resource in the same manner as described above, and rearranges the component groups so that the component groups having a flag C as "0" are located in the third row as shown in the nozzle set table in FIG. 20D. To be more specific, the two component groups M(34, 0) and S(14, 0) are firstly divided by the initial task number for the second nozzle set $X_{12}$ ("1") and the component groups are arranged in the second row and then to the third row in an order of M (1, 1), M (1, 1), S (1, 1), S (1, 1), M (32, 0) and S (12, 0). This is operated by setting the flags C of the first two component groups as "1" and setting the flags C of the remaining component groups as "0", for both types of S and M, after arranging them in descending order of the number of component groups.

The nozzle set determination unit 305a judges that the task number ($X_{11}$=43, $X_{12}$=1) is not a feasible solution from the fact that all the component groups cannot be arranged in two rows in the nozzle set table and repeats the increment of the task number and the examination of the feasibility. Namely, the following processing will be repeated until a feasible solution is searched out: incrementing the task number $X_{11}$ of the nozzle set having fewer "empty head" (here, the first and second nozzle sets have the same number of "empty head," therefore, the first nozzle set with the smallest number) by 1; and examining the task number ($X_{11}$=44, $X_{12}$=1) in the same manner (FIGS. 20B-20D).

Assuming here that the increment of the task number $X_{11}$ is repeated and reached the examination of the task number ($X_{11}$=59, $X_{12}$=1). The nozzle set determination 305a divides two component groups S (100, 1) and M (120, 1) by the task number $X_{11}$ and rearranges them as shown in the nozzle set table in FIG. 20E. To be more precise, the two component groups are divided by the task number for the first nozzle set $X_{11}$ (=59) and are arranged in descending order of the number of component groups (here, in an order of S (59, 1), S (41, 1), M (59, 1), M (59, 1), M (2, 0)) for each nozzle type in the first row of the nozzle set table.

As shown in FIG. 20F, the component groups which do not comply with the restriction on nozzle resource, that is, the component group M (2, 0) of which the flag C is "0" in the first row, to which the attention is given, is shifted to the second row.

The nozzle set determination unit 305a then divides the component group M (2, 0) arranged in the second row by the initial task number $X_{12}$, attaches the flag C according to the restriction on nozzle resource in the same manner as described above, and arranges the component groups as shown in the nozzle set table in FIG. 20G. To be more specific, the component group M(2, 0) is divided by the task number for the second nozzle set $X_{12}$ ("1") and is arranged in the order of M (1, 1) and M (1,1) in the second row by setting the flag C of the first two component groups for the type M as "1" after having arranged them in descending order of the number of component groups.

The nozzle set determination unit 305a judges that the task number ($X_{11}$=59, $X_{12}$=1) is a feasible solution since all the components can be arranged in two rows in the nozzle set table. Subsequently, the decrement of the task number and the examination of the feasibility are performed with the same basic procedure as used for incrementing the task number. Namely, it is possible to determine the nozzle set for which the restriction on nozzle resource is taken into consideration by adding procedures (1) and (2) described above to the procedure used in the case which does not take the restriction into consideration.

Thus, it is possible to determine the nozzle set for which the constraint on nozzle resource is taken into account as well as the total task number, when nozzle interchange time N is 1. It should be noted that in the case in which there is the restriction on nozzle resource, a combination of a nozzle interchange time and a total task number is determined and the combination having the smallest evaluated value calculated based on the evaluation function is determined as the optimal nozzle set from among the specified combinations as in the case where there is no restrictions on nozzle resource.

The following shows the results of examining an algorithm that determines a nozzle set for various boards (various component sets) performed by the nozzle set determination unit 305a.

FIGS. 21 and 22 are diagrams showing the nozzle set tables obtained by using an IP solver (section where "strict solution" is indicated on the right) and nozzle set tables obtained by using the algorithm according to the present embodiment (section where "embodiment" is indicated on the right) for various boards (various component sets). It should be noted that an IP solver is a general purpose program for solving optimization issues formulated as integer planning issues, taking time.

FIGS. 21A-21D are diagrams showing the optimal solutions searched out for various boards. In FIG. 21A, a board has 224 components of type 1 and 2 components of type 2 while in FIG. 21B, a board has 101 components of type 1, 32 components of type 2, 4 components of type 3, 18 components of type 4 and 2 components of type 5. In FIG. 21C, a board has 50 components of type 1 and 167 components of type 2 while in FIG. 21D, a board has 5 components of type 1, 34 components of type 2, 2 components of type 3 and 2 components of type 4. FIGS. 21A-21D respectively shows a solution that is searched out when nozzle set number n is "1".

FIGS. 22A-22D are diagrams showing the solutions searched out for a board having 50 components of type 1, 10 components of type 2, 650 components of type 3, 50 components of type 4, 50 components of type 5, 200 components of type 6, 20 components of type 7, 215 components of type 8 and 15 components of type 9. FIGS. 21A-21D show the solutions for the cases in which the nozzle set number n is respectively 1, 2, 3 and 4.

As is obvious from FIGS. 21 and 22, according to the algorithm used in the present embodiment, a solution which corresponds or almost corresponds to a strict solution is searched out. As for the calculation time (not shown in the diagram, though) with the use of a versatile personal computer, it took more than 10 minutes for some boards in the case of using the IP solver, whereas the calculation is made within a second for any board in the case of using the algorithm used in the present embodiment. Based on this, it is obvious that an optimal solution that is a strict solution or almost a strict solution can be obtained with extremely high speed using the algorithm according to the present embodiment.

It is noted here that, in the above embodiment, a method of searching the task number by incrementing or decrementing the minimum task number $X_{min}$ by 1 in consideration of a frequency of "empty head" when the nozzle interchange time N is 1 or more is introduced. The present invention, however, is not limited to such search method. For example, all the possible combinations for the number of tasks can be searched out and a round-robin search method of determining the combination that generates the smallest total task number as an optimal solution out of them can be employed. However, the following combinations can be excluded from the search: a combination for which the search is obviously not necessary; and a combination for which the search turns out to be unnecessary since a feasible solution is discovered.

Figure 23:
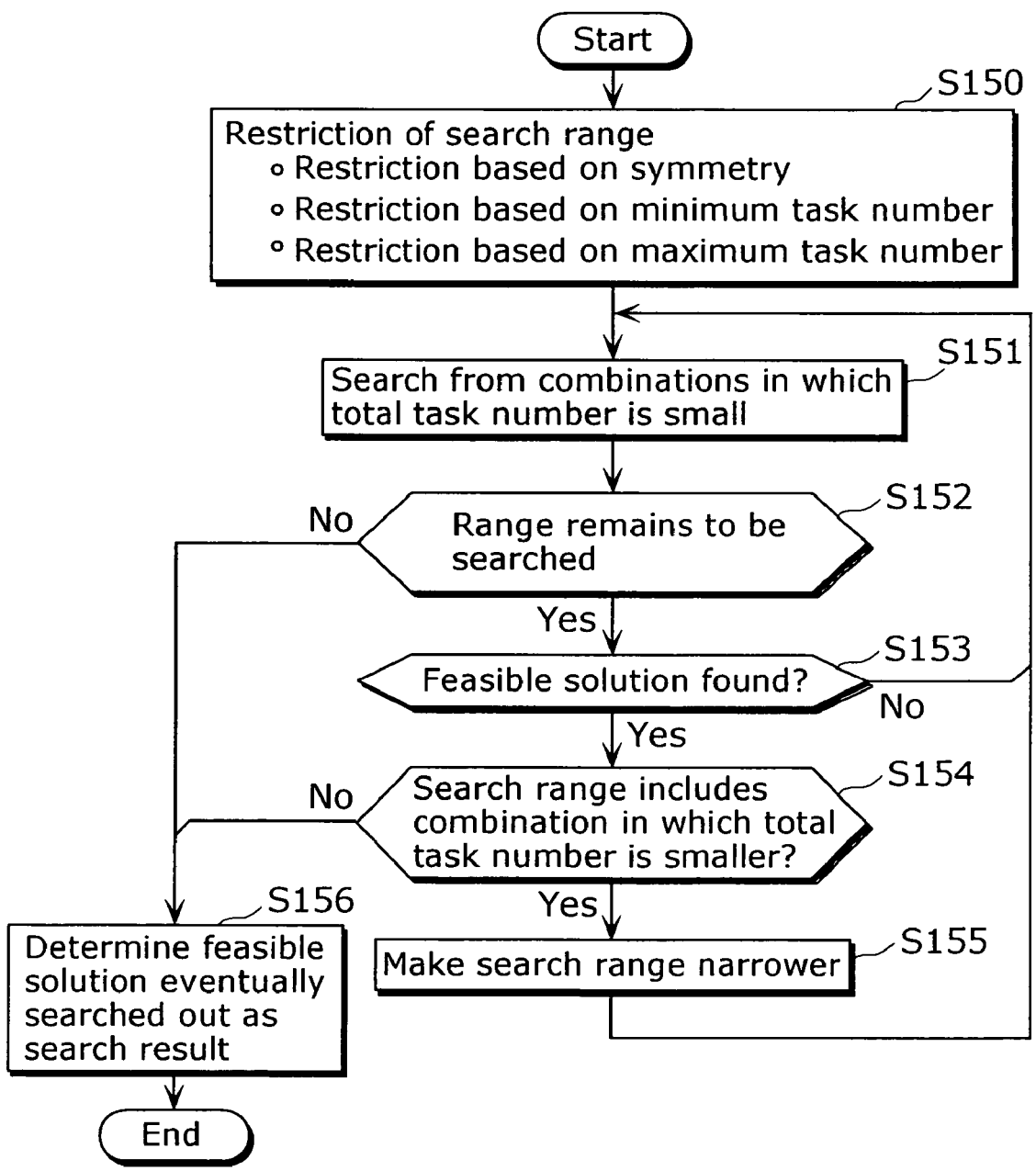
FIG. 23 is a flowchart showing a procedure of determining the task number using a round-robin search method.
Figure 24:
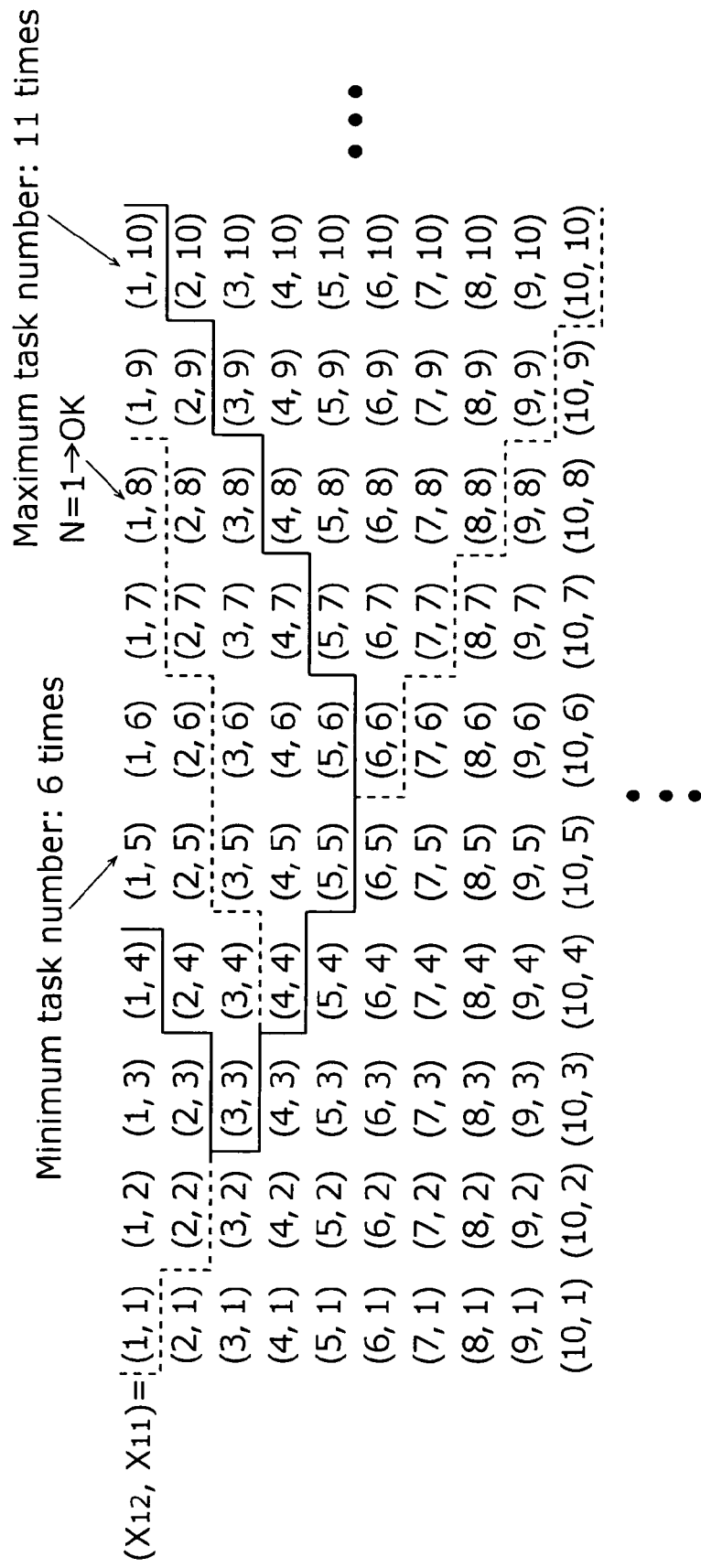
FIG. 24 is a diagram showing an example of the round-robin search method.

FIG. 23 is a flowchart showing the procedure of determining the task number using such round-robin search method. FIG. 24 is a diagram showing a specific example. FIG. 24 shows all the possible combinations for the task number ($X_{12}$, $X_{11}$) when nozzle interchanging time N is 1, presupposing that the number of components is 60 (including 11 of type 1, 11 of type 2, 11 of type 3, 10 of type 4 and 9 of type 5 and 8 of type 6) and the number of heads on the line gang pickup head is 10. For example, a combination (1, 2) means that two tasks are executed using the first nozzle set and a single task is executed using the second nozzle set.

The round-robin search method restricts a search range for every combination (S150). To be more precise, the restriction is set based on symmetry in task numbers. For example, for the combinations (1, 2) and (2, 1), either of them needs to be searched out. Therefore, for example, the search range can be limited to the combination ($X_{12}$, $X_{11}$) which satisfies $X_{12} \leq X_{11}$ (Condition 1).

Then, the above search range is limited further based on minimum task number. In this example, the minimum task number is 60/10=6, namely, the search range can be limited to the combination ($X_{12}$, $X_{11}$) which satisfies $X_{11}+X_{12} \geq 6$ (Condition 2).

Furthermore, the above search range is limited based on maximum task number. In this example, the maximum task number (task number when types of nozzle set 1-6 are used) is 11, therefore, the search range is limited to the combination ($X_{12}$, $X_{11}$) which satisfies $X_{11}+X_{12} \leq 11$ (Condition 3). FIG. 24 shows the search range satisfying the above three conditions 1-3 indicated in an area in full line.

Then, each of the combinations searched out in the search range limited in the above steps is examined sequentially whether or not it is a feasible solution downward and rightward through the table (S151). More precisely, the component division and the arrangement of component groups as shown in FIG. 17C are attempted firstly for the combination (1, 5) in FIG. 24. When all the components are not arranged within two rows of the nozzle set table, it is judged as not feasible, and then, the next combination (1, 6) is examined in the same manner.

Here, when the search for all the combinations within the above search range is completed (No in S152), the feasible solution searched out lastly is determined as a final result (a nozzle set to be obtained) and the processing is terminated (S156).

When a feasible solution is found while the search range to be examined sill remains (Yes in S153), in the case in which the search range includes the combination whose total task number is smaller remains (Yes in S154), the search range is restricted to the range as such (S155) and the search is repeated (S151). When there remains no such search range including the combination whose total task number is smaller (No in S154), the feasible solution that is eventually searched out is determined as a final result (a nozzle set to be obtained) and the processing is terminated (S156).

For example, when it is judged that the combination (1, 8) is a feasible solution, the search range is restricted to the combination in which the total task number is to 9 or smaller. Consequently, the next search is targeted not on the combination (1, 9) but (2, 4), (2, 5), . . . . Similarly, when the combination (2, 6) turns out to be a feasible solution, only the combination in which the total task number is smaller than or equal to 8 such as (3, 3) and (3, 4) are targeted for search. Here, when the combination (3, 4) turns out to be a feasible solution, this is determined as a final optimal solution, that is, an optimal nozzle set (the total task number is 7) when nozzle interchange time N is 1, since the search range is examined thoroughly.

Thus, the round-robin search method is advantageous, compared to the method described in FIG. 15, in the respect that the optimal solution (nozzle set and total task number) can be surely obtained because all the possible combinations are examined without fail, although the search time increases as the number of targets for search increases.

It should be noted that FIG. 24 explained above shows the case in which the nozzle interchange time N is 1, that is to say, the task number is two-dimensional. The search, however, can be conducted in the same way even when the nozzle interchange time N is 2 or greater. Namely, only the dimension of the task number and that of the search area increase while the restriction on the search range, and the search method are the same as in the case of using two dimensions.

The nozzle set determination unit 305a may determine the optimal nozzle set not only by using either such round-robin search method or the search method based on the minimum task number, but also by executing one of these two search methods selectively. For instance, a mixed method of using the search method based on the minimum task number when the search time is to be prioritized and using the round-robin search method when the accuracy of the optimization is to be prioritized may be applied.

The following describes the detailed operation of the nozzle pattern determination unit 305b in the optimization program storing unit 305 shown in FIG. 6.

The nozzle pattern determination unit 305b determines, for at least one nozzle set determined by the nozzle set determination unit 305a, head positions of the various pickup nozzles constituting each nozzle set so that the frequency of interchanging the pickup nozzles when mounting components (i.e., the number of pickup nozzles to be interchanged) is reduced, and also determines a nozzle pattern by determining a mounting order for each of the nozzle sets. In more detail, for example, the nozzle pattern is determined under the following rules.

(1) The operation is carried out in sequence for the tasks belonging to the same nozzle set. Namely, the operation is not performed for the task that belongs to other nozzle sets during the operation.

(2) For 2 or more nozzle sets, a nozzle pattern is determined for all the permutations being made up of these nozzle sets (except for the permutation which has a symmetrical order of numbers), using the procedure described below. For example, in the case of three types of nozzle sets 1, 2, and 3, nozzle patterns are determined only for the permutations of the three types, (1, 2, 3), (1, 3, 2) and (2, 1, 3) so that other permutations having a symmetric order in numbers such as (2, 3, 1), (3, 1, 2) and (3, 2, 1) are excluded. This is because such permutations have the same number of nozzle interchange time at the time of mounting components. Therefore, it is enough to examine one of the pairs for searching an optimal solution.

(2-i) When arranging the nozzle sets, the head positions of the pickup nozzles constituting the nozzle set are determined so that the pickup nozzle of the same type is located in the same head position as is located for the nozzle set previously arranged as many as possible. This is because in the case in which the pickup nozzle of the same type is located in the same head position when the nozzle sets are interchanged at the time of mounting components, there is no need to interchange the nozzle sets for the pickup nozzle located in the same head position, and thus, the time taken for nozzle interchange can be reduced.

(2-ii) A permutation, in which the number of pickup nozzles to be interchanged at the time of mounting components is the smallest, is determined as an optimal nozzle pattern out of all the permutations for the nozzle set.

FIGS. 25A-25D are diagrams showing a specific example explaining the procedure used for determining the nozzle pattern by the nozzle pattern determination unit 305b. Suppose here that the nozzle set determination unit 305a determines the nozzle sets 1-3 shown in FIG. 25A and the nozzle pattern determination unit 305b determines accordingly an optimal nozzle pattern.

The nozzle pattern determination unit 305b firstly specifies three permutations (the permutation shown as FIGS. 25B-25D), except for the permutations having the symmetric order, as the permutations for the three types of nozzle sets 1-3. Then, the nozzle pattern determination unit 305b determines the head positions of the pickup nozzles so that the number of the pickup nozzles to be interchanged at the time of mounting components is fewer for the respective three permutations.

For example, in the case of the permutations shown in FIG. 25B (of nozzle sets 1, 2 and 3), the nozzle pattern determination 305b firstly arranges the nozzle set 1 (S, S, S, S) and then the nozzle set 2 (S, S, M, M). When arranging the nozzle set 2, the head positions of the pickup nozzles are determined so that the pickup nozzle of the same type is located in the same head position as arranged for the nozzle set 1 as many cases as possible. However, the number of interchanging nozzles to be generated is 2 no matter at which head position the pickup nozzle is arranged (the nozzle interchange is necessary at the time of interchanging nozzle sets for two M-typed pickup nozzles surrounded by dot lines in the diagram) so that the nozzles are arranged in the head positions of the nozzle set 2 shown in FIG. 25A.

Similarly, the nozzle set 3 (M, M, M, L) is arranged. In this case, the head positions of the pickup nozzles are arranged as (M, L, M, M) so that the pickup nozzle of the same type is located in the same head position as for the nozzle set 2 (S, S, M, M) previously arranged, as many cases as possible. Thus, the number of nozzles to be interchanged is 2, the smallest (shown in dot line) when nozzle interchanging from the nozzle set 2 to the nozzle set 3. In this way, the nozzle pattern at the time of mounting components is determined. The nozzle pattern of the first permutation shown in FIG. 25B, namely, for the first 6 tasks, the nozzle pattern of (S, S, S, S) is used; the nozzle pattern (S, S, M, M) is used for the next one task; and the nozzle pattern (M, L, M, M) is used for the last one task. The total number of interchanging nozzles, in this case, is 4.

Similarly, the nozzle pattern and the nozzle interchange time are determined for other two permutations (FIGS. 25C and 25D) by determining the head positions of the pickup nozzles. The nozzle pattern determination unit 305b lastly determines the nozzle pattern with fewer interchange time (here, FIG. 25B) as the optimal nozzle pattern, out of the three types of permutations. Thus, the nozzle pattern in which the nozzle interchange time is the smallest at the time of mounting components is determined, and the arrangement of tasks (nozzle pattern) enabling the component mounting within a shorter time is thus searched out.

It should be noted that when the nozzle interchange time for the permutation surpasses the already-calculated smallest nozzle interchange time in the process of determining the head positions of the pickup nozzles, the processing may be terminated at that time. For instance, at the time of arranging the nozzle set 3 shown in FIG. 25C, the interchange time for the permutation is 4 which equals to the interchange time of the nozzle pattern shown in FIG. 25B that is already determined so that the processing for FIG. 25C may be terminated at that time.

The nozzle pattern determination unit 305b having determined the nozzle pattern, then determines an arrangement of nozzles at the nozzle station 119 based on the determined nozzle pattern. It should be noted here that: (1) the nozzle station 119 is a table having a space for arranging the pickup nozzles in the place of row "n" and column "m"; (2) it is possible to arrange any type of pickup nozzles in any n×m number of places; (3) each head of the line gang pickup head 112 in any n×m number of places can be interchanged; (4) plural pickup nozzles of the line gang pickup head 112 can be interchanged simultaneously as the pickup nozzles at the nozzle station 119 are arranged with the same pitch as the head pitch of the line gang pickup head 112; and (5) the pickup nozzles are to be returned to the original places.

More precisely, the nozzle pattern determination unit 305b determines an arrangement of the nozzles at the nozzle station using the following procedure.

Figure 26B:
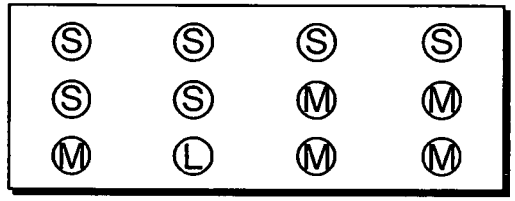

(1) It is determined with the same nozzle arrangement as used in the nozzle pattern determined in the above procedure (the nozzle pattern not in consideration of task number). To be more specific, when the nozzle pattern is determined to be the one shown in FIG. 26A, the nozzle arrangement is determined to be the one shown in FIG. 26B. Namely, the same nozzle arrangement as the one that does not take task number into consideration for the nozzle pattern shown in FIG. 26A (the values indicated in "Task No." in the table are ignored and the type of nozzle sets is given attentions) is determined.

Figure 26C:
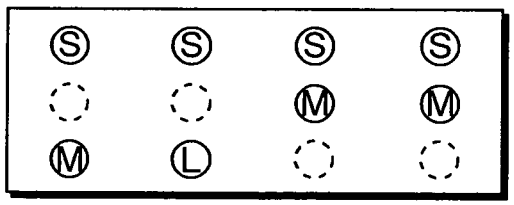

(2) Here, when the number of pickup nozzles is restricted, the pickup nozzles of the same type arranged in the same head position are excluded as shown in FIG. 26C.

Figure 26D:
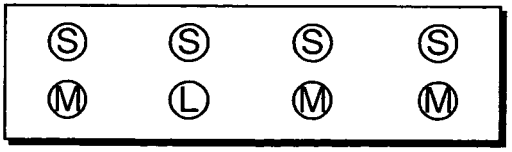

(3) Moreover, when there is a restriction on the space at the nozzle station 119, the empty space generated in the above step (2) is filled up by shifting the position of arrangement as shown in FIG. 26D.

Thus, the nozzle pattern determination unit 305b determines the nozzle arrangement at the nozzle station 119 to be the one similar to the nozzle pattern decided previously as much as possible. Therefore, the time taken for the nozzle interchange is reduced.

Next, the detailed operation of the Z-axis arrangement/mounting order optimization unit 305c will be explained.

The Z-axis arrangement/mounting order optimization unit 305c is a processing unit of determining the Z-axis arrangement and the mounting order in which a total mounting time is the smallest while keeping the nozzle pattern and the nozzle arrangement at the nozzle station determined by the nozzle pattern determination unit 305b. The Z-axis arrangement/mounting order optimization unit 305c determines the mounting order by grossly classifying the components to be mounted into "small components" and "general components" and respectively applying different optimization algorithm.

It should be noted that a small component is a chip component sized below 3.3 mm such as a resistance and a condenser, and every width of its taping is 8 mm, and can be mounted on the line gang pickup head 112 (for instance, pick up simultaneously ten components). Among many of the boards, which are recently produced, most of them are small components (e.g., more than 90%). A general component is what is left after excluding the above small components, that is, a big deformed component such as a connector, an IC, or the like. It might be provided on the tray or might need a special nozzle so that many parameters are to be considered during the optimization.

The Z-axis arrangement/mounting order optimization unit 305c takes the characteristics of the above small and general components into account. For the small components, the mounting order is determined using the algorithm that can generate the task of mounting the components on the line gang pickup head 112. Namely, the algorithm that can generate the task of picking up ten components at the same time as many as possible so as to perform optimization processing with high speed (referred to as "cut down process" to be mentioned later). For the general components, the mounting order is determined using the algorithm that is flexible for searching the optimal state by repeating the evaluation while varying the state of task (one of possible mounting orders).

FIGS. 27-32 are diagrams showing specific examples explaining the optimization procedure for the small components based on "cut down process" performed by the Z-axis arrangement/mounting order optimization unit 305c.

This process uses a component histogram where components are arranged in descending order of the number of components to be mounted along the Z-axis, and utilizes the above pickup pattern generating method only where it is not possible for the line gang pickup head to simultaneously pick up the maximum (L) number of components. This method is also made up of two main steps, a first step and a second step. Note here that a component histogram is a histogram produced with the component feeders 114 (component tapes) on the horizontal axis (Z-axis) and the number of components to be mounted on the vertical axis. A pickup pattern is a diagram showing more than one task group to be picked up simultaneously by the line gang pickup head 112 when the vertical axis indicates an order of components picked up by the line gang pickup head 112 and the horizontal axis indicates an arrangement (Z-axis) of component feeders (tapes) 114. Each component to be picked up (a mounting point) is indicated by a unit of rectangular (square or rectangular).

In the first step of the cut down process, the Z-axis arrangement/mounting order optimization unit 305c removes ("cut down") tasks composed of L consecutive components repeatedly from the component histogram.

Figure 27:
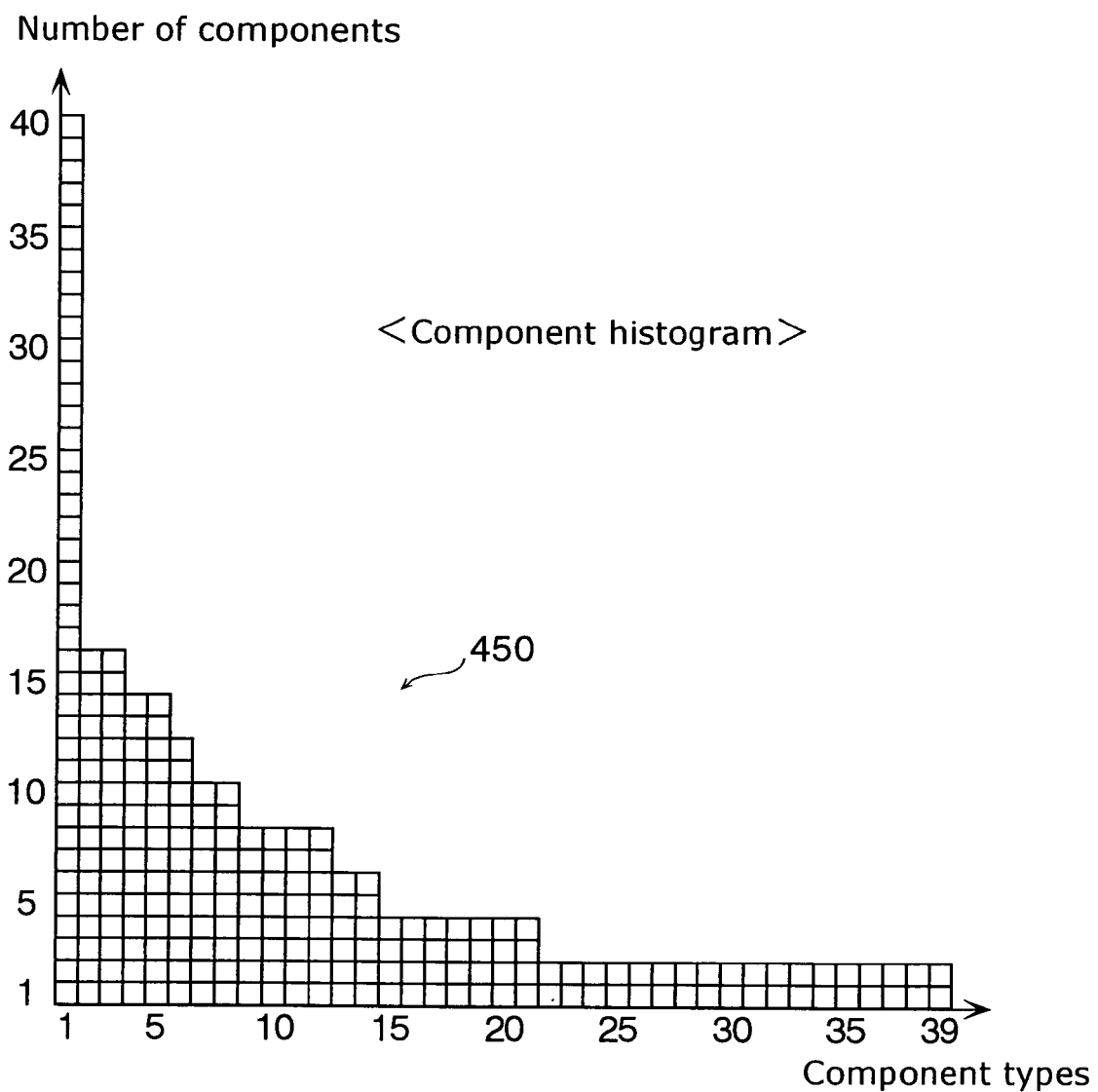
FIG. 27 shows a component histogram for all of the components for which pickup patterns are generated based on the cut down procedure.
Figure 28:
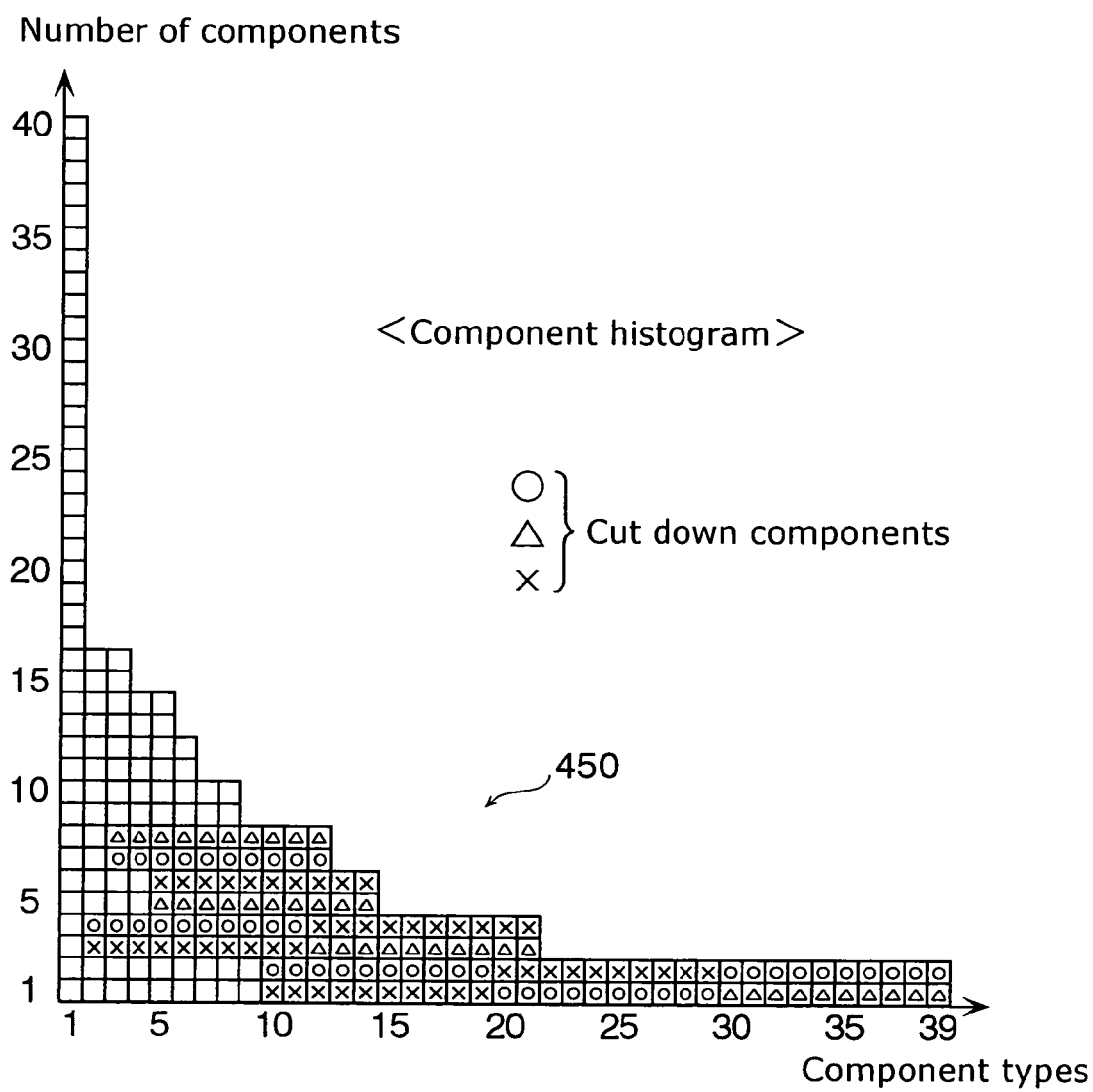
FIG. 28 shows how ten consecutive components are removed at a time (i.e., "cut down") from the component histogram shown in FIG. 27.

FIGS. 27 and 28 show the operation performed in the first step of the present cut down process. FIG. 27 shows a component histogram 450 in which component tapes for all of the components to be mounted have been arranged in descending order of the number of components to be mounted. FIG. 28 shows how L (in the illustrated example, ten) consecutive components are removed at a time (i.e., "cut down") from the component histogram 450 in FIG. 27. The cutting down processing is performed by removing L consecutive components (shown by the sets of ten consecutive circles, triangles or crosses in FIG. 28) from the right side of the component histogram so that component tapes with few components to be mounted are removed first. This is repeated until it is no longer possible to take a remove of L consecutive components.

In the second step of the cut down process, the Z-axis arrangement/mounting order optimization unit 305c generates a diagram from a component histogram made up of the components that remain after cutting down has been performed in the first step.

Figure 29:
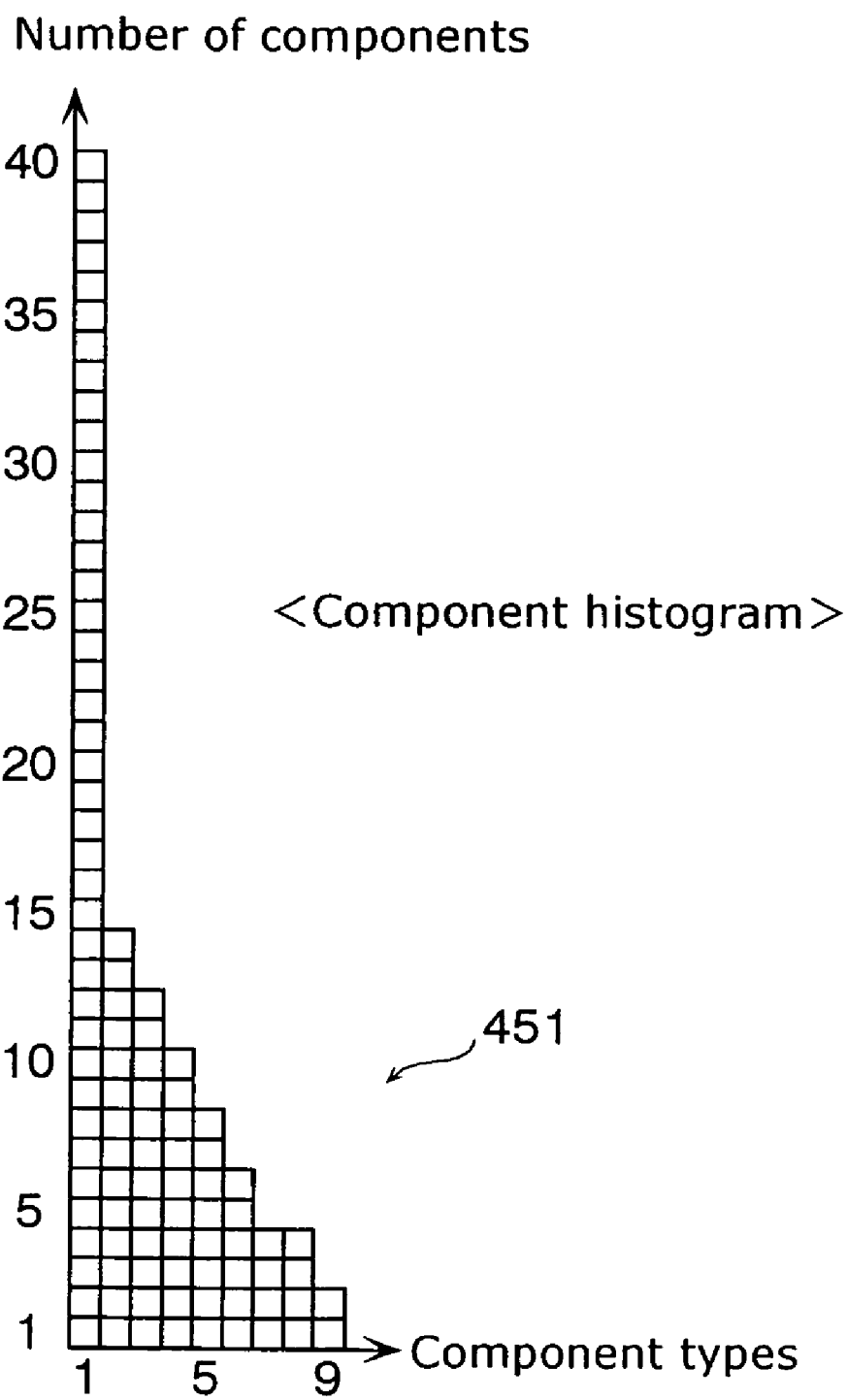
FIG. 29 shows a component histogram for the components that are left over after the cut down process shown in FIG. 28.
Figure 30:
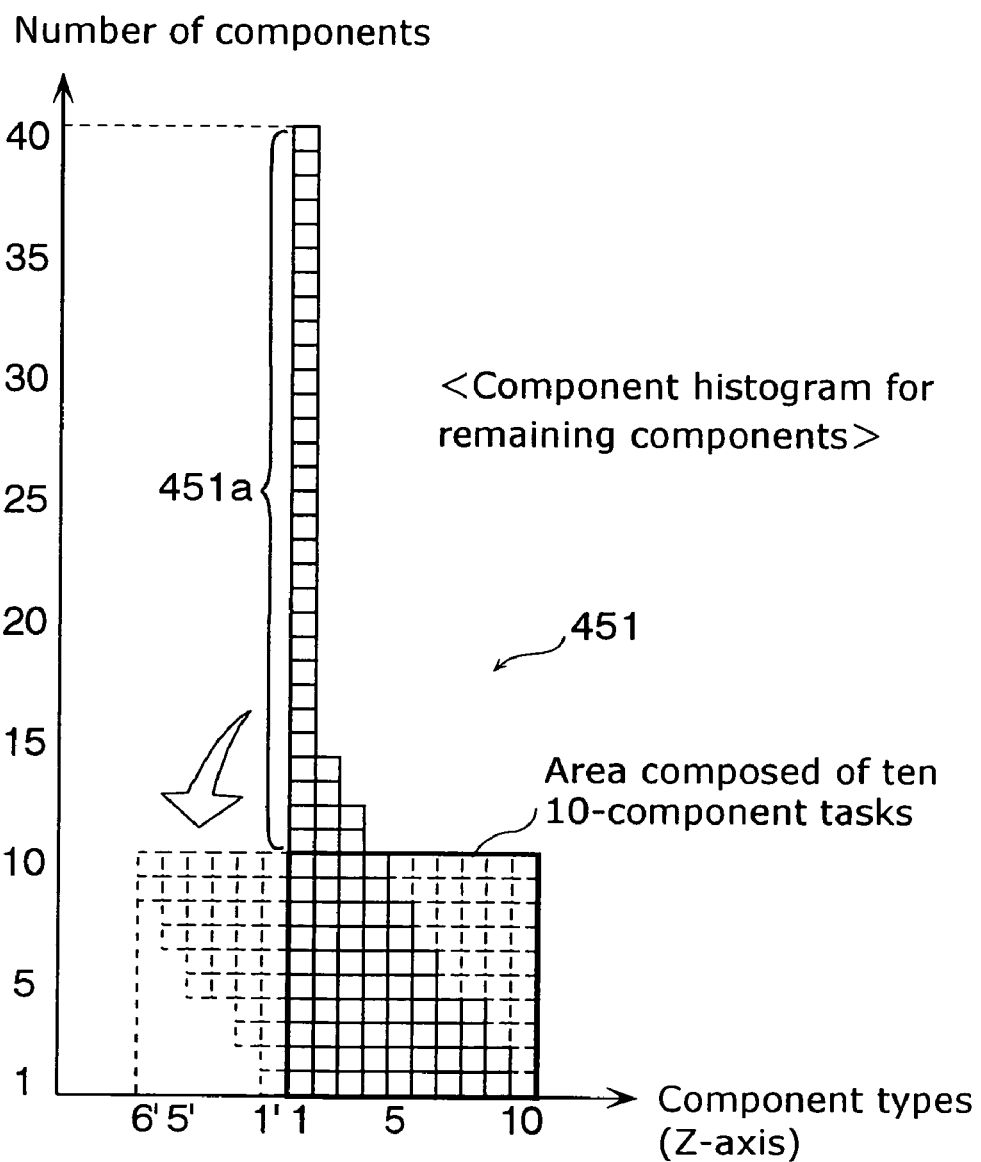
FIG. 30 shows how a diagram is generated from the component histogram shown in FIG. 29 in accordance with the task group generation method.

FIGS. 29 and 30 show how the second step of the cut down process works. FIG. 29 shows a reconstructed component histogram 451 produced by arranging the component tapes, which are left over after the first step of the cut down process has been performed, in descending order of the number of components to be mounted. FIG. 30 shows how a diagram is generated from the reconstructed component histogram 451 in accordance with the task group generating method described earlier. It should be noted that due to the processing in the first step of the cut down process, the width (i.e., the number of component tapes) of the reconstructed component histogram 451 is definitely (L−1) or below.

In more detail, the processing in the second step is composed of the following sub-steps.

(i) The component histogram 451 shown in FIG. 29 is generated for the components left after the cutting down in the first step, and the total number of components to be mounted (in the illustrated example, 100) is calculated.

(ii) The calculated total number of components is divided by L (in the illustrated example, 10) and pickup patterns are generated with the object of setting the number of tasks equal to the result of the division (in the illustrated example, 10).

(iii) The above object is achieved as follows. As shown in FIG. 30, component tapes for which the number of components to be mounted exceeds the calculated number of tasks (10) are identified and the excess number of components 451a (or divided parts of this excess number) are taken and used to supplement the left side of the component histogram 451.

Figure 31:
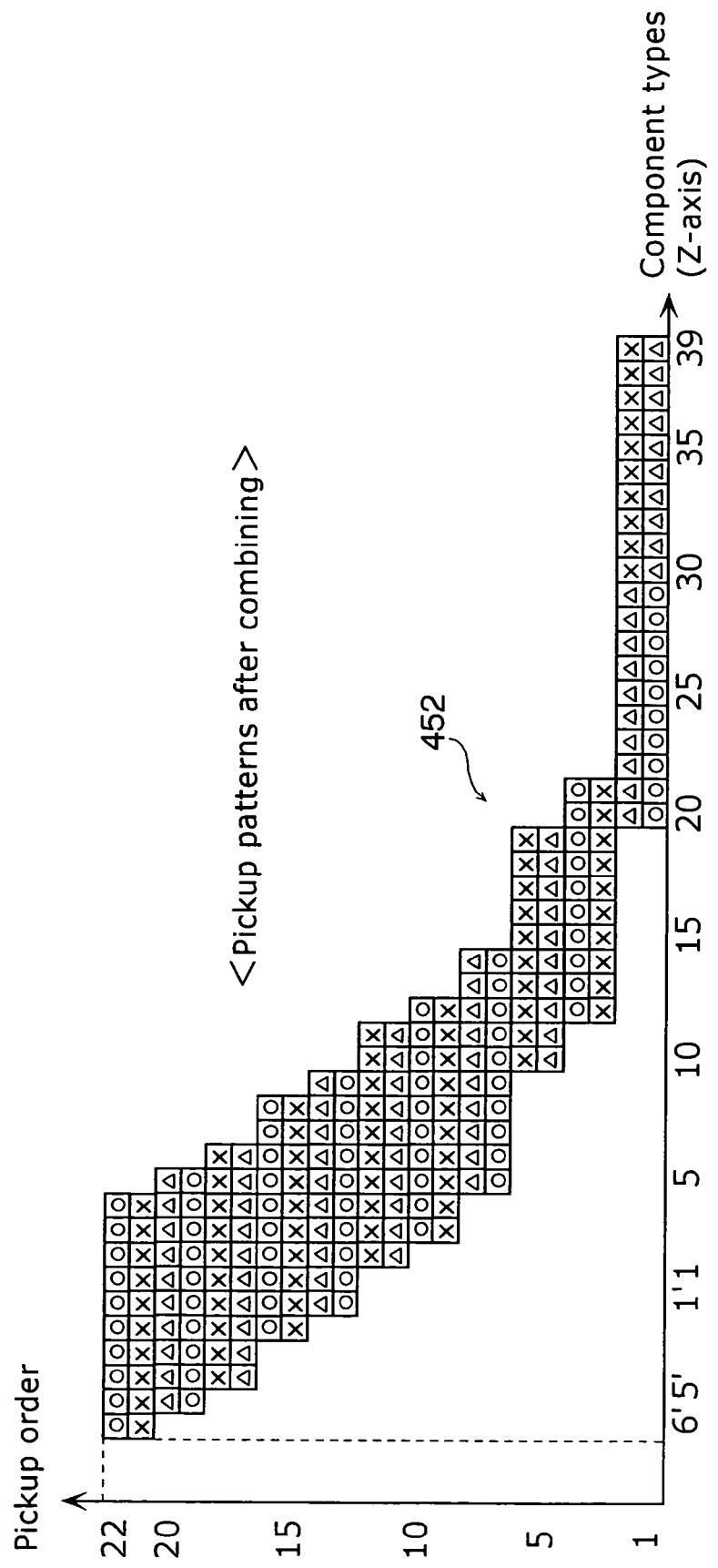
FIG. 31 shows the pickup patterns for component types whose positions on the Z-axis have been determined by the cut down procedure.

FIG. 31 shows the pickup patterns 452 for component tapes whose positions on the Z-axis have been determined by the first and second steps of the cut down process described above. As shown in FIG. 31, all of the components form tasks containing the maximum number (10) of components, so that mounting can be performed with the highest possible pickup efficiency.

Figure 32:
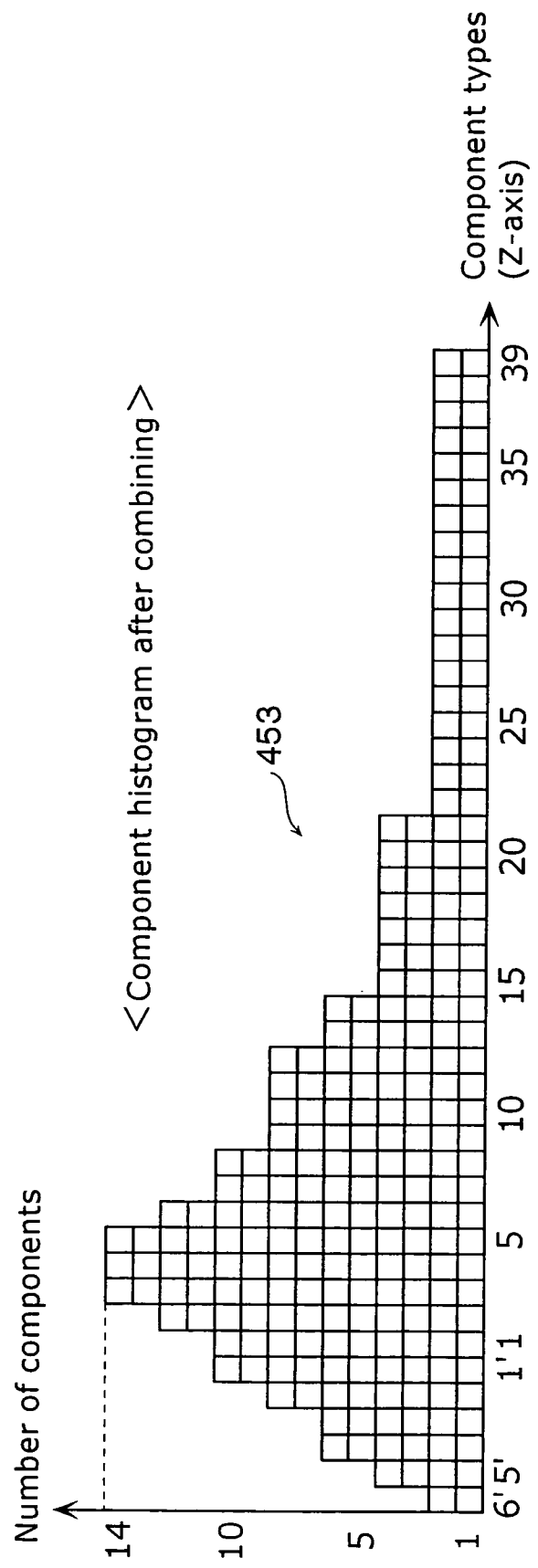
FIG. 32 shows a component histogram (reconstructed without changing the Z-axis) corresponding to the pickup patterns shown in FIG. 31.

FIG. 32 shows a component histogram 453 corresponding to the pickup patterns 452 shown in FIG. 31. This component histogram 453 is reconstructed without changing the positions in the Z-axis. As can be seen from the component histogram 453, the cut down process maintains the tendency for component tapes with large numbers of components to be arranged to the left. This means that the cut down process determines an arrangement of components having considered the movement paths taken by the line gang pickup head 112. These movement paths are such that after picking up components from the right block 115b, the line gang pickup head 112 definitely passes in front of the 2D camera that is arranged to the left of the right block 115b. By minimizing the total distance moved by the line gang pickup head 112, the cut down process produces an arrangement of components that reduces the total tact time. It should be noted that processing that is symmetrical in the Z-axis may be performed for the left block 115a. In other words, component tapes can be arranged in ascending order of components to be mounted and then tasks can be cut down using the procedure described above.

Thus, the Z-axis arrangement/mounting order optimization unit 305c determines the mounting order in units of arrangements (Z-axis) of component tapes and tasks so that efficiency in picking up small components by the line gang pickup head 112 is maximized.

Figure 33A:
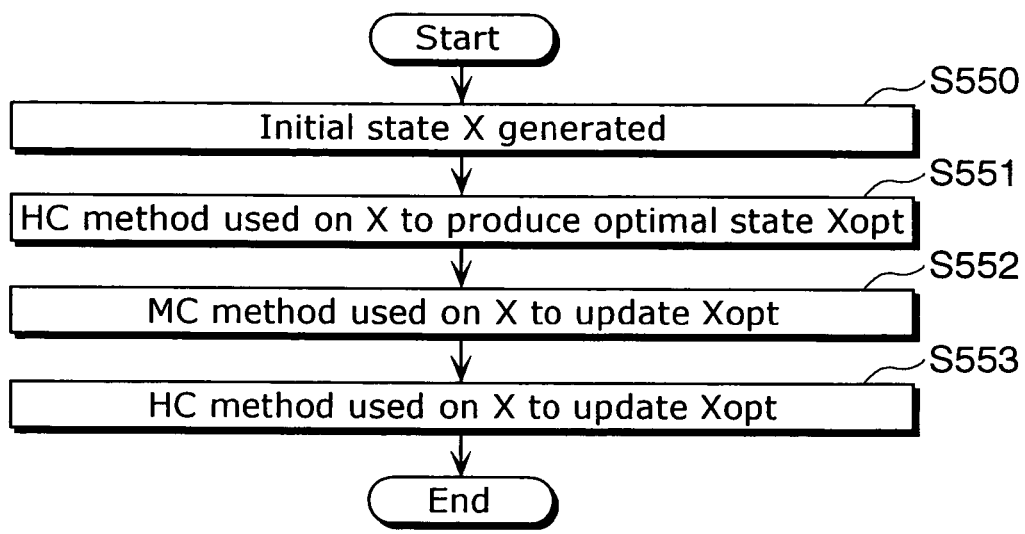
FIG. 33A is a flowchart showing the procedure used when the general component optimization unit optimizes the mounting order of general components.
Figure 33B:
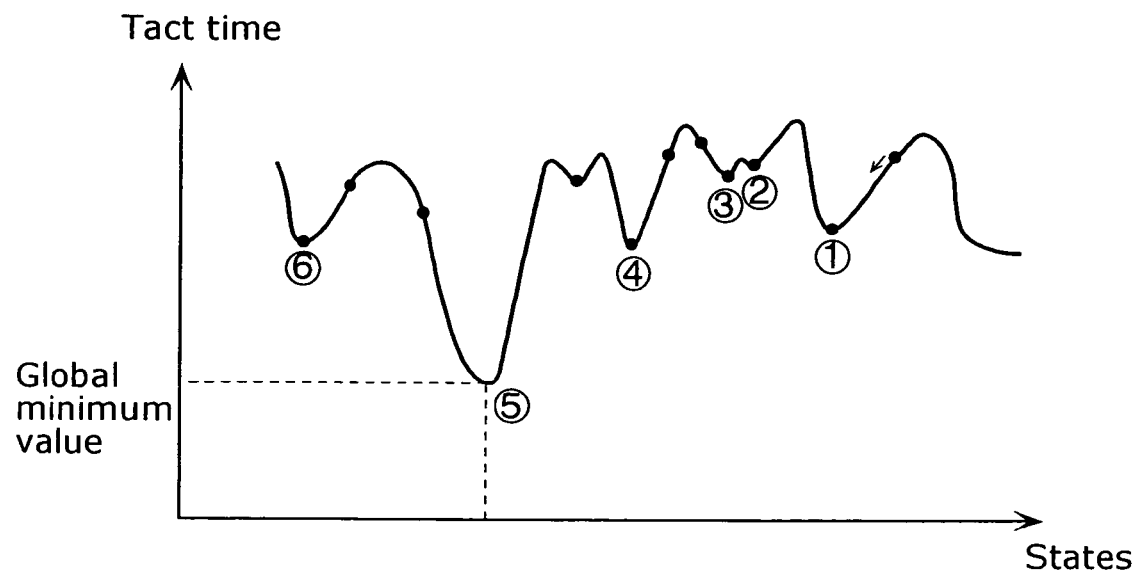
FIG. 33B shows the relationship between states and tact times to illustrate the approach used by this optimization to find the optimal solution.
Figure 34:
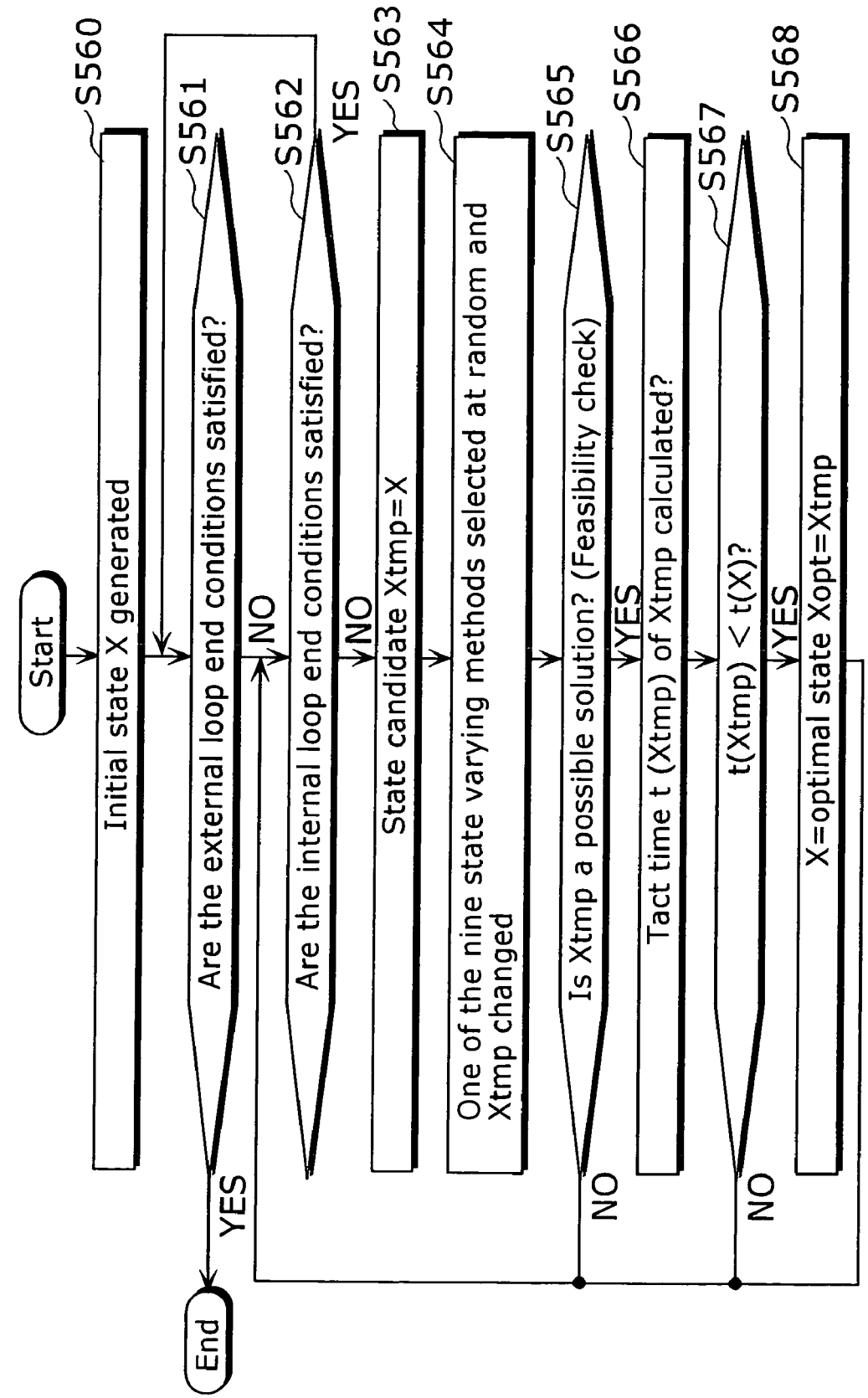
FIG. 34 is a flowchart showing the detailed procedure used when performing optimization according to the hill-climbing method (Steps S551, S553) shown in FIG. 33A.
Figure 35:
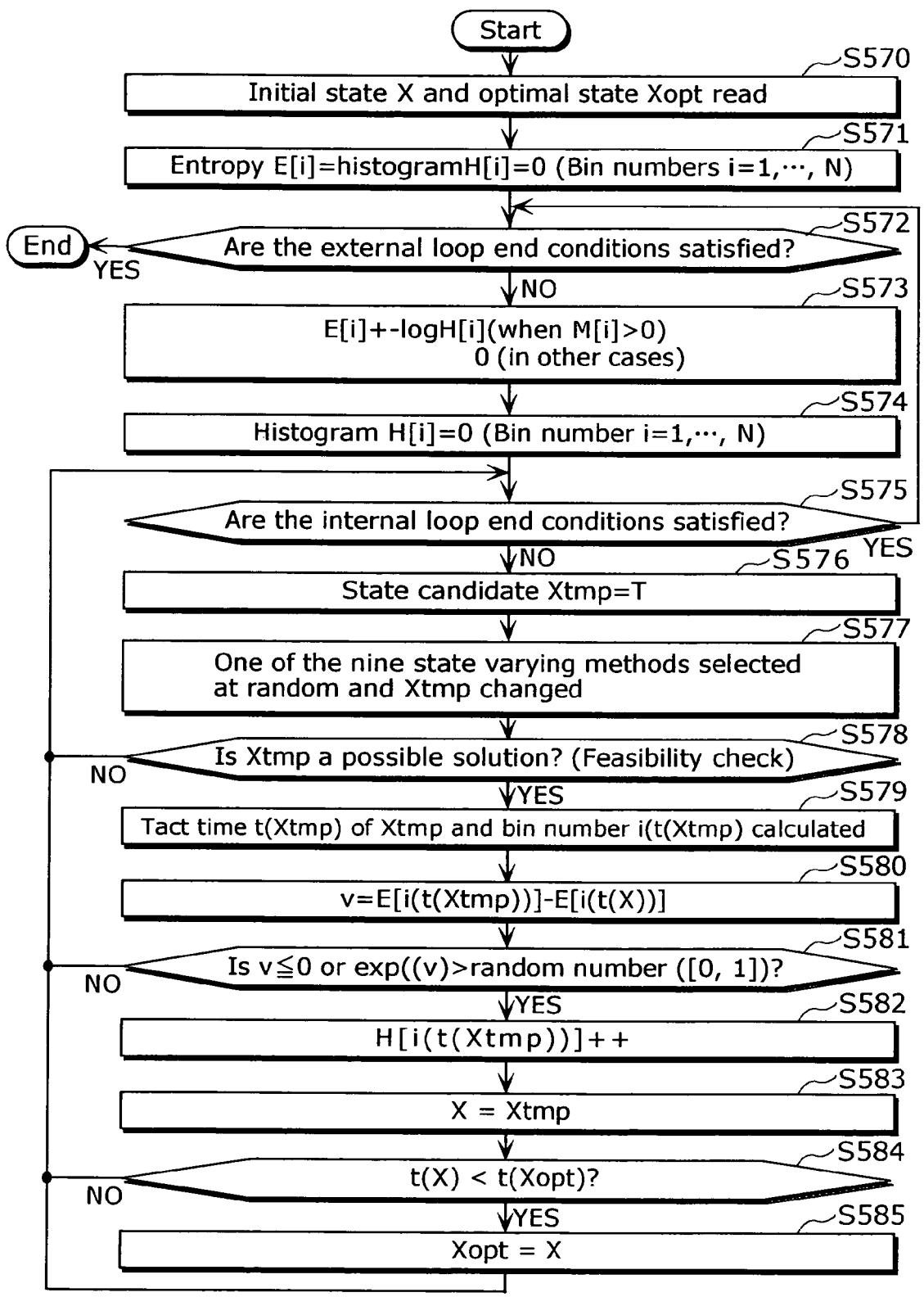
FIG. 35 is a flowchart showing the detailed procedure used when performing optimization according to the multi-canonical method (Step S552) shown in FIG. 33A.

FIGS. 33-35 show the processing for the optimization of general components performed by the Z-axis arrangement/mounting order optimization unit 305c.

FIG. 33A is a flowchart showing the procedure used when the Z-axis arrangement/mounting order optimization unit 305c optimizes the mounting order of general components. FIG. 33B is used to show the approach used by this procedure to find the optimal solution and illustrates the tact times for the various states that can be used. It should be noted here that a state is one of the possible orders in mounting the components to be mounted and is represented by the array of the component feeders on the Z-axis and task composition which are parameterized.

As shown in FIG. 33A, the Z-axis arrangement/mounting order optimization unit 305c first generates an initial state X for all of the general components (S550). After this, the Z-axis arrangement/mounting order optimization unit 305c performs optimization on the initial state X according to the hill climbing method, resulting in the calculation of the optimized state Xopt (S551). Next, the Z-axis arrangement/mounting order optimization unit 305c performs optimization on the initial state X according to the multi-canonical method to update the optimized state Xopt calculated in step S551 (S552). Finally, the Z-axis arrangement/mounting order optimization unit 305c performs optimization on the updated optimized state Xopt according to the hill climbing method to further update the optimized state Xopt calculated in step S552 (S553).

In this way, optimization according to the multi-canonical method that searches for an optimal solution from a global viewpoint (S552) is performed at a midpoint of the execution of optimization according to the hill climbing method that definitely finds a locally optimal solution (S551, S553). As a result, cases where the search for the optimal state ends with a state that is optimal on a local level but sub-optimal on a global level (state ① shown in FIG. 33B, for example) can be avoided, enabling a state that is optimal on a global level (state ⑤ in FIG. 33B) to be found.

FIG. 34 is a flowchart showing the detailed procedure used when performing optimization according to the hill-climbing method shown in FIG. 33A (S551, S553). After generating this initial state X (S560), the Z-axis arrangement/mounting order optimization unit 305c repeatedly performs the inner loop (S562 to S568) until the outer loop end conditions are satisfied (S561). Here, the expression "outer loop end conditions" refers to conditions for ensuring that the optimal solution is indeed optimal, with these conditions changing every type of parameter that can affect the state. The expression "inner loop end conditions" refers to conditions that change (i.e., search) one type of parameter within a predetermined range.

During the inner loop, the Z-axis arrangement/mounting order optimization unit 305c first generates the state candidate Xtmp using a state variation selected out of nine types of state variation (S563, S564). When this state candidate Xtmp has feasibility (i.e., can potentially be used) (S565) and has a tact time that is shorter than the immediately preceding state (S566, S567), the Z-axis arrangement/mounting order optimization unit 305c updates the state and tact time using this state candidate Xtmp and its tact time (S568). In this way, the inner loop definitely finds states that are optimal on a local level.

FIG. 35 is a flowchart showing the detailed procedure used when performing optimization according to the multi-canonical method (S552) shown in FIG. 33A. In FIG. 35, a "bin number" is a number showing a section ("bin") produced by equally dividing the horizontal axis shown in FIG. 33B (all of the possible states) by N. Histogram H[i] meanwhile is a variable storing the total number of times a state candidate Xtmp belonging to the bin with the bin number [i] has been selected (S576, S577) and it has been judged that the state candidate Xtmp is feasible (S578) and reduces entropy (S579 to S581).

As can be understood by comparing the flowchart in FIG. 35 with the flowchart for the hill-climbing method that is shown in FIG. 34, the two methods are similar in repeating a series of processes where a state candidate Xtmp is generated from the initial state X and then it is judged whether this state candidate Xtmp should be accepted. The difference between the methods lies in the method used to judge whether the state candidate Xtmp should be accepted. In the hill-climbing method shown in FIG. 34, a definite judgment is made to accept the state candidate Xtmp if its tact time is lower than the tact time of the state X. However, in the multi-canonical method shown in FIG. 35, the entropy exhibited by the tact time is examined and a probability-based judgment is made whether to accept the state candidate Xtmp (S580 to S582).

It should be noted here that plural state variations to be selected by the Z-axis arrangement/mounting order optimization unit 305c (FIG. 34 in S564 and S577 in FIG. 35) are as follows: (1) two mounting points in the different tasks are interchanged; (2) the mounting orders of two mounting points in the same task are interchanged; and (3) two component tapes are interchanged, or the like. The checking of feasibility performed by the Z-axis arrangement/mounting order optimization unit 305c (S565 in FIG. 34, S578 in FIG. 35) is to confirm that there occurs no interferences between the components when the components are picked up by the line gang pickup head 112 in each task, or the like.

Thus, the Z-axis arrangement/mounting order optimization unit 305c does not only optimizes the general components on a local level but also optimizes a probability-based search so that the problem of calculating a local minimum as an optimal solution can be avoided.

Thus, according to the optimization apparatus 300a used in the present embodiment, firstly, the nozzle set determination unit 305a determines a nozzle set, and then, the nozzle pattern determination unit 305b determines a nozzle pattern, and lastly, the Z-axis arrangement/mounting order optimization unit 305c determines a Z-axis arrangement and a mounting order for the mounting points (task order) in order to find an optimal order of mounting components. Accordingly, the mounting order is determined so as to shorten firstly the nozzle interchange time which makes up a great part of the total mounting time, therefore, the mounting time as a whole can be greatly reduced.

It should be noted here that the present embodiment shows that a single component is picked up by each head composing the line gang pickup head (the number of components to be picked up by the pickup nozzle is 1). The present invention, however, is not limited to this case and can be applied to the case in which the number of components to be picked up by the pickup nozzle is more than 2. Namely, when a large sized component is picked up by the line gang pickup head, the component occupies the spatial area of the neighboring head and thereby the component cannot be picked up by the neighboring head. The number of components to be picked up by the pickup nozzle can be therefore taken into account depending on the type of component. In more detail, the nozzle set may be searched by setting the flag that cannot be arranged to the neighboring head as in the case of having the restriction on nozzle resource.

Figure 36:
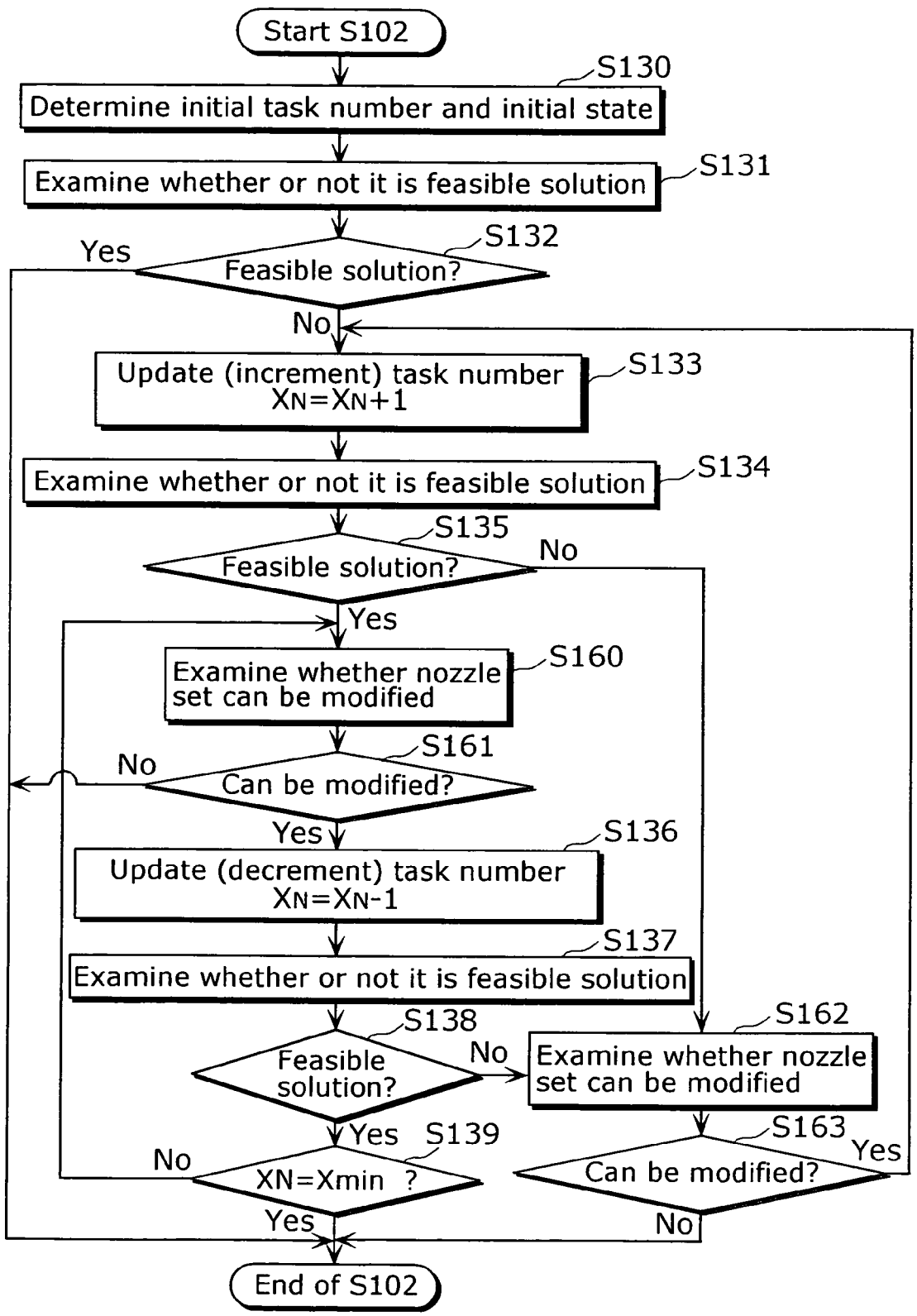
FIG. 36 is a flowchart showing another example of the procedure for specifying the task number N.

In the present embodiment, the nozzle set determination unit 305a defines the task number $X_N$ in the procedure shown in FIG. 15 when the nozzle interchanging time N is 1 or more. The present invention, however, is not limited to such simple procedure. Namely, the task number is incremented when it is not a feasible solution at an initial state, and when it is a feasible solution, whether the task number can be decremented is examined. When the task number cannot be decremented, the processing is terminated. The present invention, however, is not limited to this procedure and new procedure S160-S163 can be added to the procedure shown in FIG. 15, as shown in FIG. 36. According to the procedure shown in FIG. 36, even when the feasible solution is not obtained as a result of decrementing the task number, the process returns to the procedure of incrementing again the task number when there remains the nozzle set to which modifications can be made (i.e., change in the task number) (S162, S163). Namely, the flow is not single as follows: increment in task numbers decrement in task numbers. The flow can be repeated, for instance, increment in task numbers→decrement in task numbers decrement or increment in task numbers. Therefore, the task number can be modified or not is examined even immediately after the task number has been incremented (S160, S161). Here, the expression "not modifiable" is a case in which the following conditions are satisfied.

(1) When the nozzle set whose task number is decremented in updating (i.e., decrement) the previous task number is to be incremented in updating (i.e., increment) the next task number, or vice versa. Namely, it is determined as "not modifiable" when it applies to an indefinite loop in which the task number of the same nozzle set is incremented, decremented and then incremented.

(2) When every possible range is searched, namely, the nozzle set is determined as "not modifiable" for the following cases and the nozzle set is excluded from the target for modification.

(2-1) When the size relation between the nozzle set n and the task numbers $X_{11}$, $X_{12}$ is reversed, namely, the relation of $X_{11} \geq X_{12} \geq X_{13} \ldots X_{1n}$ is no longer established while increment and decrement of the task number is repeated, the order of the nozzle set is not taken into account in the determination of the nozzle set, therefore, the same result can be obtained using either $(X_{11}, X_{12})=(X, Y)$ or $(X_{11}, X_{12})=(Y, X)$.

(2-2) When the task number is 1 or below. The nozzle set cannot be modified when the task number is updated to "0". This is because the task number=0 means that the number of nozzle sets is reduced by 1 and thereby does not apply to the concept of calculating the task number for the present number of nozzle sets.

When the condition (1) described above is satisfied, it is determined as "not modifiable" as it goes beyond the limit of the search method in use. The (2-1) and (2-2) are restrictions for avoiding unnecessary search. When all the nozzle sets satisfy these conditions, it is determined as "not modifiable" since every possible range is already searched. By conducting such search, the possibility to find out the more optimal solution is enhanced.

As is obvious from the above description, according to the component mounting order optimization method used in the present embodiment, the nozzle set and the task number are determined based on the algorithm by which not only the total task number but also the nozzle interchange time are simultaneously decremented while the order of mounting components and the array of component feeders are determined based on the determined nozzle set and task number. The interchange time which makes up a large part of the total tact time as well as the time necessary for the task is reduced, which leads to the shortening of the mounting time on the whole. Also, two parameters, the task number and the nozzle interchange time, are determined at the initial stage of optimization and the optimization is terminated within a shorter time.

When there is a restriction on the nozzle resource, the nozzle set is determined in consideration of the restriction. It is therefore possible to optimize the mounting order from the both aspects, the nozzle interchange time and the task number, even under the condition that not enough number of pickup heads is prepared for all the types of pickup nozzles.

As for the allocation of tasks for each nozzle set, a truly optimal solution can surely be found without fail by examining whether the task number is a feasible solution or not for all the possible combinations using a round-robin search method.

Thus, the mounter of the present invention using the gang pickup method realizes the optimization of the order of mounting components at higher optimization level and with higher speed. The practical value of the present invention is therefore extremely high today where various boards are required with the sooner due date.

SECOND EMBODIMENT

Next, the optimization apparatus according to the second embodiment of the present invention will be explained. The optimization apparatus according to the present embodiment, differing from the optimization apparatus used in the first embodiment which determines the optimal nozzle set with the presupposition that the pickup nozzles can be interchanged, determines the nozzle set optimal for mounting components with the smallest task number and the task number then used, without interchanging pickup nozzles.

Figure 37:
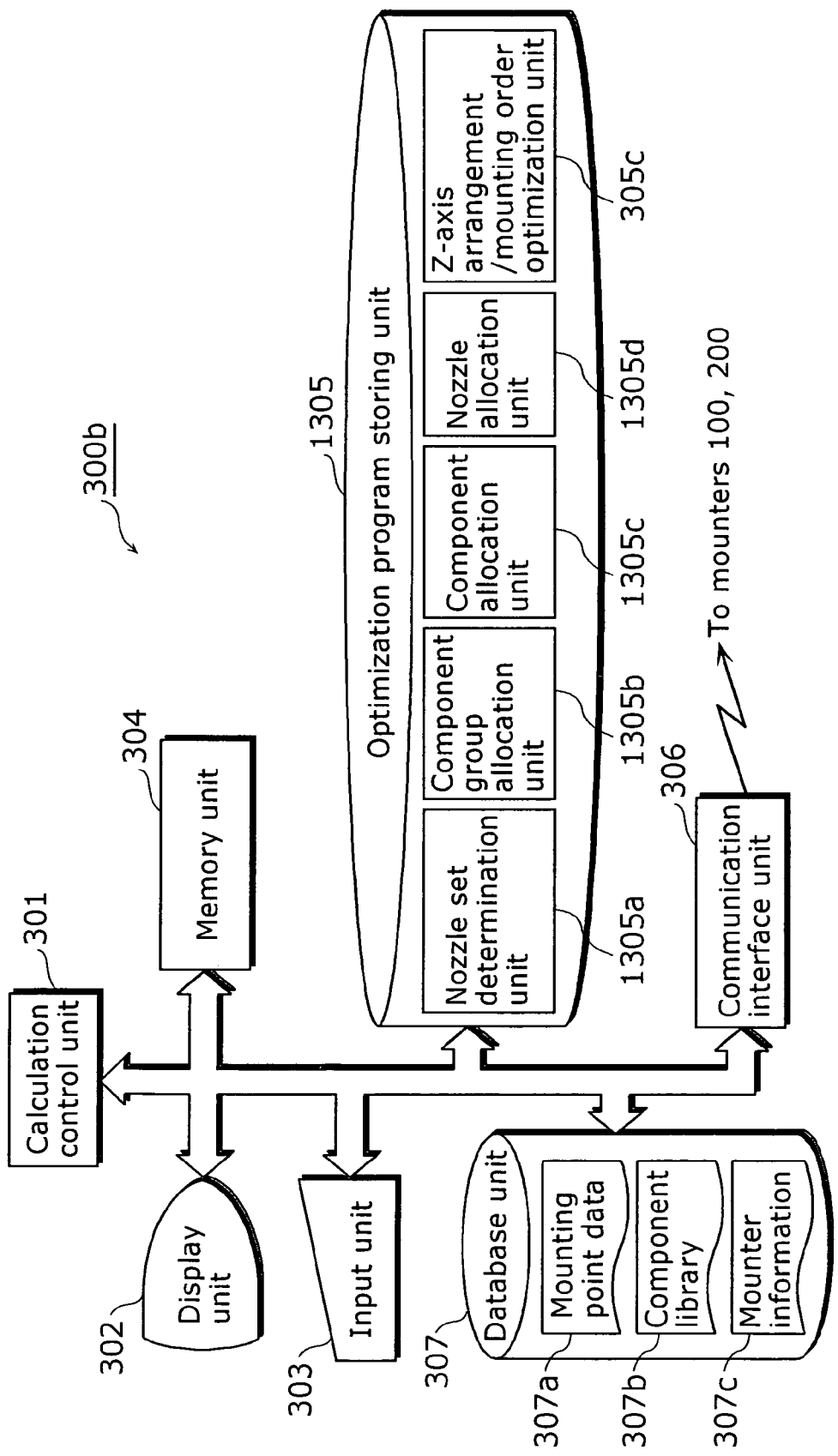
FIG. 37 is a block diagram showing the hardware construction of the optimization apparatus.

FIG. 37 is a block diagram showing the optimization apparatus 300b according to the second embodiment of the present invention, namely, a structural example of the optimization apparatus shown in FIG. 1. The optimization apparatus 300b is a computer apparatus for determining the order of mounting components to be mounted at each sub stage and the components at each sub stage for all the components provided by the component mounting CAD apparatus or the like so as to minimize a line tact (i.e., the largest tact within the tact at each sub stage composing a line) in mounting components on a target board under various restrictions based on the specification of each stage that composes a production line, and generating optimal NC data. The optimization apparatus 300b is composed of the calculation unit 301, the display unit 302, the input unit 303, the memory unit 304, the optimization program storing unit 1305, the communication I/F (interface) unit 306 and the database unit 307 or the like.

It should be noted here that the optimization apparatus 300b is composed of the same components as the optimization apparatus 300a used in the first embodiment, except for the optimization program storing unit 1305. The following focuses on the difference between the optimization apparatuses 300a and 300b. The same marks are put for the same components used in the first embodiment and the explanation is abbreviated here.

Each stand-alone mounter composing the production line (i.e., a mounter in charge of each process in pipeline process or a sub stage) is simply called a "stage". Namely, "stage" includes a front sub stage 110 and rear sub stage 120 in the mounter 100 equipped with two mounting robots as well as a mounter equipped with a single mounting robot.

The optimization program storing unit 1305 is a hard disk in which various optimization programs for realizing the functions of the present optimization apparatus 300b are recorded, or the like. The optimization program, a program for optimizing the order of mounting components, includes a nozzle set determination unit 1305a, a component group allocation unit 1305b, a component allocation unit 1305c, a nozzle allocation unit 1305d and an Z-axis arrangement/mounting order optimization unit 305c as function blocks relating to the present invention (i.e., processing units which function when executed by the calculation control unit 301).

The nozzle set determination unit 1305a is a processing unit for determining the nozzle set that is optimal for mounting all the components with the smallest task number, based on information such as the types and the numbers of all the components allocated to a single stage and types of pickup nozzles for picking up these components and others, without interchanging the pickup nozzles, and the task number then used. The nozzle set determination unit 1305a, a processing unit for determining the optimal nozzle set for a single stage and the task number then used, is activated when called out as a sub routine from the component group allocation unit 1305b and the component allocation unit 1305c, when the production line is composed of 2 or more stages. It should be noted here that a nozzle set is a combination of the pickup nozzles to be mounted on the line gang pickup head 112. When the number of nozzle heads is ten, the nozzle set is determined based on the types and the number of ten or fewer pickup nozzles. For example, a combination of two S-typed pickup nozzles and 8 M-sized pickup nozzles is one of the examples for such nozzle set. In this case, the head positions of the line gang pickup head 112 on which each of the pickup nozzles is mounted is not limited.

The component group allocation unit 1305b is a processing unit for classifying all the components to be mounted into small groups as shown in FIG. 38 based on the height of components and allocating them as the components to be mounted to each of the plural stages composing the production line in units of classified component groups.

It should be noted that the component groups are classified based on the height of components in order to enable a highly intense mounting based on fine pitch mounting by mounting firstly the lower components. Namely, the mounting is allowed for mounting the components belonging to the component group of the components higher than those in the previous component group only after mounting all the components belonging to a certain component group. The component group allocation unit 1305b allocates the component groups so that the total task number (the task number required for mounting all the components allocated to the stage) used at each stage is averaged (i.e., the maximum value becomes smaller), when allocating the components to each stage in units of component groups.

After the allocation operated by the component group allocation unit 1305b in units of component groups, the component allocation unit 1305c then takes the line balance by moving (i.e., changing the allocation) the components to the neighboring stage in units of components. In this case, the components are moved so that the total task number used at each stage is averaged. However, the averaging is attempted under the presupposition that the nozzle interchanging is not operated while mounting all of the components at each stage.

The nozzle allocation unit 1305d is a processing unit which can mount all of the components with the smallest task number without performing nozzle interchanging, when there is a restriction on the nozzle resource (restriction on the number of usable pickup nozzles), and allocate the line-balanced pickup nozzles to plural stages.

The Z-axis arrangement/mounting order optimization unit 305c optimizes the Z-axis arrangement and the mounting order while maintaining the nozzle set and the task number determined by each optimization processing unit 1305a-1305d and generates the NC data as a final result, as is described in the first embodiment.

The following describes the operation of the optimization apparatus 300b constructed as above.

Figure 39:
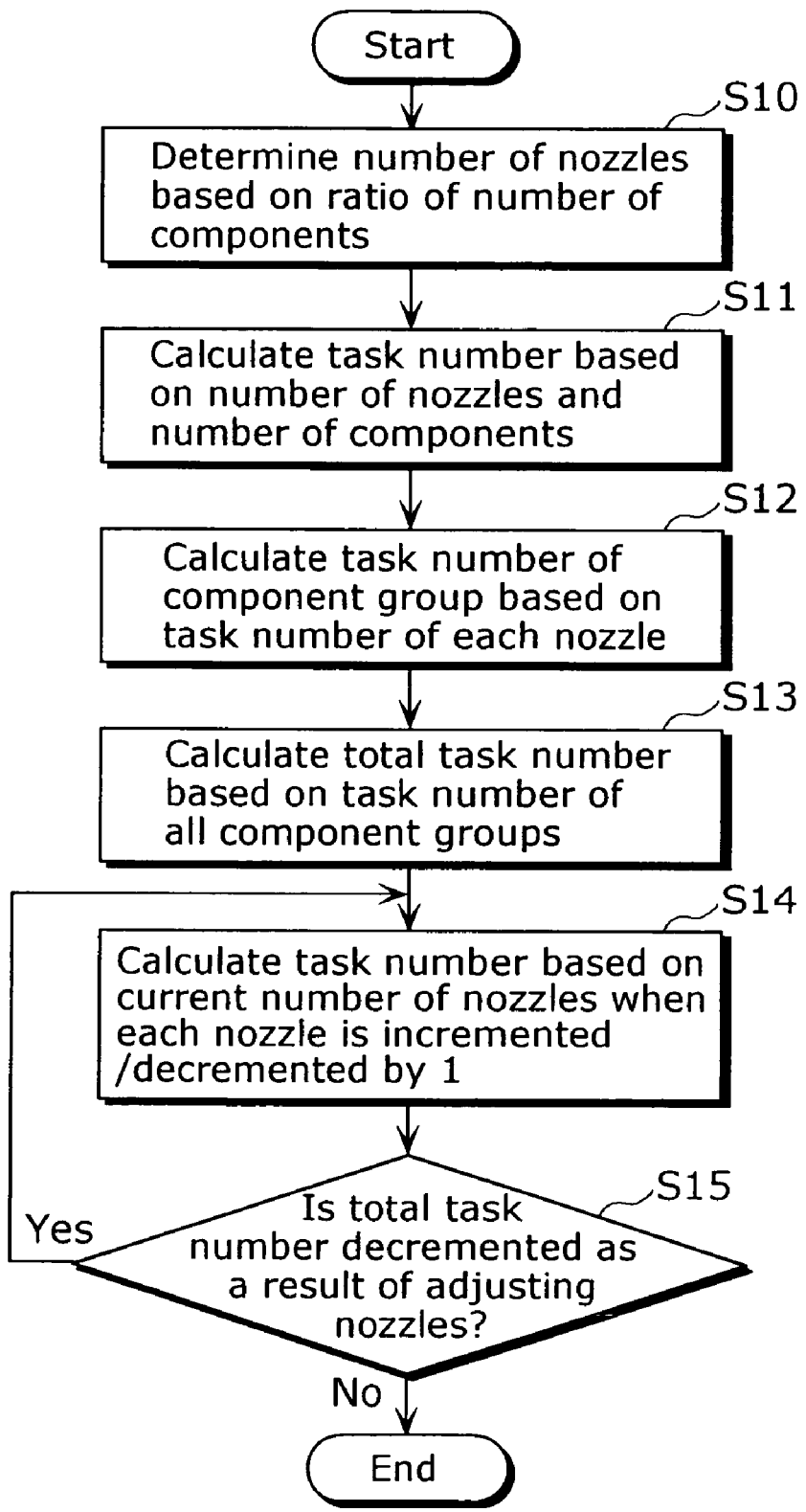
FIG. 39 is a flowchart showing a procedure of operating the task number determination unit.

Firstly, the procedure for determining the nozzle set optimal for mounting the components allocated to a single stage without interchanging nozzles and the task number then used, that is, the process performed by the nozzle set determination unit 1305a. FIG. 39 is a flowchart showing the procedure while FIGS. 40 and 41 are diagrams showing examples of each step shown in FIG. 39.

The nozzle set determination unit 1305a firstly determines an initial nozzle set based on a combination of the number of the components allocated to the stage for each type and the corresponding each type of pickup nozzles (S10 in FIG. 39). Here, the initial nozzle set is determined so that the ratio of the number of components equals to the ratio of the number of pickup nozzles and the total number of pickup nozzles equals to the number of pickup nozzles mountable on the line gang pickup head 112 (here, ten).

For example, assume that the components "0603" and "1005" are assigned to a single stage as in the table shown in FIG. 40. That is to say, a total of 64 components consisting of 19 components 0603 (the type of pickup nozzle to be used is "SX") belonging to a component group "PG1" and 45 components "1005" (the type of pickup nozzle to be used is "SA") belonging to a component group "PG2" are assigned to a single stage. In this case, the nozzle set determination unit 1305a determines the number of each pickup nozzle so that the ratio of the number of each component equals to the ratio of the number of pickup nozzles as shown in the equation in "1. Calculate initial nozzle set" in FIG. 41. Here, the initial nozzle set is determined as 3 pickup nozzle type SX and 7 pickup nozzle type SA.

The nozzle set determination unit 1305a then calculates the task number per pickup nozzle necessary for mounting all the components using the determined initial nozzle set, namely, the initial task number (S11 in FIG. 39). To be more specific, the task number necessary for mounting all the 19 components "0603" using 3 pickup nozzles SX is obtained as 7 while the task number necessary for mounting all the 45 components "1005" using 7 pickup nozzles SA is obtained as 7.

The nozzle set determination 1305a then calculates the task number per component group (i.e., the task number necessary for mounting all the components belonging to each component group) using the calculated task number per pickup nozzle (S12 in FIG. 39). In more detail, when there are more than two types of pickup nozzles belonging to the same component group, the maximum value out of the task numbers for these pickup nozzles is determined as the task number per component group. This is because even when the components are to be picked up by different types of pickup nozzle, it is possible to mount with the same task when the pickup nozzles (i.e., component types) belong to the same component group. Therefore, it is possible to mount the components on the line gang pickup head 112 using various pickup nozzles and, in this case, the larger task number is determined as the task number necessary for mounting all the components belonging to the component group. As can be seen in the example of components in FIG. 40, the only pickup nozzle belonging to the component group "PG1" is "SX" (component "0603") and the only pickup nozzle belonging to the component group "PG2" is "SA" (component "1005"). The nozzle set determination unit 1305a therefore calculates, in this example, the same value as the task number per pickup nozzle as the task number per component groups, namely, 7 for the component group "PG1" and 7 for the component group "PG2".

The nozzle set determination unit 1305a calculates a total task number, that is, the task number necessary for mounting all the components using the calculated task number per component group (S13 in FIG. 39). In more detail, the total task number is calculated by summing up the task numbers per component group. This is because it is prohibited to mount the components belonging to the higher component group before mounting all of the components in the lower component group so that the total task number is a total of the task numbers per component group. In the example of the components shown in FIG. 40, a total of the task number "7" of the component group "PG1" and the task number "7" of the component group "PG2", that is, the total task number "14" is calculated using the equation shown in "3. Calculate task number & number of nozzles" in FIG. 41, T (SX): 7+T (SA): 7=14.

The nozzle set determination unit 1305a then increments/decrements the number of nozzles by 1 depending on the type of nozzles (i.e., adjust the number of nozzles) (S14 in FIG. 39) so as to judge whether or not the total task number is decremented (S15 in FIG. 39) in order to search for the smaller total task number (S14 in FIG. 39). When the total task number is decremented (Yes at S15 in FIG. 39), the adjustment of the number of nozzles is repeated. When the total task number is not decremented (No at S15 in FIG. 39), the search is terminated and the nozzle set and the total task number used at that time are determined as a final solution. Namely, the nozzle set optimal for mounting the all of the components assigned to the stage with the minimum task number without interchanging nozzles and the task number then used are thus determined.

Taking the example of the components shown in FIG. 40, the present task number using 3 pickup nozzles SX is 7, however, when the pickup nozzle is decremented by 1, 19/2→10, therefore, the task number is "10". When the pickup nozzle is incremented by 1, 19/4→5, therefore, the task number is "5", as shown in "3. Calculate task number & number of nozzles" shown in FIG. 41 ("→" means to round up in order to make an integer).

On the other hand, the present task number using 7 pickup nozzles SA is "7", however, when the pickup nozzle is decremented by 1, 45/6→8, therefore, the task number is "8" and when it is incremented by 1, 45/8→6, therefore, the task number is "6".

Accordingly, as seen in the combination of values indicated in the circle in FIG. 41, when the number of pickup nozzles SX is incremented (the task number using the pickup nozzle SX is "5" as a result) and when the number of pickup nozzles SA is decremented by 1 (the task number using the pickup nozzle SA is "8" as a result), the equation T (SX):5+T (SA):8=13, therefore, the total task number is decremented to "13". That is to say, the task number changes (decrements) from T (SX):7+T (SA):7 to T(SX): 5+T(SA):8 while the nozzle set changes from SX:3, SA:7 to SX:4, SA:6 and thus the task number and the nozzle set are optimized.

Similarly, whether or not the total task number is decremented as a result of the adjustment of the number of nozzles is examined again for a new nozzle set (SX:4, SA:6). In this case, as shown in "3. Calculate task number & number of nozzles" in FIG. 41, the total task number is not incremented or decremented after the adjustment of the number of nozzles so that the processing of optimizing the number of nozzles is terminated judging that further optimization is impossible. Consequently, the nozzle set making a combination of 4 pickup nozzles SX and 6 pickup nozzles SA as well as the total task number "13" are determined as an optimal solution.

FIGS. 42 and 43 are diagrams for explaining another example of each step shown in FIG. 39. Here, a case of assigning a component group including two different pickup nozzles (i.e., component types) to a single stage is shown, which is different from the case of assigning two component groups to a single stage shown in FIGS. 40 and 41. It is assumed here, as in the table shown in FIG. 42, two components "1CAP" and "3CAP" belonging to a component group "PG3" are assigned to a certain single stage.

In this case, the nozzle set determination 1305a determines 4 pickup nozzles M, 6 pickup nozzles S as an initial nozzle set based on the number of components (S10 in FIG. 39). The task number per pickup nozzle necessary for mounting all the components using the determined initial nozzle set, that is, the initial task number, can be calculated as shown in the equation in "2. Calculate initial task number" shown in FIG. 43. The task number necessary for mounting 43 components "1CAP" using 6 pickup nozzles S is calculated as "8" while the task number necessary for mounting 19 components "3CAP" is calculated as "5" (S11 in FIG. 39).

The nozzle set determination unit 1305*a* then calculates the task number per component group using the determined task number per pickup nozzle (S12 in FIG. 39). Here, as there are more than two types of pickup nozzles belonging to the same component group "PG3", the maximum value "8" is determined as the task number of the component group "PG3" out of the task number (8, 5) corresponding to these pickup nozzles.

The nozzle set determination unit 1305*a* then determines a total task number, that is, the task number necessary for mounting all the components using the calculated task number per component group. However, the task number "8" of the component group "PG3" is determined as a total task number since only one component group is used here (S13 in FIG. 39).

The nozzle set determination 1305*a* then searches the smaller task number (S14 & S15 in FIG. 39). As shown in "3. Calculate task number & number of nozzles in FIG. 43", the present task number using 6 pickup nozzles S is "8". When, the pickup nozzle is decremented by 1, 43/5→9, and the task number is "9". When the pickup nozzle is incremented by 1, 45/7→7, and the task number is "7". The present task number using 4 pickup nozzles M is "5". However, when the number of pickup nozzles is decremented by 1, 19/3→7, and the task number is "7". When the number of pickup nozzles is incremented by 1, 19/5→4, and the task number is "4". Accordingly, as seen in the combination indicated in the circle in FIG. 43, the total task number is decremented to "7". By incrementing the number of nozzles S by 1 (the task number using the pickup nozzle S is "7" as a result) and decrementing the number of nozzles M by 1 (the task number using the pickup nozzle M is "7" as a result), the maximum value can be calculated from the equation Max [T(S):7, T(M):7]=7. Namely, as shown in "3. Calculate task number & number of nozzles" in FIG. 43, the task number changes (decrements) from Max [T(S):8, T(M):5 to Max [T(S):7, T(M):7] while the nozzle set changes from S:6, M:4→S:7, M:3, and thus the task number and the nozzle set are optimized.

Similarly, whether or not the total task number is decremented as a result of the adjustment of the number of nozzles is examined again for a new nozzle set (S:7, M:3). In this case, however, the total task number is not decremented ("8" or "10") after the increment/decrement of the number of nozzles, as shown in "3. Calculate task number & number of nozzles" in FIG. 43. Therefore, it is judged that further optimization cannot be operated and the processing of optimizing the number of nozzles is terminated. Consequently, the nozzle set that is a combination of 7 pickup nozzles S and 3 pickup nozzles M as well as the total task number "7" are determined as an optimal solution.

Thus, when various components are assigned to a single stage, the nozzle set determination unit 1305*a* determines the nozzle set and the task number optimal for mounting all the components with the smallest task number based on the number of components, the type of nozzles and information on component groups and others, without interchanging nozzles.

The two examples above show the case in which plural component groups, each including only one type of pickup nozzle, are assigned to a single stage (FIG. 40) and the case in which only one component group including plural types of nozzles is assigned to a single stage (FIG. 41). The nozzle set determination unit 1305*a* can surely determine the optimal nozzle set and task number even for the case in which both of the above cases are mixed. A case in which a component group including plural types of nozzles and a component group including one or plural types of nozzles are assigned can be an example of it. The optimal nozzle set and task number can be determined even in this case because the total task number at the stage can be calculated by totalizing the task number of each component group (S13 in FIG. 39) after having calculated the maximum value based on the task number per pickup nozzle belonging to the component group (S12 in FIG. 39).

Figure 44:
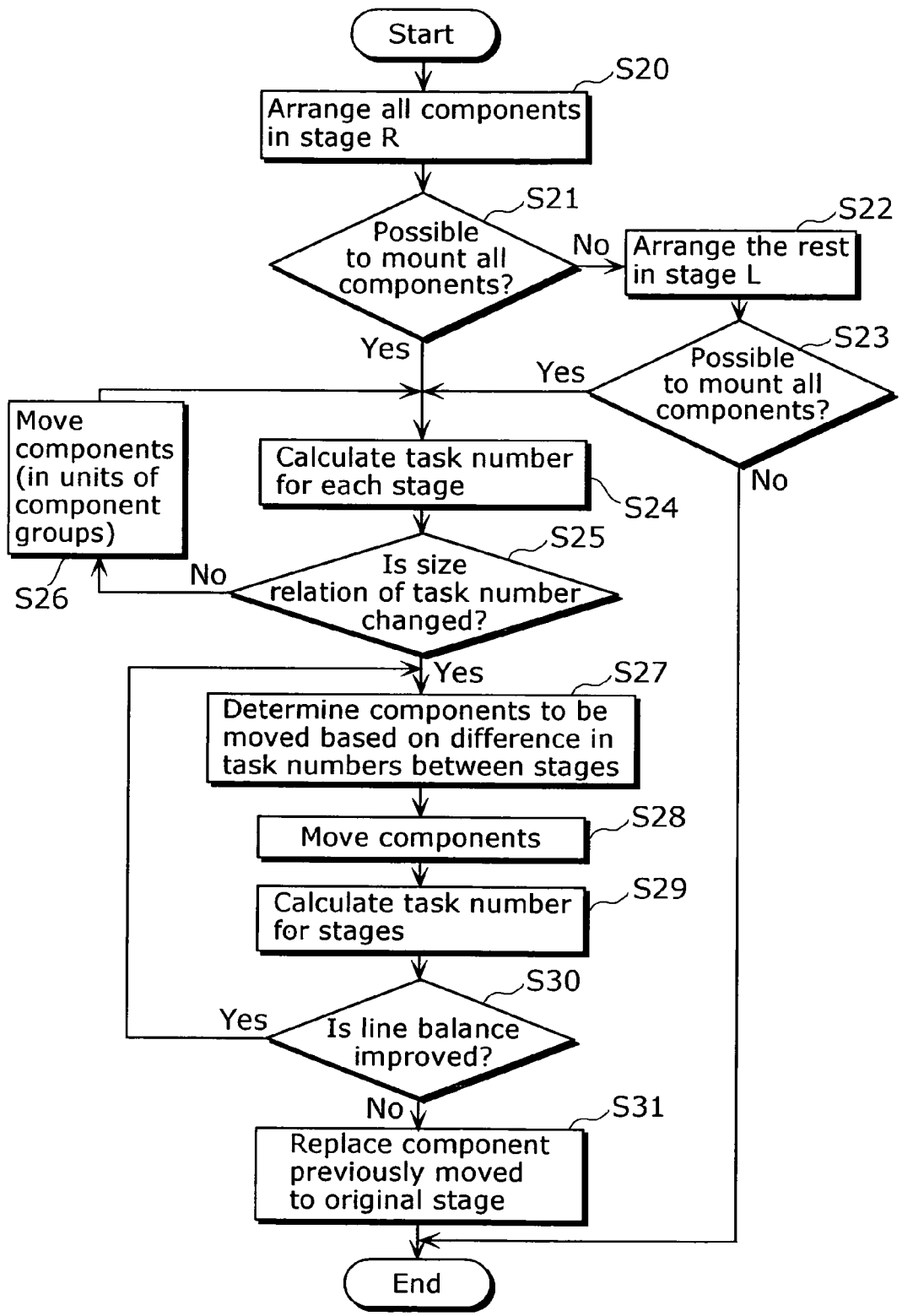
FIG. 44 is a flowchart showing the procedure operated by a component group allocation unit and a component allocation unit.
Figure 45:
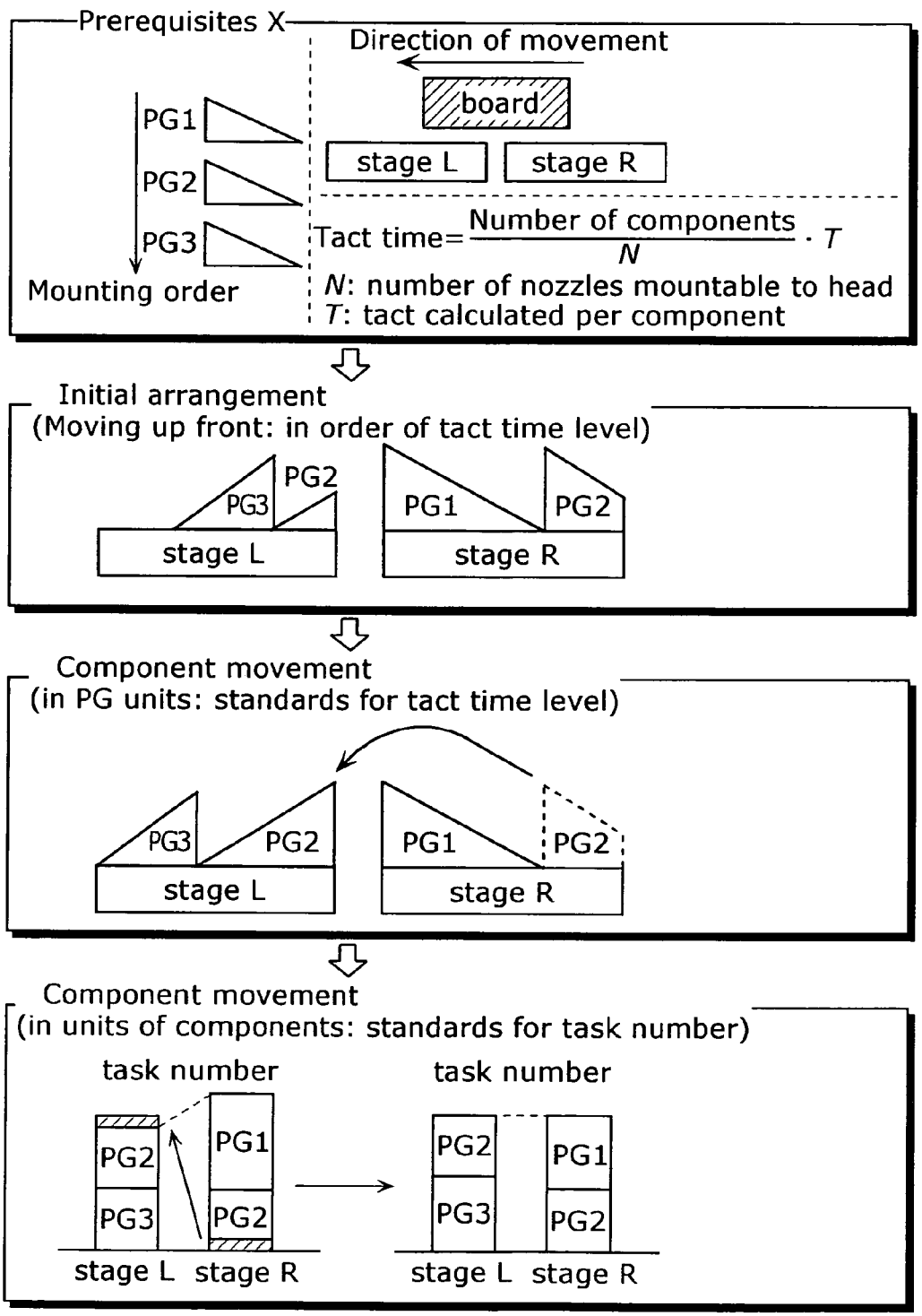
FIG. 45 is a diagram for explaining each step in the flowchart shown in FIG. 44.

The following describes the procedure for determining the nozzle set optimal for mounting the components assigned to a plurality of stages without interchanging nozzles and the task number then used, that is to say, the procedure of averaging the tacts between plural stages (i.e., perform tact balance) operated by the component group allocation unit 1305*b* and the component allocation unit 1305*c*. FIG. 44 is a flowchart showing the procedure while FIG. 45 is a diagram showing the processing at each step shown in FIG. 44.

It should be noted here that the number of stages is 2 (stage R and stage L) for the sake of simplicity. The prerequisites for the present optimization are shown in "Prerequisites" in FIG. 45. Namely, (1) the components need to be mounted in ascending order of the height of components (here, PG1→PG2→PG3); (2) the board is transferred from the stage R to the stage L; (3) the tact time level is expressed by Tact time level=Number of components/$N \cdot T$ when N indicates the number of pickup nozzles to be mounted on the line gang pickup head 112 and T indicates a tact calculated per component. Here, a triangle indicating each component group corresponds to a histogram obtained by arranging all the components in the component group for each type (horizontal axis) in descending order of the number of components (vertical axis).

The component group allocation unit 1305*b* arranges all the components to the stage R that is the upper stage (S20 in FIG. 44). When it is impossible to mount all the components (No at S21 in FIG. 44), the component group allocation unit 1305*b* arranges the rest of the components to the stage L, the lower stage (S22 in FIG. 44). "1. Initial arrangement" in FIG. 45 shows how the components are arranged when the components are thus mounted on two stages, prioritizing the stage R (moving up front).

It should be noted that the type of component with large number of components are arranged on the left for the component groups to be arranged on the stage R, whereas the type of component with large number of components are arranged on the right for the component groups to be arranged on the stage L in order to abbreviate the total time necessary for the line gang pickup head 112 to move. Namely, the line gang pickup head 112 on which the components are picked up always passes near the component recognizing camera 116 which is located on the area between the two stages. The component type with large number of components is therefore supposed to be placed near the component recognizing camera 116 in order to shorten the moving distance of the line gang pickup head 112.

Surely, such method for arranging the components at a single stage is just an example disregarding the characteristics of the present invention and the method depends on the numbers of stages and component recognizing camera as well as a positional relation between them. Therefore, in the case of a mounter having two independent stages, each of which is composed of a set of a component supply unit and a component recognizing camera, there is no need to change the method for arranging the components between stage R and stage L.

As a result of the initial arrangement as described above, it is judged impossible to mount all the components using these two stages when all the components cannot be arranged (No at S23 in FIG. 44) and the optimization processing is terminated. Either when all the components have been mounted at the stage R (Yes at S21 in FIG. 44) or when all the components have been mounted at the stages R and L (Yes at S23 in FIG. 44), the component group allocation unit 1305*b* averages the task number at each stage (the task number necessary for mounting all the components assigned to each stage) by moving the components in units of component groups between stages, as shown in "2. Move components" in FIG. 45 (S24-S26 in FIG. 44). Namely, the task number at each stage is calculated (S24 in FIG. 44), whether or not the size relationship between the task numbers changes (i.e., reverses) is supervised by moving the components in units of group components (S25 in FIG. 44). When the size relationship has not changed (No at S25 in FIG. 44), the moving of component groups is repeated (S26 in FIG. 44) and when it has changed (Yes at S25 in FIG. 44), the state in which the previous component groups are allocated is maintained and the next processing follows. It should be noted that the nozzle set determination unit 1305*a* calculates the task number at each stage in Step S24 according to the procedure in the flowchart shown in FIG. 39.

The component allocation unit 1305*c* takes a line balance, that is, averages the task number at each stage by moving the components in units of components between stages (S27-S30 in FIG. 44). That is to say, the component allocation unit 1305*c* determines the components to be moved based on the difference in task number between the stages (S27 in FIG. 44) and moves the determined components (S28 in FIG. 44). The component allocation unit 1305*c* then calculates the task number at each stage after the moving (S29 in FIG. 44) and judges whether or not the line balance is improved (i.e., the maximum task number is decremented) (S30). When the line balance is improved (Yes in S30), the component allocation unit 1305*c* repeats moving the next component (S27-S39 in FIG. 44). When the line balance is not improved (No in S30), the component previously moved is replaced to the original place (S31) and the optimization processing is terminated.

In more detail, as shown in "3. Move components" in FIG. 45, when the task number at stage R is larger than the one at stage L, the component belonging to the component group where the highest components are assigned out of the component groups allocated to the stage R is moved one by one to the stage L. When the line balance is no longer improved (i.e., the task number is larger at the stage L than at the stage R), the optimization processing is terminated determining the immediately previous state as an optimal state of allocating components. It should be noted that, on the contrary, when the components are moved from the stage L to the stage R, the component belonging to the component group to which the low components are assigned out of the component groups allocated to the stage L is moved one by one inversely to the case described above because of the height of components. As in Step S24 described above, the nozzle set determination unit 1305*a* calculates the task number at each stage in Step S29 according to the procedure described in the flowchart in FIG. 39.

Figure 46:
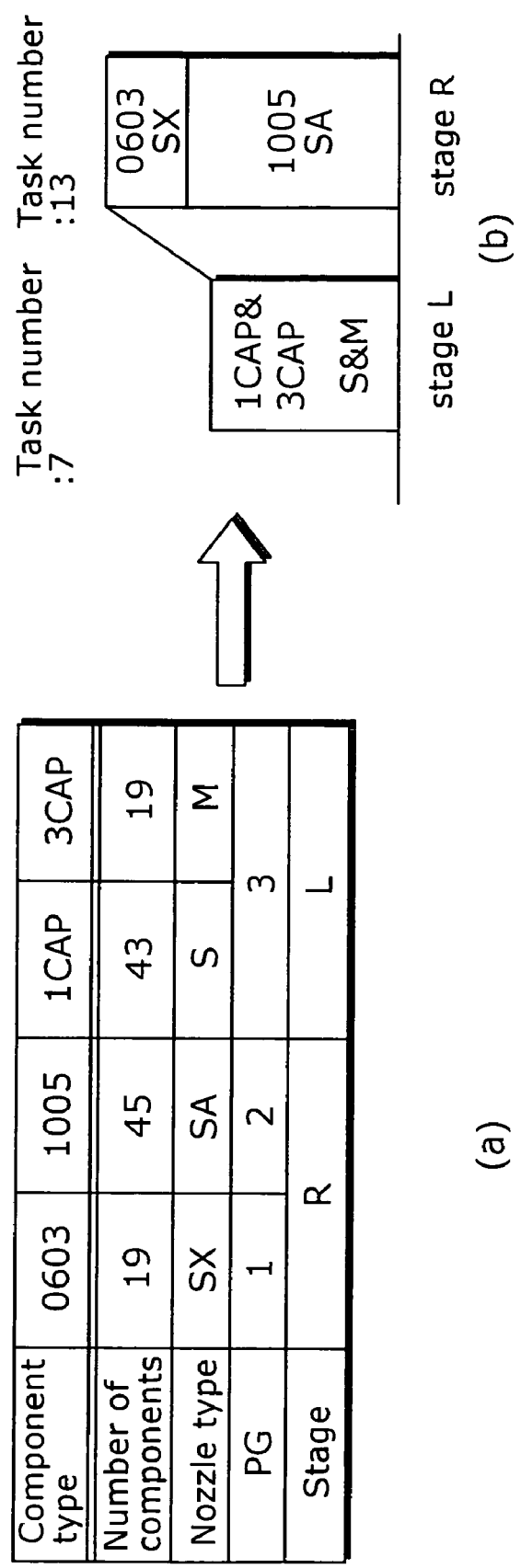
FIGS. 46A and 46B are component structure tables or the like for explaining each step shown in FIG. 45.
Figure 47:
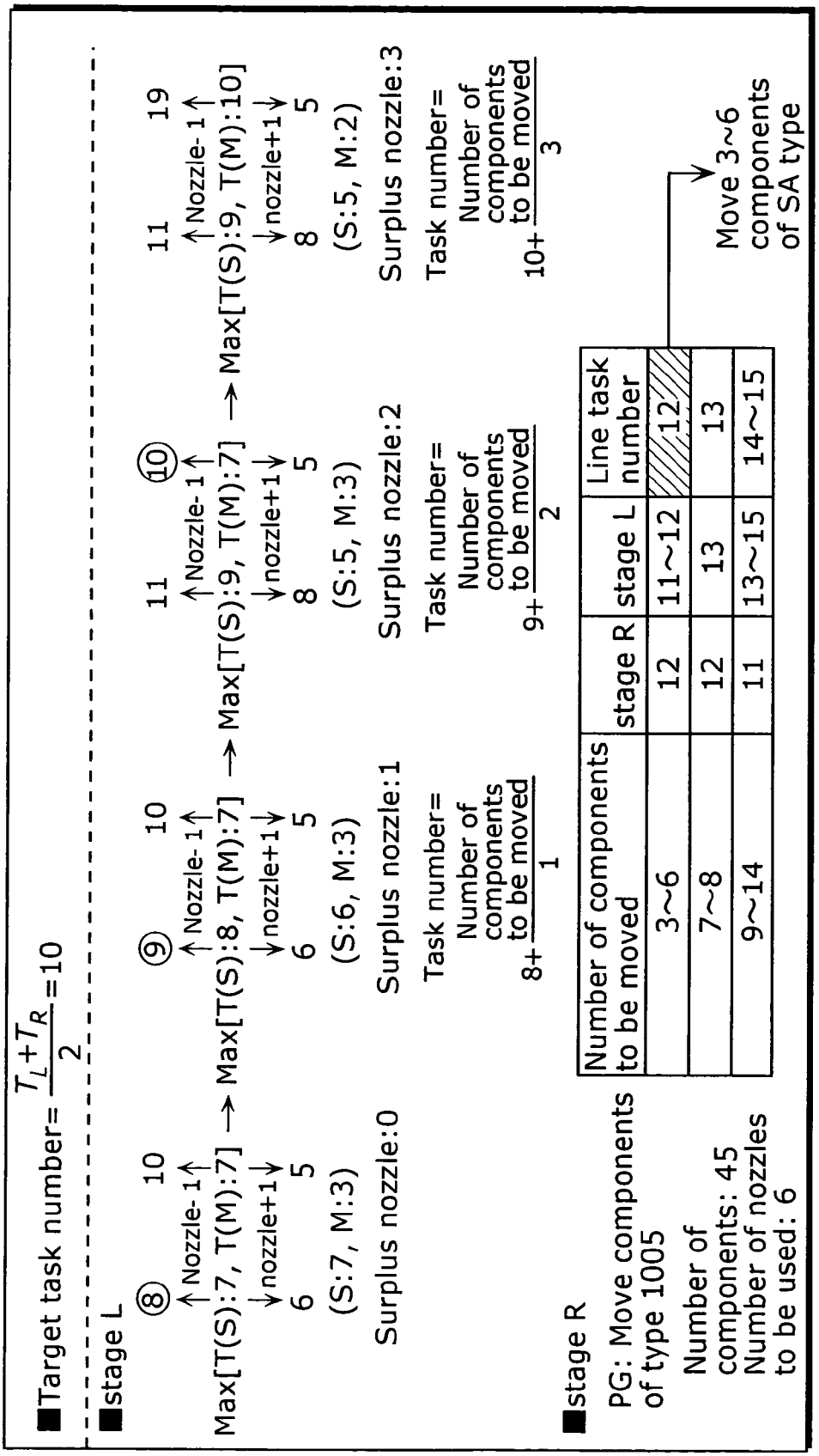
FIG. 47 is a diagram showing an example of each step shown in FIG. 45.

FIGS. 46 and 47 are diagrams showing the allocation processing in units of components operated by the component allocation unit 1305*c*, namely, the examples of Steps S27-S31 in the flowchart shown in FIG. 44.

Supposing here that the structure of components is as shown in the table in FIG. 46A and the state of allocation is as shown in FIG. 46B as a result of the optimization in units of component groups (S20-S25 in the flowchart in FIG. 44) operated by the component group allocation unit 1305*b*. That is to say, the components "0603" belonging to the component group "PG1" and the components "1005" belonging to the component group "PG2" are allocated to the stage R whereas the components "1CAP" and the components "3CAP" belonging to the component group "PG3" are allocated to the stage L. It should be noted that this state of allocation corresponds to the component structure shown in FIGS. 40 and 42 where the nozzle set is (S:7, M:3) and the task number is "7" at the stage L while the nozzle set is (SX:4, SA:6) and the task number is "13" at the stage R.

In such case, the component allocation unit 1305*c* firstly calculates the task number at each stage (i.e., the task number TL at stage L and the task number TR at the stage R), as shown in the upper stage in FIG. 47 and sets the target task number as "10" resulted from $$(TL+TR)/2=(7+13)/2=10$$

by taking an average of the task numbers at each stage.

As is apparent in FIG. 46B, focusing on the stage L, the components "1005" which needs a new pickup nozzle has to be moved from the stage R to the stage L. For this, the component allocation unit 1305*c* determines the relationship between the number of new pickup nozzles (i.e., space nozzle) mountable to the line gang pickup head at the stage L and the number of components which are movable. This is because it is presupposed that the nozzle interchange is not operated while mounting all the components at each stage. In more detail, the component allocation unit 1305*c* determines all the combinations being made of the number of space nozzles and the task number by decreasing the pickup nozzles one by one so that the increment in the number of tasks is the smallest until the target task number is achieved, as shown in the middle stage in FIG. 47.

Here, how the task number "7" for the initial nozzle set (S:7, M:3) changes. The task number is incremented to "8" by decrementing the pickup nozzle S by 1 (space nozzle:1), then to "9" by decrementing the pickup nozzle by 1 (space nozzle: 2), and then to "10" by decreasing the pickup nozzle M by 1 (space nozzle:3). Accordingly, the task number at the stage L can be calculated by 8+(number of components to be moved)/1 when the number of space nozzles is 1, 9+(number of components to be moved)/2 when the number of space nozzles is 2, and then 10+(number of components to be moved)/3 when the number of space nozzles is 3.

Focusing on the stage R, since the components to be moved to the stage L is the components "1005" whose height is the highest, the number of components is 45 and the number of nozzles is 6, the relation between the components to be moved and the task is as in the table shown in the lower stage in FIG. 47. Namely, the task number is decremented by 1 (the task number at the stage R is 12 as a result) by moving 3-8 components "1005" to the stage L while the task number is further decremented by 1 (the task number at the stage R is 11 as a result) by moving 9-14 components "1005" to the stage L.

Consequently, the number of components "1005" to be moved from the stage R to the stage L, the task number at the stage R, the task number and the line task number at the stage L (the maximum value among each task number) are as in the table shown in the lower stage in FIG. 47. The component allocation unit 1305*c* judges that it is optimal to use the moving method by which the smallest line task number can be obtained, namely, it is optimal to move 3-6 components "1005" from the stage R to the stage L and changes the allocation accordingly.

Thus, the component group allocation unit 1305b and the component allocation unit 1305c determine the nozzle set optimal for mounting the components assigned to 2 or more stages without interchanging nozzles and the task number then used.

Figure 48:
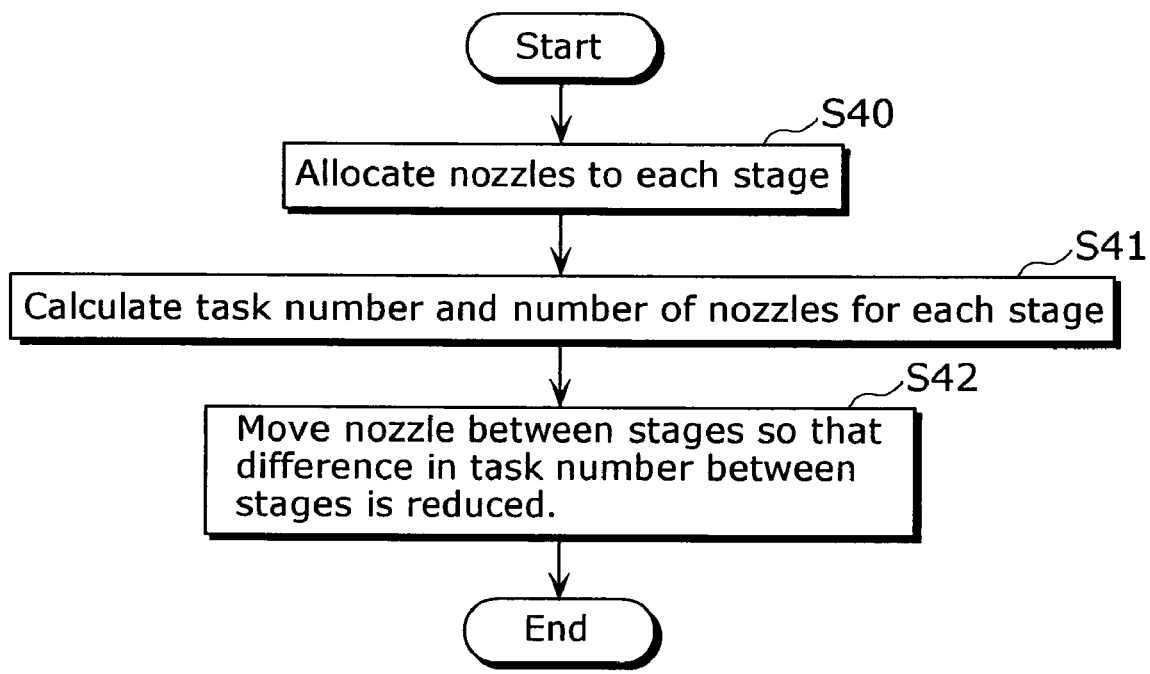
FIG. 48 is a flowchart showing the procedure operated by a nozzle allocation unit.

The following describes the procedure of allocating the nozzles to each stage in the case where there is a restriction on the nozzle resource (restriction on the number of usable nozzles) to determine the nozzle set optimal for mounting the components assigned to plural stages without interchanging nozzles and the task number then used, that is, the procedure used by the nozzle allocation unit 1305d. FIG. 48 is a flowchart showing the procedure while FIGS. 49 and 50 are examples showing each step in FIG. 48.

The nozzle allocation unit 1305d firstly allocates pickup nozzles to each stage (S40 in FIG. 48). That is to say, the nozzle allocation unit 1305d allocates the nozzles to each stage so that the ratio of the number of the components assigned to each stage equals to the ratio of the number of pickup nozzles and the total number of pickup nozzles equals to the number of nozzle resource, when the components to be picked up using the same type of nozzle are allocated to plural stages.

For instance, it is assumed here, as shown in the table in FIG. 49, 10 components "0603R", 12 components "0603c", 12 components "1005", 11 components "1005C" and 50 components "others" are assigned to the stage R while the nozzle resource number is defined as follows: 5 pickup nozzles SX, 5 pickup nozzles SA, 3 pickup nozzles S and 2 pickup nozzles M are usable. In this case, the nozzle allocation unit 1305d allocates the pickup nozzles SA to be used at both stages so that the ratio of the number of respective components equals to the ratio of number of respective pickup nozzles, as shown in the equation described in "1. Allocate nozzles" in FIG. 50. Here, it is determined that the number of the pickup nozzles SA to be allocated to the stage L is 2 while the number of the pickup nozzles SA to be allocated to the stage R is 3.

The nozzle allocation unit 1305d calculates the task number and the number of nozzles to be used at each stage in consideration of nozzle resource (S41 in FIG. 48). In more detail, the nozzle allocation unit 1305d calculates the number of respective pickup nozzles, namely, the initial nozzle set without taking nozzle resource into consideration, and then, calculates the task number per pickup nozzle, namely, the initial task number in consideration of nozzle resource.

For example, as shown in the equation in "2.1 Calculate initial nozzle set" in "2. Calculate task number and number of nozzles at each stage" for the stages R and L shown in FIG. 50, the numbers of pickup nozzles to be allocated are determined as follows: 5 pickup nozzles SA and 5 pickup nozzles SX, to the stage R; 2 pickup nozzles SA, 3 pickup nozzles M and 5 pickup nozzles S, to the stage L. The initial task number is calculated by dividing the number of respective components by the initial nozzle number (when the number exceeds the restricted number of nozzle resource, the number defined in the restriction is used), as shown in "2.3. Calculate initial task number" for stages R and L shown in FIG. 50, in consideration of the restricted number of nozzle resource as shown in "2.2. Restriction on nozzle resource" for stages R and L in FIG. 50. Here, the initial task number is respectively defined for each nozzle as follows: 5 pickup nozzles SX and 7 pickup nozzles SA for the stage R whereas 6 pickup nozzles SA, 11 pickup nozzles S and 9 pickup nozzles M for the stage L.

Lastly, the nozzle allocation unit 1305d moves the pickup nozzles so that the difference in tact number between stages is shorten in order to take the line balance (S42 in FIG. 48). In more detail, as in the process at S14 in FIG. 39, the method by which the difference in task number between the stages is shorten is searched by evaluating the task number when the number of nozzles is incremented/decremented by 1 per type of pickup nozzle. Here, a combination of the increment/decrement methods by which the total increment/decrement of pickup nozzles at both stages become "0" is selected. For, it is a search for a method of moving the pickup nozzles from one stage to the other.

For example, as shown in "3. Adjust task number & number of nozzles" in FIG. 50, the task number "15" is calculated by decrementing the number of pickup nozzles SA from 3 to 2 for the stage R while the task number "15" is calculated by incrementing the number of pickup nozzles SA from 2 to 3 for the stage L. Thus, the difference in task number between the stages becomes "0" and the line balance is well-taken.

Thus, the nozzle allocation unit 1305d can mount all the components with the smallest task number without interchanging nozzles as well as allocate the pickup nozzles with a good line balance, when there is a restriction on nozzle resource (restriction on numbers).

It should be noted that in the present embodiment, a mounter equipped with a nozzle interchanging function is described, however, the component mounting order optimization method according to the present invention is not limited to such mounter and can be surely applied to a mounter without the nozzle interchanging function. This is because the component mounting order optimization method according to the present embodiment is a technique relating to the optimization of mounting order for mounting all the components without interchanging nozzles.

As is apparent from the above description, according to the component mounting order optimization method used in the present embodiment, a nozzle set optimal for mounting all the components on a board with less task number without interchanging nozzles is determined, the time necessary for the optimization of the order of mounting components is shorten, and the optimization for the mounter with high cost performance, but without such nozzle interchanging function can be realized.

Namely, the present invention enables a supply of the mounter whose cost is considerably reduced without imposing great cost on its performance. The practical value of the present invention is extremely high today where a fabrication of various boards such as a cell phone, a portable personal computer, and the like, with shorter due of delivery and low cost, is desired.

The component mounting order optimization method according to the present invention is useful as a component mounting order optimization apparatus which determines an optimal order for mounting components for a mounter that mounts electric components on a board such as a printed circuit board or the like, or as a mounter or a component mounting system equipped with a controller for determining an order of mounting components, and even as a stand-alone simulator (a tool for optimizing an order of mounting components) for determining a mounting order for components in a state where it is not connected to a mounter, or the like.

The invention claimed is:

1. An optimizing method that optimizes, using a computer, a component mounting order in which a mounter, equipped with a mounting head, picks up L components, L being no less than 2, from an array of component feeders that hold components, and mounts the components on a board, wherein the mounting head has, at maximum, L pickup nozzles attached thereto for picking up the components, and wherein a plurality of components, of which the mounting order is to be optimized, includes a plurality of types of components to be picked up using no less than 2 pickup nozzles of different types, the optimizing method comprising:

determining a nozzle set, from a plurality of pickup nozzles, for mounting the plurality of components using a smallest possible number of tasks, where a nozzle set is a combination of pickup nozzles in which (i) only the types of the pickup nozzles and a number of the pickup nozzles to be attached to the mounting head are previously set and (ii) a correspondence between the types of the pickup nozzles and mounting positions of the pickup nozzles is not previously set, and where a task is a group of components to be mounted by one iteration of a repeated series of processes where the mounting head picks up, transports, and mounts the components; and determining an order of the array of component feeders and a component mounting order, while maintaining the determined nozzle set.

2. The optimizing method according to claim 1, wherein the pickup nozzles attached to the mounting head are interchangeable, and wherein the determination of the nozzle set determines a nozzle set that reduces a mounting time in view of (i) a number of times of interchanging the pickup nozzles for mounting the components and (ii) a total number of tasks.

3. The optimizing method according to claim 2, wherein, in the determination of the nozzle set, i) at least one kind of nozzle set is specified, the specified nozzle set corresponding to the number of times of interchanging the pickup nozzles, ii) a number of tasks required for mounting the plurality of components is calculated using the specified nozzle set, iii) a combination of the number of times of interchanging the pickup nozzles and the calculated number of tasks required for mounting the plurality of components is estimated, and iv) the nozzle set is determined as a result of the estimation.

4. The optimizing method according to claim 3, wherein the determination of the nozzle set further comprises:

further calculating the number of tasks required for mounting the plurality of components by repeating the calculating of the number of tasks required for mounting the plurality of components using "n" kinds of nozzle sets, "n" being no less than 1, while incrementing "n" by 1; and calculating an evaluated value S, corresponding to the mounting time, according to a predetermined evaluation function, specifying a nozzle set of the "n" kinds of nozzle sets corresponding to a combination of pickup nozzles in which the evaluated value S is the smallest, and setting the specified nozzle set as the determined nozzle set.

5. The optimizing method according to claim 4, wherein the further calculating of the number of tasks further comprises:

calculating a number of tasks, for a case in which the plurality of components are mounted on a board, for using the mounting head to pick up as many of the L components as possible, as a minimal task number; and judging for each task, of the number of tasks calculated by the calculating of the number of tasks for using the mounting head, whether or not it is possible to mount the plurality of components by incrementing the calculated minimal task number by 1, and obtaining a minimum task number, when the judging for each task judges that it is possible to mount the plurality of components, as the number of tasks required for mounting the plurality of components using "n" kinds of nozzle sets.

6. The optimizing method according to claim 5, wherein, in the further calculating of the number of tasks, the number of tasks required for mounting the plurality of components by a nozzle set is incremented, the nozzle set, for which the number of tasks is incremented being from, a plurality of nozzle sets determined immediately before the further calculating of the number of tasks, and the incrementing of the number of tasks required for mounting the plurality of components resulting in fewer "empty head" which is a state in which a mounting head is empty when performing a task for components fewer than L.

7. The optimizing method according to claim 5, wherein the further calculating of the number of tasks further comprises calculating the number of tasks required for mounting all of the plurality of components by decrementing the calculated minimum task number by 1.

8. The optimizing method according to claim 7, wherein, in the further calculating of the number of tasks, the number of tasks required for mounting the plurality of components by a nozzle set is decremented, the nozzle set, for which the number of tasks is decremented being from a plurality of nozzle sets determined immediately before the further calculating of the number of tasks, and the decrementing of the number of tasks required for mounting the plurality of components resulting in more "empty head" which is a state in which a mounting head is empty when performing a task for components fewer than L.

9. The optimizing method according to claim 4, wherein a number of usable pickup nozzles is restricted depending on the type of pickup nozzles, and wherein, in the determination of the nozzle set, when "n" kinds of nozzle sets are respectively determined, a combination of a pickup nozzle and a number of components to be mounted using the pickup nozzle is specified to be L or fewer within the restricted number of usable pickup nozzles.

10. The optimizing method according to claim 4, wherein, in the further calculating of the number of tasks, possible combinations of pickup nozzles, for each task calculated using the respective "n" kinds of nozzle sets, are extracted, whether or not it is possible to mount the plurality of components is sequentially judged for all of the extracted combinations of pickup nozzles, and a minimum task number, for which the sequentially judging judges that it is possible to mount the plurality of components, is obtained as the number of tasks required for mounting the plurality of components using "n" kinds of nozzle sets.

11. The optimizing method according to claim 10, wherein, in the further calculating of the number of tasks, the possible combinations of pickup nozzles are extracted from a restricted range of pickup nozzles specified by minimum and maximum task numbers, the minimum task number being a number of tasks required for mounting as many of the plurality of components on a board as possible using a mounting head by which L components are picked up, and the maximum task number being a largest number of the components classified based on the type of pickup nozzles.

12. The optimizing method according to claim 4, wherein the further calculating of the number tasks further comprises:

a first calculation step of: calculating a number of tasks, for a case in which the plurality of components are mounted on a board, for using a mounting head to pick up as many of the L components as possible, as a minimal task number; judging whether or not it is possible to mount the plurality of components for each task of the number of tasks calculated by the first calculation step by incrementing the calculated minimal task number by 1; and obtaining a minimum task number, when the judging of each task judges that it is possible to mount the plurality of components, as the number of tasks required for mounting the plurality of components using "n" kinds of nozzle sets;

a second calculation step of: extracting possible combinations of pickup nozzles, for each task calculated using the respective "n" kinds of nozzle sets; sequentially judging whether or not it is possible to mounts the plurality of components for all of the extracted combinations of pickup nozzles; and obtaining a minimum task number, for which the sequentially judging judges that it is possible to mount the plurality of components, as the number of tasks required for mounting the plurality of components using "n" kinds of nozzle sets; and executing either the first calculation step or the second calculation step.

13. The optimizing method according to claim 2, wherein, in the determination of the nozzle set, a nozzle set which obtains a smallest evaluated value S is determined as the nozzle set that reduces the mounting time, the smallest evaluated value S is calculated using $S=X+h\cdot N$, where N indicates the number of times of interchanging the pickup nozzles, X indicates the total number of tasks, and h indicates a coefficient for converting the time taken to interchange the pickup nozzles into a task number.

14. The optimizing method according to claim 2, further comprising determining a nozzle pattern in which a type of pickup nozzle is assigned to each of a plurality of heads constituting the mounting head for all of the tasks required for mounting the plurality of components, while maintaining the nozzle set determined in the determination of the nozzle set.

15. The optimizing method according to claim 2,
wherein the mounter includes a nozzle station at which the pickup nozzles are arranged, and
wherein the optimizing method further comprises determining a combination of a type of pickup nozzle to be arranged at the nozzle station and a place for the arrangement based on the nozzle set determined in the determination of the nozzle set.

16. The optimizing method according to claim 2, wherein, in the determination of the mounting order, the components are classified as small components or general components based on heights of the components, the order of the array of component feeders and the component mounting order for the small components are determined so that a number of components to be picked up per task by the mounting head increases, while the order of the array of component feeders and the component mounting order for the general components are determined based on a mounting order which reduces the mounting time while switching an order of mounting components.

17. The optimizing method according to claim 1, wherein the determination of the nozzle set determines the nozzle set for mounting the plurality of components with the smallest possible number of tasks without interchanging the pickup nozzles attached to the mounting head.

18. The optimizing method according to claim 17, wherein the determination of the nozzle set further comprises:
for each type of pickup nozzle, initially calculating a number of pickup nozzles of an initial nozzle set based on a number of components to be picked up, respectively, by the different types of pickup nozzles;

initially calculating a total number of tasks for mounting the plurality of components based on a number of components corresponding to the calculated number of pickup nozzles of the initial nozzle set;

calculating a total number of tasks for mounting the plurality of components when the number of pickup nozzles of the initial nozzle set is incremented or decremented by 1 for each type of pickup nozzle of the initial nozzle set; and judging whether or not the total number of tasks calculated in the calculating of the total number of tasks is smaller than the total number of tasks calculated in the initially calculating of the total number of tasks, when the former is smaller than the latter, judgment is made as to whether or not the decremented or incremented total number of tasks becomes smaller after the incremented or decremented nozzle set has been updated as a latest nozzle set, and when the former is not smaller than the latter, a previous nozzle set and the total number of tasks of the previous nozzle set are determined as the initial nozzle set and the number of tasks, respectively.

19. The optimizing method according to claim 18,
wherein the respective plurality of components belong to one of a plurality of component groups classified based on heights of the components, and
wherein the calculating of the total number of tasks further comprises:
calculating a respective number of tasks required for mounting the components of each component group; and
calculating a total group number of tasks by totaling each of the respective numbers of tasks calculated by the calculating of the respective number of tasks.

20. The optimizing method according to claim 19, wherein in the calculating of the respective number of tasks, when a component group includes a plurality of types of components to be picked up using a plurality of pickup nozzles, a maximum task number, out of task numbers corresponding, respectively, to the plurality of pickup nozzles, is obtained as a number of tasks of the component group.

21. The optimizing method according to claim 1 further comprising:
allocating the plurality of components to two or more mounters in units of component groups so that a number of tasks of each of the two or more mounters is averaged, when a task is a group of components to be mounted by one iteration of the repeated series of processes where the mounting head picks up, transports, and mounts the components; and
modifying the allocation of the allocating of the plurality of components by moving a part of the components allocated to a mounter with a larger number of tasks to a mounter with a smaller number of tasks so that all of the allocated components are mounted without interchanging the pickup nozzles attached to the mounting head and the number of tasks of each of the two or more mounters is averaged.

22. The optimizing method according to claim 21,
wherein, in the allocating of the plurality of components, a process of modifying the allocation by sequentially moving the component groups allocated to the mounter with the larger number of tasks to another mounter adjacently connected to the mounter with the larger number of tasks after having allocated all of the component groups to the two or more mounters so that the component groups of low components are allocated to a mounter positioned upstream in a production line, is repeated until a size relation between the number of tasks of the two mounters reverses, and when the size relation is reversed, the previous state in which the component groups are allocated is determined as a final state.

23. The optimizing method according to claim 21, wherein, in the modifying of the allocation, the components to be moved are determined based on a difference between the number of tasks of the respective two or more mounters for mounting the components allocated in the allocating of the plurality of components, and the determined components are moved.

24. The optimizing method according to claim 23, wherein, in the modifying of the allocation, when a component requiring a new pickup nozzle is moved from a second mounter to a first mounter, a space for the new pickup nozzle is retained by determining a pickup nozzle, with which a number of tasks becomes the smallest from a plurality of pickup nozzles assigned to the first mounter, the number of tasks being incremented by decrementing a number of pickup nozzles by 1.

25. The optimizing method according to claim 1 further comprising:
allocating pickup nozzles by determining types and numbers of pickup nozzles for respective two or more mounters according to types and numbers of components allocated to the respective two or more mounters;
calculating a number of tasks required for mounting components allocated to the mounters by modifying the number of pickup nozzles determined in the allocating of the pickup nozzles based on a restriction on a nozzle resource number that is a number of usable pickup nozzles, and calculating a number of tasks for each mounter such that all of the components allocated to each mounter can be mounted without interchanging the pickup nozzles based on the number of pickup nozzles after the modification and the corresponding number of components; and
incrementing or decrementing the number of pickup nozzles allocated to each mounter so that a difference between the number of tasks required by each mounter calculated in the calculating of the number of tasks required for mounting components is reduced.

26. The optimizing method according to claim 25, wherein, in the incrementing or decrementing of the number of pickup nozzles, a difference between a number of tasks of a first and a second mounter is reduced by incrementing the number of pickup nozzles allocated to the first mounter having a larger number of tasks by "n" and decrementing the pickup nozzles allocated to the second mounter having a smaller number of tasks by "n", when pickup nozzles of the same type are allocated to the first and second mounters.

27. An optimizing apparatus that optimizes, using a computer, a component mounting order in which a mounter, equipped with a mounting head, picks up L components, L being no less than 2, from an array of component feeders that hold components, and mounts the components on a board,
wherein the mounting head has, at maximum, L pickup nozzles attached thereto for picking up the components, and
wherein a plurality of components, of which the mounting order is to be optimized, includes a plurality of types of components to be picked up using no less than 2 pickup nozzles of different types,
the optimizing apparatus comprising:
a nozzle set determination unit operable to determine a nozzle set, from a plurality of pickup nozzles, for mounting the plurality of components using a smallest possible number of tasks, where a nozzle set is a combination of pickup nozzles in which (i) only the types of the pickup nozzles and a number of the pickup nozzles to be attached to the mounting head are previously set and (ii) a correspondence between the types of the pickup nozzles and mounting positions of the pickup nozzles is not previously set, and where a task is a group of components to be mounted by one iteration of a repeated series of processes where the mounting head picks up, transports, and mounts the components; and
a mounting order determination unit operable to determine an order of the array of component feeders and a component mounting order, while maintaining the determined nozzle set.

28. A mounter comprising a mounting head which picks up L components, L being no less than 2, from an array of component feeders that hold components, and mounts the components on a board,
wherein the components are mounted in a mounting order optimized by the optimizing method according to claim 1.

29. A computer-readable storage medium having a program stored thereon, the program for optimizing a component mounting order in which a mounter, equipped with a mounting head, picks up L components, L being no less than 2, from an array of component feeders that hold components, and mounts the components on a board, the program causing a computer to execute the optimizing method according to claim 1.

* * * * *

UNITED STATES PATENT AND TRADEMARK OFFICE
CERTIFICATE OF CORRECTION

| | | |
|---|---|---|
| PATENT NO. | : 7,395,129 B2 | Page 1 of 1 |
| APPLICATION NO. | : 10/540251 | |
| DATED | : July 1, 2008 | |
| INVENTOR(S) | : Takuya Yamazaki et al. | |

It is certified that error appears in the above-identified patent and that said Letters Patent is hereby corrected as shown below:

IN THE CLAIMS

In column 43, claim 12, line 15, please change "possible to mounts the" to --possible to mount the--.

Signed and Sealed this

Twenty-first Day of October, 2008

JON W. DUDAS
*Director of the United States Patent and Trademark Office*